(12) United States Patent
Kim et al.

(10) Patent No.: US 12,514,040 B2
(45) Date of Patent: Dec. 30, 2025

(54) DISPLAY DEVICE HAVING MULTILAYER OPTICAL LAYER

(71) Applicant: Samsung Display Co., LTD., Yongin-si (KR)

(72) Inventors: Hyung June Kim, Seongnam-si (KR); Ji Hyun Min, Hwaseong-si (KR); Sang Ho Park, Hwaseong-si (KR); Se Hyung Cho, Anyang-si (KR); Jang Bog Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 521 days.

(21) Appl. No.: 17/983,290

(22) Filed: Nov. 8, 2022

(65) Prior Publication Data

US 2023/0155083 A1   May 18, 2023

(30) Foreign Application Priority Data

Nov. 12, 2021 (KR) ................. 10-2021-0155686

(51) Int. Cl.
*H10H 20/855* (2025.01)
*H01L 25/16* (2023.01)
*H10H 20/851* (2025.01)

(52) U.S. Cl.
CPC ......... *H10H 20/855* (2025.01); *H01L 25/167* (2013.01); *H10H 20/8515* (2025.01)

(58) Field of Classification Search
CPC .. H01L 25/167; H10H 20/813; H10H 29/142; H10H 20/856; H10H 20/841; H10K 59/35; H10K 59/122

USPC .......................................................... 257/91
See application file for complete search history.

(56) References Cited

U.S. PATENT DOCUMENTS

| | | | |
|---|---|---|---|
| 8,648,365 B2 | 2/2014 | Won | |
| 11,004,892 B2 | 5/2021 | Kim et al. | |
| 11,682,693 B2 | 6/2023 | Kim et al. | |
| 12,062,739 B2 | 8/2024 | Kim et al. | |
| 2010/0207152 A1* | 8/2010 | Won ................... | H10H 20/8506 257/E33.056 |
| 2012/0037942 A1 | 2/2012 | Sanga | |
| 2014/0103383 A1 | 4/2014 | Sanga | |

(Continued)

FOREIGN PATENT DOCUMENTS

| | | |
|---|---|---|
| EP | 2219241 | 8/2010 |
| EP | 2421061 | 2/2012 |

(Continued)

*Primary Examiner* — Ratisha Mehta
*Assistant Examiner* — Mikka Liu
(74) *Attorney, Agent, or Firm* — Womble Bond Dickinson (US) LLP

(57) ABSTRACT

A display device including: a first electrode on a substrate, a second electrode spaced from the first electrode in a second direction, an optical layer on the first electrode and the second electrode, the optical layer including a first layer and a second layer, the second layer including a different material and having a different thickness from the first layer, and a plurality of light emitting elements on the optical layer, the first electrode, and the second electrode, wherein the optical layer includes a plurality of pair layers, each of the plurality of pair layers including the first layer and the second layer, and the first layer and the second layer are alternately stacked.

20 Claims, 28 Drawing Sheets

(56) References Cited

U.S. PATENT DOCUMENTS

| | | | |
|---|---|---|---|
| 2014/0183479 A1* | 7/2014 | Park | H10K 59/131 |
| | | | 438/34 |
| 2019/0244992 A1* | 8/2019 | Yokogawa | H10F 39/8023 |
| 2020/0043976 A1* | 2/2020 | Kim | H10H 20/856 |
| 2021/0265419 A1 | 8/2021 | Kim et al. | |
| 2021/0280746 A1 | 9/2021 | Kim et al. | |
| 2024/0363806 A1 | 10/2024 | Kim et al. | |

FOREIGN PATENT DOCUMENTS

| | | |
|---|---|---|
| EP | 3608958 | 2/2020 |
| EP | 3828937 | 6/2021 |
| KR | 10-2009-0060216 A | 6/2009 |
| KR | 2010-0093975 A | 8/2010 |
| KR | 10-2013-0118729 A | 10/2013 |
| KR | 10-2019-0078753 A | 7/2019 |
| KR | 2020-0011629 A | 2/2020 |
| KR | 2020-0016424 A | 2/2020 |
| KR | 10-2021-0057891 A | 5/2021 |

* cited by examiner

DISPLAY DEVICE HAVING MULTILAYER OPTICAL LAYER

CROSS-REFERENCE TO RELATED APPLICATION

This application claims priority to and the benefit of Korean Patent Application No. 10-2021-0155686 filed on Nov. 12, 2021 in the Korean Intellectual Property Office, the entire content of which is incorporated by reference herein.

BACKGROUND

1. Field

The present disclosure relates to a display device.

2. Description of the Related Art

Display devices are becoming increasingly important with the development of multimedia. Accordingly, various types of display devices such as organic light emitting displays (OLEDs) and liquid crystal displays (LCDs) are being used.

Display devices are used to display an image. There are various types of display devices including self-luminous display devices including light emitting elements. A self-luminous display device may be an organic light emitting display using an organic material as a light emitting material in a light emitting element or an inorganic light emitting display using an inorganic material as a light emitting material.

SUMMARY

Aspects of the present disclosure provide a display device with improved light output efficiency.

However, aspects of the present disclosure are not restricted to the one set forth herein. The above and other aspects of the present disclosure will become more apparent to one of ordinary skill in the art to which the present disclosure pertains by referencing the detailed description of embodiments according to the present disclosure given below.

According to one or more embodiments of the present disclosure, a display device including: a first electrode on a substrate, a second electrode spaced from the first electrode in a second direction, an optical layer on the first electrode and the second electrode, the optical layer including a first layer and a second layer, the second layer including a different material and having a different thickness from the first layer, and a plurality of light emitting elements on the optical layer, the first electrode, and the second electrode, wherein the optical layer includes a plurality of pair layers, each of the plurality of pair layers including the first layer and the second layer, and wherein the first layer and the second layer are alternately stacked.

The first layer may comprise silicon oxide, the second layer includes silicon nitride, and a thickness of the first layer may be greater than a thickness of the second layer.

The plurality of light emitting elements is configured to emit first light having a central wavelength band of 400 to 460 nm, the thickness of the first layer may be in the range of 83 to 105 nm, and the thickness of the second layer may be in the range of 70 to 88 nm.

The optical layer may include a first pair layer, a second pair layer on the first pair layer, and a third pair layer on the second pair layer, and a thickness of the optical layer may be 450 nm or more.

The first layer of the first pair layer may be directly located on the first electrode and the second electrode, and the first layer of the second pair layer and the first layer of the third pair layer may be located on the second layer of the first pair layer and the second layer of the second pair layer, respectively.

The second layer of the first pair layer may be directly located on the first electrode and the second electrode, and the second layer of the second pair layer and the second layer of the third pair layer may be located on the first layer of the first pair layer and the first layer of the second pair layer, respectively.

The optical layer may further include a fourth pair layer on the third pair layer, and the thickness of the optical layer may be 600 nm or more.

Each of the first layer and the second layer may include one of silicon oxide, silicon nitride, and titanium oxide.

The display device may further include a first bank pattern located between the substrate and the first electrode, a second bank pattern located between the substrate and the second electrode, and a bank layer located on the optical layer and surrounding an area in which the plurality of light emitting elements is disposed.

The display device may include an upper bank layer on the bank layer, and a wavelength conversion layer on the plurality of light emitting elements in an area surrounded by the upper bank layer and converting the first light emitted from the plurality of light emitting elements into second light.

The first light may have a central wavelength band of 400 to 460 nm, and the second light may have a central wavelength band of 500 to 630 nm.

The display device may include a first connection electrode on the first electrode and contacting first ends of the plurality of light emitting elements, and a second connection electrode on the second electrode and contacting second ends of the plurality of light emitting elements.

The display device may include a first insulating layer on the plurality of light emitting elements, and a second insulating layer on the first insulating layer, wherein the second connection electrode may be located between the first insulating layer and the second insulating layer, and the first connection electrode may be on the second insulating layer.

According to one or more embodiments of the present disclosure, a display device including: a first substrate including a display area and a non-display area around the display area, a plurality of subpixels in the display area and including a plurality of light emitting elements, a bank layer surrounding the subpixels in the display area, an upper bank layer on the bank layer, a plurality of wavelength conversion layers and a light transmitting layer on the plurality of light emitting elements of the subpixels and located in areas surrounded by the upper bank layer, and a plurality of color filter layers on the plurality of wavelength conversion layers and the light transmitting layer, wherein each of the plurality of subpixels further includes: a first electrode on the first substrate, a second electrode spaced from the first electrode in a second direction, an optical layer on the first electrode and the second electrode, the optical layer including a first layer and a second layer having a different refractive index from the first layer, wherein the plurality of light emitting elements is located on the optical layer, the first electrode, and the second electrode, the optical layer includes a plurality of pair layers, each of the plurality of pair layers including the first layer and the second layer, and the first layer and the second layer are alternately stacked.

The first layer and the second layer each may include one of silicon oxide, silicon nitride and titanium oxide, the first layer and the second layer including different materials, and the first layer and the second layer may have different thicknesses from each other.

The plurality of subpixels may include a first subpixel to emit a first color light and a second subpixel to emit a second color light that is different from the first color light, the plurality of light emitting elements is configured to emit a third color light that is different from the first color light and the second color light, and the optical layer of each of the first subpixel and the second subpixel may have the thickness of the first layer in a range of 83 to 105 nm and the thickness of the second layer in a range of 70 to 88 nm.

The plurality of subpixels may further include a third subpixel to emit a third color light, and the optical layer of the third subpixel may have the thickness of the first layer in a range of 83 to 105 nm and the thickness of the second layer in a range of 70 to 88 nm.

The plurality of subpixels may include a first subpixel to emit a first color light and a second subpixel to emit a second color light that is different from the first color light, and the plurality of light emitting elements may emit a third color light that is different from the first color light and the second color light, wherein the first subpixel may include a first optical layer having a thickness of the first layer in a range of 101 to 110 nm and a thickness of the second layer in a range 85 to 92 nm, and the second subpixel may include a second optical layer having the thickness of the first layer in a range of 83 to 105 nm and the thickness of the second layer in a range of 70 to 88 nm.

The plurality of subpixels may further include a third subpixel emitting a third color light, and the third subpixel may include a third optical layer having the thickness of the first layer in the range of 73 to 77 nm and the thickness of the second layer in a range of 61 to 64 nm.

Each of the plurality of subpixels may include a first insulating layer on the light emitting elements, a second insulating layer on the first insulating layer, a first connection electrode on the first electrode and contacting first ends of the plurality of light emitting elements, and a second connection electrode on the second electrode and contacting second ends of the plurality of light emitting elements.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the scope and teachings of the present disclosure. Similarly, the second element could also be termed the first element.

Hereinafter, embodiments will be described with reference to the attached drawings.

Figure 1:
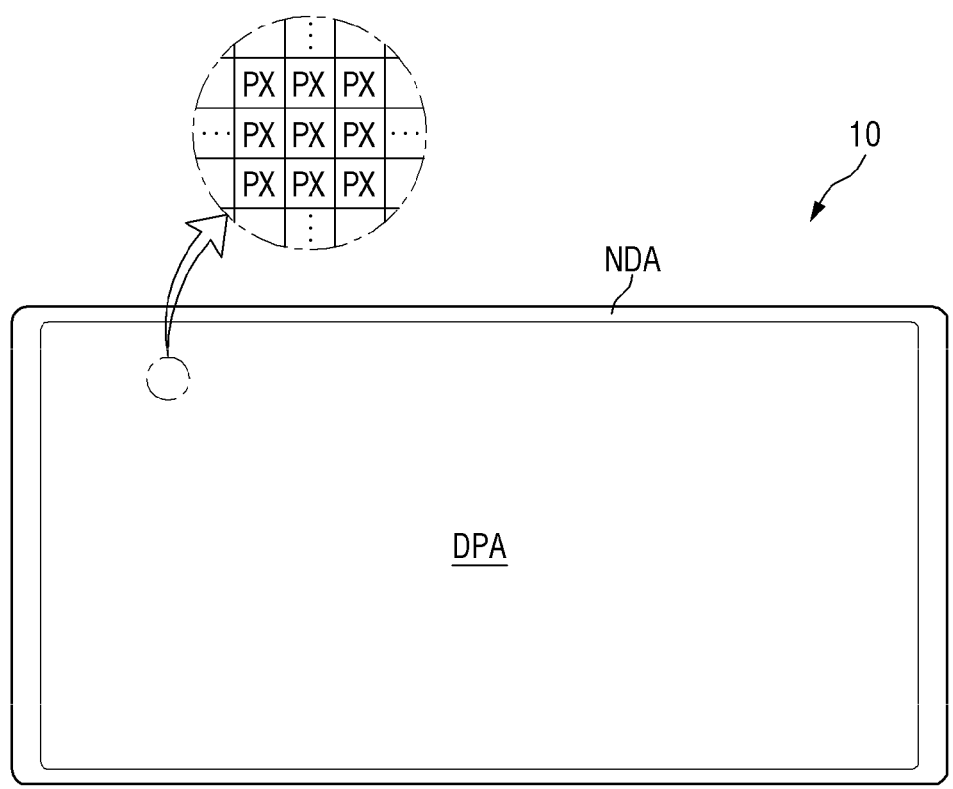
FIG. 1 is a schematic plan view of a display device according to one or more embodiments.

FIG. 1 is a schematic plan view of a display device 10 according to one or more embodiments.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the present disclosure is not limited to this case, and other display panels can also be applied as long as the same technical spirit is applicable.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. In FIG. 1, the display device 10 shaped like a rectangle that is long in a second direction DR2 is illustrated.

The display device 10 may include the display area DPA and a non-display area NDA. The display area DPA is an area where an image can be displayed, and the non-display area NDA is an area where no image is displayed. The display area DPA may also be referred to as an active area, and the non-display area NDA may also be referred to as an inactive area. The display area DPA may generally occupy the center (or central region) of the display device 10.

The display area DPA may include a plurality of pixels PX. The pixels PX may be arranged in a matrix direction. For example, the pixels may be arranged along the rows and columns of a matrix. Each of the pixels PX may be rectangular or square in a plan view. However, the present disclosure is not limited thereto, and each of the pixels PX may also have a rhombus shape having each side inclined with respect to a direction. The pixels PX may be arranged in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may display a specific color by including one or more light emitting elements that emit light of a specific wavelength band.

The non-display area NDA may be disposed around the edge or periphery of the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
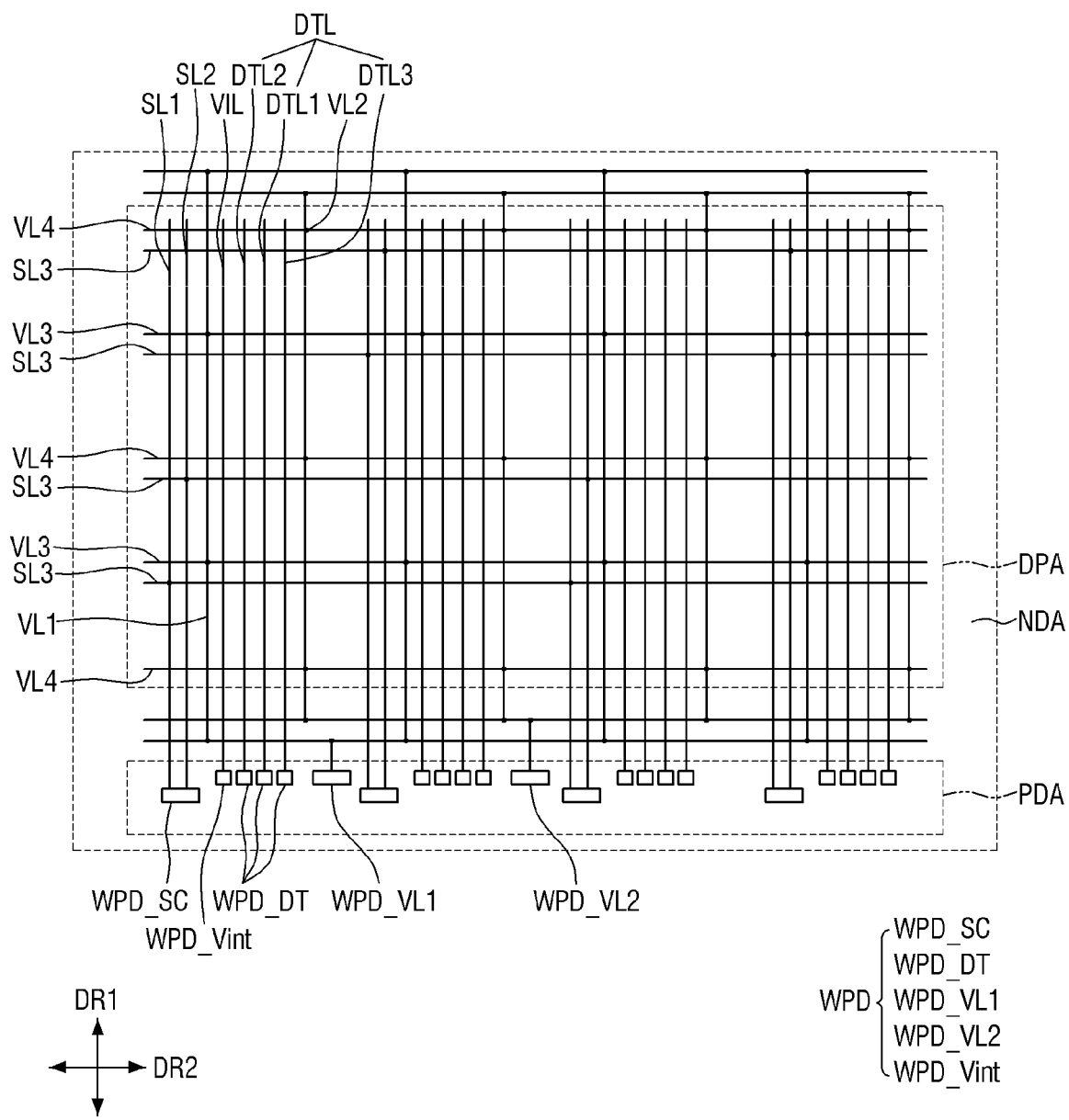
FIG. 2 is a plan view illustrating the arrangement of a plurality of wirings included in the display device according to one or more embodiments.

FIG. 2 is a plan view illustrating the arrangement of a plurality of wirings included in the display device 10 according to one or more embodiments.

Referring to FIG. 2, the display device 10 may include a plurality of wirings. The display device 10 may include a plurality of scan lines SL (SL1 through SL3), a plurality of data lines DTL (DTL1 through DTL3), initialization voltage lines VIL, and a plurality of voltage lines VL (VL1 through VL4). In one or more embodiments, other wirings may be further disposed in the display device 10.

First scan lines SL1 and second scan lines SL2 may extend in a first direction DR1. A first scan line SL1 and a second scan line SL2 in each pair may be disposed adjacent to each other and may be spaced from other first scan lines SL1 and other second scan lines SL2 in the second direction DR2. The first scan line SL1 and the second scan line SL2 in each pair may be connected to a scan wiring pad WPD_SC connected to a scan driver. The first scan lines SL1 and the second scan lines SL2 may extend from a pad area PDA disposed in the non-display area NDA to the display area DPA.

Third scan lines SL3 may extend in the second direction DR2, and each of the third scan lines SL3 may be spaced from other third scan lines SL3 in the first direction DR1. One third scan line SL3 may be connected to one or more first scan lines SL1 or one or more second scan lines SL2. In one or more embodiments, the first scan lines SL1 and the second scan lines SL2 may be formed of a conductive layer disposed on a different layer from the third scan lines SL3. The scan lines SL may have a mesh structure in the entire display area DPA, but the present disclosure is not limited thereto.

In the specification, the term "connect" may mean that any one member and another member are connected to each other not only through physical contact but also through another member. In addition, it can be understood that any one part and another part are connected to each other as one integrated member. Further, the connection between any one member and another member can be interpreted to include electrical connection through another member in addition to connection through direct contact.

The data lines DTL may extend in the first direction DR1. The data lines DTL include first data lines DTL1, second data lines DTL2, and third data lines DTL3. One each of the first through third data lines DTL1 through DTL3 form one group and are disposed adjacent to each other. Each of the data lines DTL1 through DTL3 may extend from the pad WPD_DT in the pad area PDA disposed in the non-display area NDA to the display area DPA. However, the present disclosure is not limited thereto, and the data lines DTL may be disposed at equal intervals between a first voltage line VL1 and a second voltage line VL2 in each pair which will be described later.

The initialization voltage lines VIL may extend in the first direction DR1. Each of the initialization voltage lines VIL may be disposed between the data lines DTL and the first and second scan lines SL1 and SL2. The initialization voltage lines VIL may extend from the pad WPD_Vint in the pad area PDA disposed in the non-display area NDA to the display area DPA.

First voltage lines VL1 and second voltage lines VL2 extend in the first direction DR1, and third voltage lines VL3 and fourth voltage lines VL4 extend in the second direction DR2. The first voltage lines VL1 and the second voltage lines VL2 may be alternately disposed along the second direction DR2, and the third voltage lines VL3 and the fourth voltage lines VL4 may be alternately disposed along the first direction DR1. The first voltage lines VL1 and the second voltage lines VL2 may extend in the first direction DR1 to cross the display area DPA. Among the third voltage lines VL3 and the fourth voltage lines VL4, some lines may be disposed in the display area DPA, and other lines may be disposed in the non-display area NDA located on both sides of the display area DPA in the first direction DR1. The first voltage lines VL1 and the second voltage lines VL2 may be formed of a conductive layer disposed on a different layer from the third voltage lines VL3 and the fourth voltage lines VL4. Each of the first voltage lines VL1 may be connected to at least one third voltage line VL3, and each of the second voltage lines VL2 may be connected to at least one fourth voltage line VL4. The voltage lines VL may have a mesh structure in the entire display area DPA. However, the present disclosure is not limited thereto.

The first scan lines SL1, the second scan lines SL2, the data lines DTL, the initialization voltage lines VIL, the first voltage lines VL1, and the second voltage lines VL2 may be electrically connected to at least one wiring pad WPD. Each wiring pad WPD may be disposed in the non-display area NDA. In one or more embodiments, each wiring pad WPD may be disposed in the pad area PDA located on a lower side of the display area DPA that is a second side in the first direction DR1. Each pair of the first and second scan lines SL1 and SL2 are connected to the scan wiring pad WPD_SC disposed in the pad area PDA, and the data lines DTL are connected to different data wiring pads WPD_DT, respectively. Each of the initialization voltage lines VIL is connected to an initialization wiring pad WPD_Vint, the first voltage lines VL1 are connected to a first voltage wiring pad WPD_VL1, and the second voltage lines VL2 are connected to a second voltage wiring pad WPD_VL2. An external device may be mounted on the wiring pads WPD. The external device may be mounted on the wiring pads WPD through an anisotropic conductive film, ultrasonic bonding, or the like. Although each wiring pad WPD is disposed in the pad area PDA located on the lower side of the display area DPA in the drawing, the present disclosure is not limited thereto. Some of the wiring pads WPD may also be disposed in an area located on an upper side or any one of left and right sides of the display area DPA.

Each pixel PX or subpixel SPXn (where n is an integer of 1 to 3) of the display device 10 includes a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit can be variously changed. According to one or more embodiments, each subpixel SPXn of the display device 10 may have a 3T1C structure in which the pixel driving circuit includes three transistors and one capacitor. Although the pixel driving circuit will be described below using the 3T1C structure as an example, the present disclosure is not limited thereto, and other various modified pixel structures such as a 2T1C structure, a 7T1C structure, and a 6T1C structure are also applicable.

Figure 3:
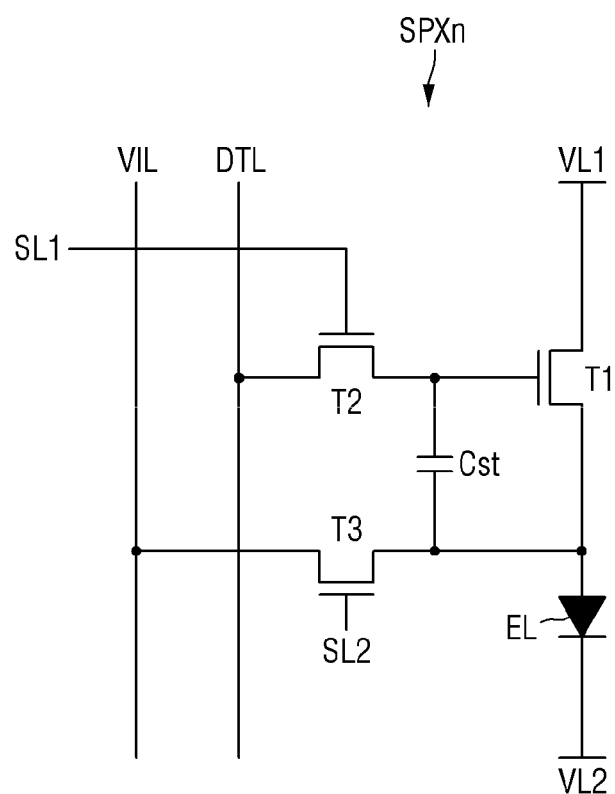
FIG. 3 is an equivalent circuit diagram of a subpixel of the display device according to one or more embodiments.

FIG. 3 is an equivalent circuit diagram of a subpixel SPXn according to one or more embodiments.

Referring to FIG. 3, each subpixel SPXn of the display device 10 according to the described embodiment includes three transistors T1 through T3 and one storage capacitor Cst in addition to a light emitting diode EL.

The light emitting diode EL emits light according to a current supplied through a first transistor T1 (e.g., a driving transistor). The light emitting diode EL includes a first electrode, a second electrode, and at least one light emitting element disposed between them. The light emitting element may emit light of a specific wavelength band in response to electrical signals received from the first electrode and the second electrode.

A first end of the light emitting diode EL may be connected to a source electrode of the first transistor T1, and a second end of the light emitting diode EL may be connected to a second voltage line VL2 to which a low potential voltage (hereinafter, referred to as a second power supply voltage) lower than a high potential voltage (hereinafter, referred to as a first power supply voltage) of a first voltage line VL1 is supplied.

The first transistor T1 adjusts a current flowing from the first voltage line VL1, to which the first power supply voltage is supplied, to the light emitting diode EL according to a voltage difference between a gate electrode and the source electrode of the first transistor T1. For example, the first transistor T1 may be a driving transistor for driving the light emitting diode EL. The first transistor T1 may have the gate electrode connected to a source electrode of a second transistor T2, the source electrode connected to the first electrode of the light emitting diode EL, and a drain electrode connected to the first voltage line VL1 to which the first power supply voltage is applied.

The second transistor T2 (e.g., a switching transistor) is turned on by a scan signal of a first scan line SL1 to connect a data line DTL to the gate electrode of the first transistor T1. The second transistor T2 may have a gate electrode connected to the first scan line SL1, the source electrode connected to the gate electrode of the first transistor T1, and a drain electrode connected to the data line DTL.

A third transistor T3 is turned on by a scan signal of a second scan line SL2 to connect an initialization voltage line VIL to the first end of the light emitting diode EL. The third transistor T3 may have a gate electrode connected to the second scan line SL2, a drain electrode connected to the initialization voltage line VIL, and a source electrode connected to the first end of the light emitting diode EL or the source electrode of the first transistor T1.

In one or more embodiments, the source electrode and the drain electrode of each of the transistors T1 through T3 are not limited to the above description, and the opposite may also be the case. In addition, each of the transistors T1 through T3 may be formed as a thin-film transistor. In addition, although each of the transistors T1 through T3 is mainly described as an N-type metal oxide semiconductor field effect transistor (MOSFET) in FIG. 3, the present disclosure is not limited thereto. That is, each of the transistors T1 through T3 may also be formed as a P-type MOSFET, or some of the transistors T1 through T3 may be formed as N-type MOSFETs, and the other may be formed as a P-type MOSFET.

The storage capacitor Cst is formed between the gate electrode and the source electrode of the first transistor T1. The storage capacitor Cst stores a difference between a gate voltage and a source voltage of the first transistor T1.

The structure of a pixel PX of the display device 10 according to the described embodiment will now be described in detail with further reference to other drawings.

Figure 4:
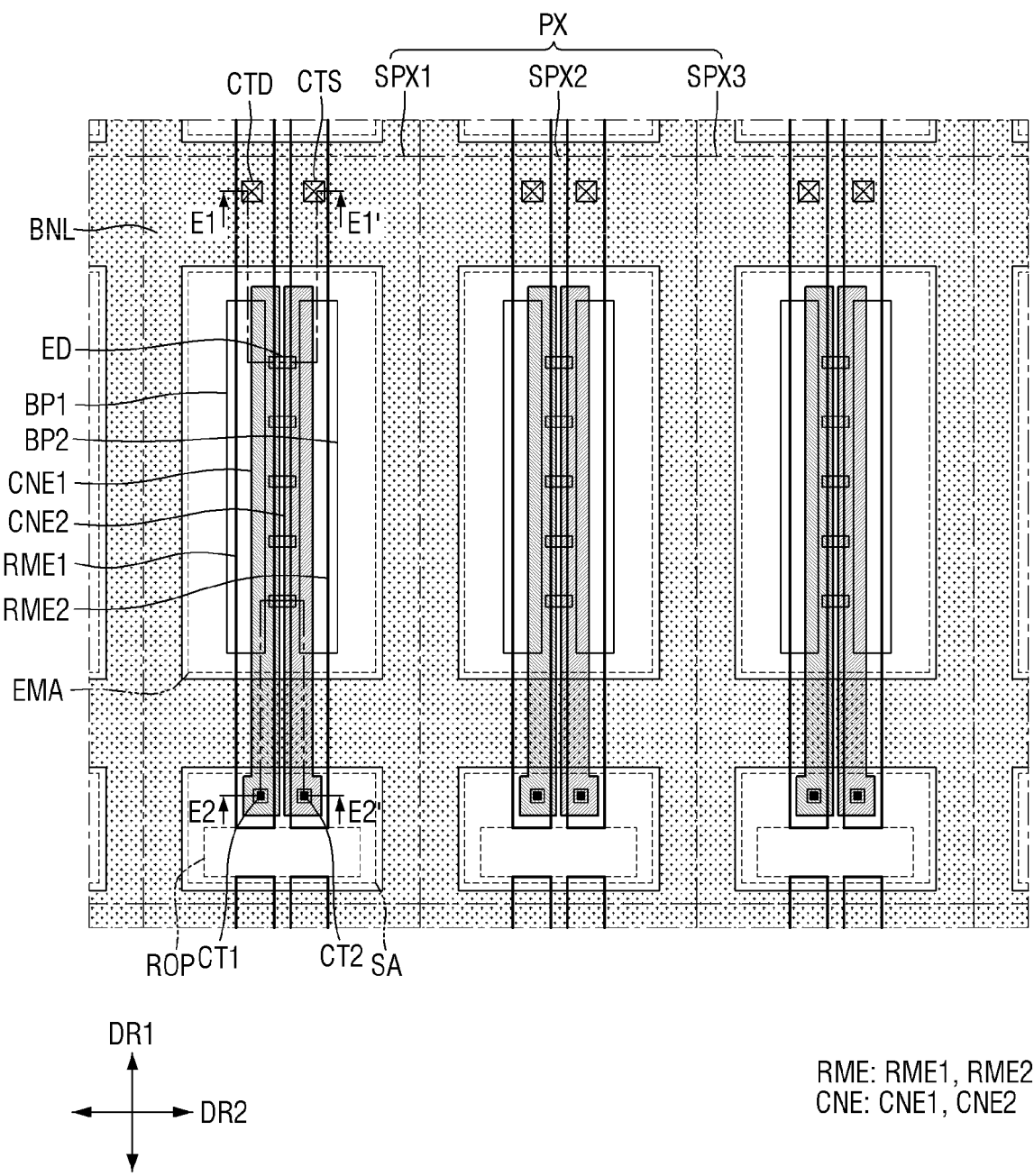
FIG. 4 is a plan view of a pixel of the display device according to one or more embodiments.

FIG. 4 is a plan view of a pixel PX of the display device 10 according to one or more embodiments. FIG. 4 illustrates the planar arrangement of electrodes RME (RME1 and RME2), bank patterns BP1 and BP2, a bank layer BNL, a plurality of light emitting elements ED, and connection electrodes CNE (CNE1 and CNE2) disposed in one pixel PX of the display device 10.

Referring to FIG. 4, each of the pixels PX of the display device 10 may include a plurality of subpixels SPXn. For example, one pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the present disclosure is not limited thereto, and the subpixels SPXn may also emit light of the same color. In one or more embodiments, the subpixels SPXn may emit blue light. Although one pixel PX includes three subpixels SPXn in the drawing, the present disclosure is not limited thereto, and the pixel PX may also include a greater number of subpixels SPXn.

Each subpixel SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area.

The emission area EMA may include an area in which the light emitting elements ED are disposed and an area which is adjacent to the light emitting elements ED and from which light emitted from the light emitting elements ED is output. For example, the emission area EMA may also include an area from which light emitted from the light emitting elements ED is output after being reflected or refracted by other members. A plurality of light emitting elements ED may be disposed in each subpixel SPXn, and an area where the light emitting elements ED are disposed and an area adjacent to this area may form the emission area EMA.

Although the respective emission areas EMA of the subpixels SPXn have substantially the same area in the drawing, the present disclosure is not limited thereto.

In one or more embodiments, the emission area EMA of each subpixel SPXn may have a different area according to the color or wavelength band of light emitted from the light emitting elements ED disposed in the subpixel SPXn.

Each subpixel SPXn may further include a sub-area SA disposed in the non-emission area. The sub-area SA of a corresponding subpixel SPXn may be disposed on a lower side of the emission area EMA which is the second side in the first direction DR1. The emission area EMA and the sub-area SA may be alternately arranged along the first direction DR1, and the sub-area SA may be disposed between the emission areas EMA of different subpixels SPXn spaced from each other in the first direction DR1. For example, the emission area EMA and the sub-area SA may be alternately arranged along the first direction DR1 and may each be repeatedly arranged along the second direction DR2. However, the present disclosure is not limited thereto, and the arrangement of the emission areas EMA and the sub-areas SA in a plurality of pixels PX may also be different from that in FIG. 4.

Light may not exit from the sub-area SA because the light emitting elements ED are not disposed in the sub-area SA, but a part of each of the electrodes RME disposed in each subpixel SPXn may be disposed in the sub-area SA. The electrodes RME disposed in different subpixels SPXn may be separated from each other in a separation part ROP of the sub-area SA.

Wirings and circuit elements of a circuit layer disposed in each pixel PX and connected to the light emitting diodes EL may be connected to each of the first through third subpixels SPX1 through SPX3. However, the wirings and the circuit elements are not disposed to correspond to an area occupied by each subpixel SPXn or each emission area EMA but may be disposed regardless of the positions of the emission areas EMA in one pixel PX.

The bank layer BNL may be around (e.g., may surround) the subpixels SPXn, the emission areas EMA, and the sub-areas SA. The bank layer BNL may be disposed at boundaries between the subpixels SPXn adjacent to each other in the first direction DR1 and the second direction DR2 and also may be disposed at boundaries between the emission areas EMA and the sub-areas SA. The subpixels SPXn, the emission areas EMA and the sub-areas SA of the display device 10 may be areas separated by the arrangement of the bank layer BNL. Distances between the subpixels SPXn, the emission areas EMA, and the sub-areas SA may vary according to a width of the bank layer BNL.

The bank layer BNL may include parts extending in the first direction DR1 and the second direction DR2 in a plan view to form a grid pattern in the entire display area DPA. The bank layer BNL may be disposed at the boundary of each subpixel SPXn to separate neighboring subpixels SPXn. In addition, the bank layer BNL may be around (e.g., may surround) the emission area EMA and the sub-area SA disposed in each subpixel SPXn to separate them from each other.

Figure 5:
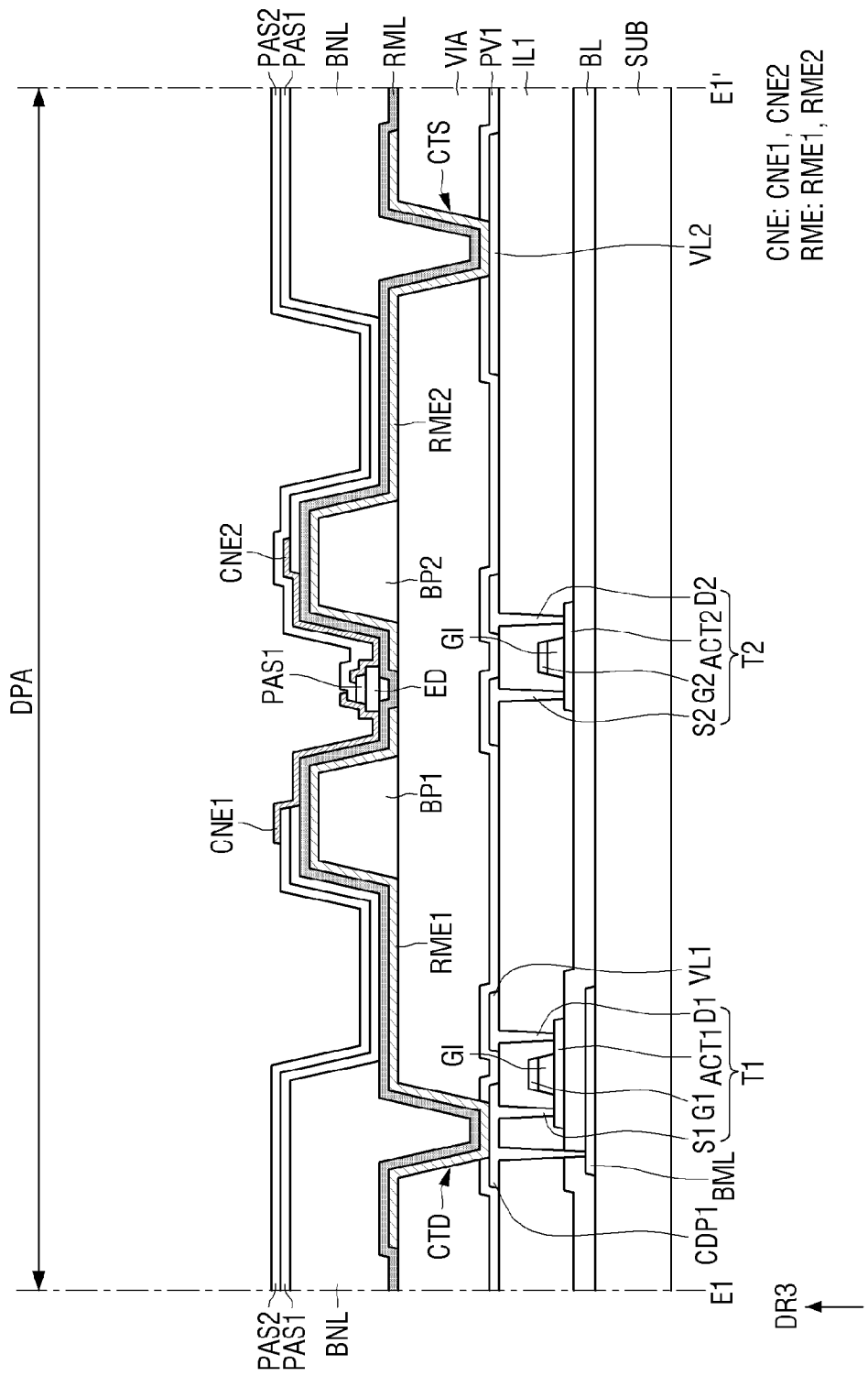
FIG. 5 is a cross-sectional view taken along the line E1-E1' of FIG. 4.
Figure 6:
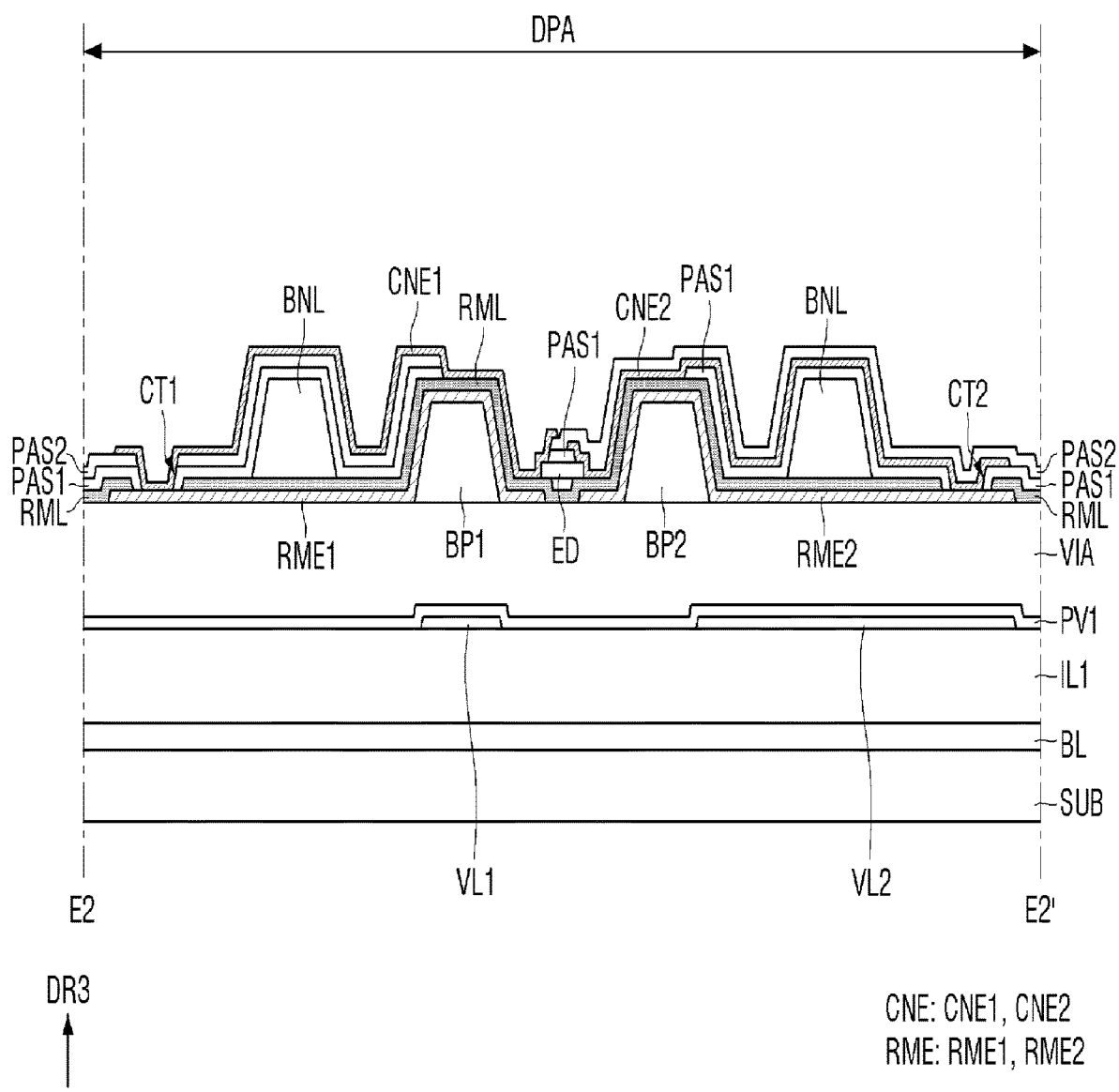
FIG. 6 is a cross-sectional view taken along the line E2-E2' of FIG. 4.

FIG. 5 is a cross-sectional view taken along the line E1-E1' of FIG. 4. FIG. 6 is a cross-sectional view taken along the line E2-E2' of FIG. 4. FIG. 5 illustrates a cross section across both ends of a light emitting element ED and electrode contact holes CTD and CTS disposed in the first subpixel SPX1. FIG. 6 illustrates a cross section across both ends of a light emitting element ED and contact parts CT1 and CT2 disposed in the first subpixel SPX1.

Referring to FIGS. 5 and 6 in conjunction with FIG. 4, the display device 10 may include a first substrate SUB and a semiconductor layer, a plurality of conductive layers and a plurality of insulating layers disposed on the first substrate SUB. In addition, the display device 10 may include the electrodes RME (RME1 and RME2), the light emitting elements ED, and the connection electrodes CNE (CNE1 and CNE2). The semiconductor layer, the conductive layers, and the insulating layers may constitute a circuit layer of the display device 10.

The first substrate SUB may be an insulating substrate. The first substrate SUB may be made of an insulating material such as glass, quartz, or polymer resin. In addition, the first substrate SUB may be a rigid substrate, but may also be a flexible substrate that can be bent, folded, rolled, etc. The first substrate SUB may include the display area DPA and the non-display area NDA around (e.g., surrounding) the display area DPA, and the display area DPA may include the emission area EMA and the sub-area SA that is a part of the non-emission area.

A first conductive layer may be disposed on the first substrate SUB. The first conductive layer includes a bottom metal layer BML, and the bottom metal layer BML is overlapped by an active layer ACT1 of a first transistor T1 in a thickness direction of the first substrate SUB (e.g., a third direction DR3). The bottom metal layer BML may prevent light from entering the first active layer ACT1 of the first transistor T1 or may be electrically connected to the first active layer ACT1 to stabilize electrical characteristics of the first transistor T1. However, the bottom metal layer BML may also be omitted.

A buffer layer BL may be disposed on the bottom metal layer BML and the first substrate SUB. The buffer layer BL may be formed on the first substrate SUB to protect transistors of the pixel PX from moisture introduced through the first substrate SUB that is vulnerable to moisture penetration and may perform a surface planarization function.

The semiconductor layer is disposed on the buffer layer BL. The semiconductor layer may include the first active layer ACT1 of the first transistor T1 and a second active layer ACT2 of a second transistor T2. The first active layer ACT1 and the second active layer ACT2 may respectively be partially overlapped in the third direction DR3 by a first gate electrode G1 and a second gate electrode G2 of a second conductive layer which will be described later.

The semiconductor layer may include polycrystalline silicon, monocrystalline silicon, an oxide semiconductor, or the like. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in each subpixel SPXn of the display device 10 in the drawings, the present disclosure is not limited thereto, and the display device 10 may include a greater number of transistors.

A first gate insulating layer G1 is disposed on the semiconductor layer in the display area DPA. The first gate insulating layer G1 may not be disposed in the pad area PDA. The first gate insulating layer G1 may serve as a gate insulating film of each of the transistors T1 and T2. In the drawings, the first gate insulating layer G1 is patterned together with the gate electrodes G1 and G2 of the second conductive layer to be described later and is thus partially disposed between the second conductive layer and the active layers ACT1 and ACT2 of the semiconductor layer. However, the present disclosure is not limited thereto. In one or more embodiments, the first gate insulating layer G1 may be entirely disposed on the buffer layer BL.

The second conductive layer is disposed on the first gate insulating layer G1. The second conductive layer may include the first gate electrode G1 of the first transistor T1 and the second gate electrode G2 of the second transistor T2. The first gate electrode G1 may overlap a channel region of the first active layer ACT1 in the third direction DR3 which is a thickness direction, and the second gate electrode G2 may overlap a channel region of the second active layer ACT2 in the third direction DR3 which is the thickness direction. In one or more embodiments, the second conductive layer may further include one electrode of a storage capacitor.

A first interlayer insulating layer IL1 is disposed on the second conductive layer. The first interlayer insulating layer IL1 may function as an insulating film between the second conductive layer and other layers disposed on the second conductive layer and may protect the second conductive layer.

A third conductive layer is disposed on the first interlayer insulating layer IL1. The third conductive layer may include a first voltage line VL1 and a second voltage line VL2 disposed in the display area DPA, a first conductive pattern CDP1, and a source electrode S1 or S2 and a drain electrode D1 or D2 of each of the transistors T1 and T2. In one or more embodiments, the third conductive layer may further include the other electrode of the storage capacitor.

A high potential voltage (or a first power supply voltage) supplied to a first electrode RME1 may be applied to the first voltage line VL1, and a low potential voltage (or a second power supply voltage) supplied to a second electrode RME2 may be applied to the second voltage line VL2. A part of the first voltage line VL1 may contact the first active layer ACT1 of the first transistor T1 through a contact hole penetrating the first interlayer insulating layer IL1. The first voltage line VL1 may serve as a first drain electrode D1 of the first transistor T1. The second voltage line VL2 may be directly connected to the second electrode RME2 to be described later.

The first conductive pattern CDP1 may contact the first active layer ACT1 of the first transistor T1 through a contact hole penetrating the first interlayer insulating layer IL1. The first conductive pattern CDP may contact the bottom metal layer BML through another contact hole penetrating the first interlayer insulating layer IL1 and the buffer layer BL. The first conductive pattern CDP1 may serve as a first source electrode S1 of the first transistor T1. In addition, the first conductive pattern CDP1 may be electrically connected to the first electrode RME1 or a first connection electrode CNE1 to be described later. The first transistor T1 may transmit the first power supply voltage received from the first voltage line VL1 to the first electrode RME1 or the first connection electrode CNE1.

Each of a second source electrode S2 and a second drain electrode D2 may contact the second active layer ACT2 of the second transistor T2 through a contact hole penetrating the first interlayer insulating layer IL1. The second transistor T2 may be any one of the switching transistors described above with reference to FIG. 3. The second transistor T2 may transmit a signal received from the data line DTL of FIG. 3 to the first transistor T1 or transmit a signal received from the initialization voltage line VIL of FIG. 3 to the other electrode of the storage capacitor.

A first passivation layer PV1 is disposed on the third conductive layer. The first passivation layer PV1 may function as an insulating film between the third conductive layer and other layers and may protect the third conductive layer.

Each of the buffer layer BL, the first gate insulating layer G1, the first interlayer insulating layer IL1, and the first passivation layer PV1 described above may be composed of a plurality of inorganic layers stacked alternately. For example, each of the buffer layer BL, the first gate insulating layer G1, the first interlayer insulating layer IL1, and the first passivation layer PV1 may be a double layer in which inorganic layers including at least any one of silicon oxide ($SiO_x$), silicon nitride ($SiN_x$) and silicon oxynitride ($SiO_xN_y$) are stacked or may be a multilayer in which the above layers are alternately stacked. However, the present disclosure is not limited thereto, and each of the buffer layer BL, the first gate insulating layer G1, the first interlayer insulating layer IL1, and the first passivation layer PV1 may also be composed of one inorganic layer including any one of the above insulating materials. In addition, in one or more embodiments, the first interlayer insulating layer IL1 may be made of an organic insulating material such as polyimide (PI).

A via layer VIA is disposed on the third conductive layer in the display area DPA. The via layer VIA may include an organic insulating material such as polyimide (PI) to compensate for a step difference due to the conductive layers thereunder and may form a flat upper surface. However, in one or more embodiments, the via layer VIA may be omitted.

The display device 10 may include, as a display element layer disposed on the via layer VIA, the bank patterns BP1 and BP2, the electrodes RME (RME1 and RME2), the bank layer BNL, the light emitting elements ED, and the connection electrodes CNE (CNE1 and CNE2) disposed on the via layer VIA. In addition, the display device 10 may include an optical layer RML disposed on the via layer VIA and insulating layers PAS1 and PAS2.

The bank patterns BP1 and BP2 may be disposed in the emission area EMA of each subpixel SPXn. Each of the bank patterns BP1 and BP2 may have a suitable width (e.g., a set or predetermined width) in the second direction DR2 and may extend in the first direction DR1.

For example, the bank patterns may include a first bank pattern BP1 and a second bank pattern BP2 spaced from each other in the second direction DR2 in the emission area EMA of each subpixel SPXn. The first bank pattern BP1 may be disposed on a left side of the center of the emission area EMA which is a first side in the second direction DR2, and the second bank pattern BP2 may be spaced from the first bank pattern BP1 and disposed on a right side of the center of the emission area EMA which is a second side in the second direction DR2. The first bank pattern BP1 and the second bank pattern BP2 may be alternately disposed along the second direction DR2 and may be disposed as island-shaped patterns in the display area DPA. The light emitting elements ED may be disposed between the first bank pattern BP1 and the second bank pattern BP2.

Lengths of the first bank pattern BP1 and the second bank pattern BP2 in the first direction DR1 may be the same but may be smaller than a length, in the first direction DR1, of the emission area EMA surrounded by the bank layer BNL. The first bank pattern BP1 and the second bank pattern BP2 may be spaced from parts of the bank layer BNL that extend in the second direction DR2. However, the present disclosure is not limited thereto, and the bank patterns BP1 and BP2 may also be integrated with the bank layer BNL or may partially overlap the parts of the bank layer BNL that extend in the second direction DR2. In this case, the length of each of the bank patterns BP1 and BP2 in the first direction DR1 may be equal to or greater than the length, in the first direction DR1, of the emission area EMA surrounded by the bank layer BNL.

The first bank pattern BP1 and the second bank pattern BP2 may have the same width in the second direction DR2. However, the present disclosure is not limited thereto, and the first bank pattern BP1 and the second bank pattern BP2 may also have different widths. For example, any one bank pattern may have a greater width than the other bank pattern, and the bank pattern having a greater width may be disposed over the emission areas EMA of different subpixels SPXn adjacent to each other in the second direction DR2. In this case, the bank pattern disposed over a plurality of emission areas EMA may overlap a part of the bank layer BNL, which extends in the first direction DR1, in the thickness direction (e.g., the third direction DR3). Although two bank patterns BP1 and BP2 having the same width are disposed in each subpixel SPXn in the drawings, the present disclosure is not limited thereto. The number and shape of the bank patterns BP1 and BP2 may vary according to the number or arrangement structure of the electrodes RME.

The bank patterns BP1 and BP2 may be disposed on the via layer VIA. For example, the bank patterns BP1 and BP2 may be directly disposed on the via layer VIA, and at least a part of each of the bank patterns BP1 and BP2 may protrude from the upper surface of the via layer VIA. The protruding part of each of the bank patterns BP1 and BP2 may have inclined or curved side surfaces, and light emitted from the light emitting elements ED may be reflected upward above the via layer VIA by the electrodes RME disposed on the bank patterns BP1 and BP2. Unlike in the drawings, each of the bank patterns BP1 and BP2 may also have a semicircular or semielliptical shape with a curved outer surface in cross section. The bank patterns BP1 and BP2 may include, but are not limited to, an organic insulating material such as polyimide (PI).

The electrodes RME (RME1 and RME2) extend in one direction and are disposed in each subpixel SPXn. The electrodes RME1 and RME2 may extend in the first direction DR1 to lie in the emission area EMA and the sub-area SA of each subpixel SPXn and may be spaced from each other in the second direction DR2. The electrodes RME may be electrically connected to the light emitting elements ED to be described later, but the present disclosure is not limited thereto. The electrodes RME may also not be electrically connected to the light emitting elements ED.

The display device 10 may include the first electrode RME1 and the second electrode RME2 disposed in each subpixel SPXn. The first electrode RME1 is disposed on the left side of the center of the emission area EMA, and the second electrode RME2 is spaced from the first electrode RME1 in the second direction DR2 and disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may extend beyond the bank layer BNL to lie in a corresponding subpixel SPXn and a part of the sub-area SA. The first electrodes RME1 and the second electrodes RME2 of different subpixels SPXn may be spaced from each other by the separation part ROP located in the sub-area SA of any one subpixel SPXn.

Although two electrodes RME extend in the first direction DR1 in each subpixel SPXn in the drawings, the present disclosure is not limited thereto. For example, in the display device 10, a greater number of the electrodes RME may be disposed in one subpixel SPXn, or the electrodes RME may be partially bent and may have a different width according to position.

The first electrode RME1 and the second electrode RME2 may be disposed on at least the inclined side surfaces of the bank patterns BP1 and BP2. In one or more embodiments, widths of the electrodes RME measured in the second direction DR2 may be smaller than the widths of the bank patterns BP1 and BP2 measured in the second direction DR2, and a distance between the first electrode RME1 and the second electrode RME2 in the second direction DR2 may be smaller than a distance between the bank patterns BP1 and BP2. At least a part of each of the first electrode RME1 and the second electrode RME2 may be directly disposed on the via layer VIA so that they lie in the same plane.

The light emitting elements ED disposed between the bank patterns BP1 and BP2 may emit light toward both ends thereof, and the emitted light may travel toward the electrodes RME disposed on the bank patterns BP1 and BP2. Each electrode RME may have a structure in which a part disposed on a bank pattern BP1 or BP2 can reflect light emitted from the light emitting elements ED. Each of the first electrode RME1 and the second electrode RME2 may cover at least one side surface of the bank pattern BP1 or BP2 to reflect light emitted from the light emitting elements ED.

Each of the electrodes RME may directly contact the third conductive layer through an electrode contact hole CTD or CTS in a part overlapping the bank layer BNL between the emission area EMA and the sub-area SA. A first electrode contact hole CTD may be formed in an area in which the bank layer BNL and the first electrode RME1 overlap, and a second electrode contact hole CTS may be formed in an area in which the bank layer BNL and the second electrode RME2 overlap. The first electrode RME1 may contact the first conductive pattern CDP1 through the first electrode contact hole CTD penetrating the via layer VIA and the first passivation layer PV1. The second electrode RME2 may contact the second voltage line VL2 through the second electrode contact hole CTS penetrating the via layer VIA and the first passivation layer PV1. The first electrode RME1 may be electrically connected to the first transistor T1 through the first conductive pattern CDP1 to receive the first power supply voltage, and the second electrode RME2 may be electrically connected to the second voltage line VL2 to receive the second power supply voltage. However, the present disclosure is not limited thereto. In one or more embodiments, the electrodes RME1 and RME2 may not be electrically connected to the voltage lines VL1 and VL2 of the third conductive layer, and the connection electrodes CNE to be described later may be directly connected to the third conductive layer.

The electrodes RME may include a conductive material having high reflectivity. For example, each of the electrodes RME may include a metal such as silver (Ag), copper (Cu) or aluminum (Al), may be an alloy including aluminum (Al), nickel (Ni) or lanthanum (La), or may have a structure in which a metal layer such as titanium (Ti), molybdenum (Mo) or niobium (Nb) and the above alloy are stacked. In one or more embodiments, each of the electrodes RME may be a double layer or a multilayer in which an alloy including aluminum (Al) and at least one metal layer made of titanium (Ti), molybdenum (Mo) or niobium (Nb) are stacked.

However, the present disclosure is not limited thereto, and each electrode RME may further include a transparent conductive material. For example, each electrode RME may include a material such as ITO, IZO or ITZO. In one or more embodiments, each electrode RME may have a structure in which a transparent conductive material and a metal layer having high reflectivity are each stacked in one or more layers or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect some of the light emitted from the light emitting elements ED in an upward direction above the first substrate SUB.

The optical layer RML may be disposed in the entire display area DPA and may be disposed on the via layer VIA and the electrodes RME. The optical layer RML may include an insulating material to protect the electrodes RME while insulating them from each other. Because the optical layer RML covers the electrodes RME before the bank layer BNL is formed, it may prevent the electrodes RME from being damaged in the process of forming the bank layer BNL. The optical layer RML may also prevent the light emitting elements ED disposed thereon from directly contacting other members and thus being damaged.

In one or more embodiments, the optical layer RML may be stepped such that a part of an upper surface of the optical layer RML is depressed between the electrodes RME that are spaced from each other in the second direction DR2. The light emitting elements ED may be disposed on the stepped upper surface of the optical layer RML, and a space may be formed between each of the light emitting elements ED and the optical layer RML.

According to one or more embodiments, the optical layer RML may include a plurality of pair layers (P1 through P3 of FIG. 9) including layers (L1 and L2 of FIG. 10) including different materials. The optical layer RML including the pair layers may have a structure in which layers made of different materials are alternately stacked. The layers made of different materials may have different refractive indices and may reflect incident light. The optical layer RML may be disposed under the light emitting elements ED to reflect light, which travels downward among the light emitted from the light emitting elements ED, in the upward direction, and the upward light output efficiency of the display device 10 may be improved. The optical layer RML will be described in detail later with reference to other drawings.

The bank layer BNL may be disposed on the optical layer RML. The bank layer BNL may include parts extending in the first direction DR1 and the second direction DR2 and may be around (e.g., may surround) each subpixel SPXn. The bank layer BNL may be around (e.g., may surround) the emission area EMA and the sub-area SA of each subpixel SPXn to separate them and may be around (e.g., may surround) the outermost periphery of the display area DPA to separate the display area DPA and the non-display area NDA. The bank layer BNL may be entirely disposed in the display area DPA to form a grid pattern, and areas exposed by the bank layer BNL in the display area DPA may be the emission area EMA and the sub-area SA.

Like the bank patterns BP1 and BP2, the bank layer BNL may have a suitable height (e.g., a set or predetermined height). In one or more embodiments, an upper surface of the bank layer BNL may be at a greater height than those of the bank patterns BP1 and BP2, and a thickness of the bank layer BNL may be equal to or greater than those of the bank patterns BP1 and BP2. The bank layer BNL may prevent ink from overflowing to adjacent subpixels SPXn in an inkjet printing process during a manufacturing process of the display device 10. Like the bank patterns BP1 and BP2, the bank layer BNL may include an organic insulating material such as polyimide (PI).

The light emitting elements ED may be disposed in the emission area EMA. The light emitting elements ED may be disposed between the bank patterns BP1 and BP2 and may be spaced from each other in the first direction DR1. In one or more embodiments, the light emitting elements ED may extend in a direction, and both ends thereof may be disposed on different electrodes RME, respectively. A length of each light emitting element ED may be greater than the distance between the electrodes RME that are spaced in the second direction DR2. The direction in which the light emitting elements ED extend may be substantially perpendicular to the first direction DR1 in which the electrodes RME extend. However, the present disclosure is not limited thereto, and the direction in which the light emitting elements ED extend may also be the second direction DR2 or a direction oblique to the second direction DR2.

The light emitting elements ED may be disposed on the optical layer RML. The light emitting elements ED may extend in a direction, and the direction in which the light emitting elements ED extend may be parallel to an upper surface of the first substrate SUB. As will be described later, each light emitting element ED may include a plurality of semiconductor layers disposed along the extending direction, and the semiconductor layers may be sequentially disposed along a direction parallel to the upper surface of the first substrate SUB. However, the present disclosure is not limited thereto. When the light emitting elements ED have a different structure, the semiconductor layers may be disposed in a direction perpendicular to the first substrate SUB.

The light emitting elements ED disposed in the subpixels SPXn may emit light of different wavelength bands depending on the materials that form the semiconductor layers described above. However, the present disclosure is not limited thereto, and the light emitting elements ED disposed in the subpixels SPXn may also emit light of the same color by including the semiconductor layers made of the same material.

The light emitting elements ED may be electrically connected to the electrodes RME and the conductive layers under the via layer VIA by contacting the connection electrodes CNE (CNE1 and CNE2) and may emit light of a specific wavelength band in response to an electrical signal.

A first insulating layer PAS1 may be disposed on the light emitting elements ED, the optical layer RML, and the bank layer BNL. The first insulating layer PAS1 may include a pattern part extending in the first direction DR1 between the bank patterns BP1 and BP2 and disposed on the light emitting elements ED. The pattern part may partially cover outer surfaces (e.g., outer peripheral or circumferential surfaces) of the light emitting elements ED and may not cover both sides or both ends of the light emitting elements ED. The pattern part may form a linear or island-shaped pattern in each subpixel SPXn in a plan view. The pattern part of the first insulating layer PAS1 may protect the light emitting elements ED while fixing the light emitting elements ED in the manufacturing process of the display device 10. In addition, the first insulating layer PAS1 may fill a space between the light emitting elements ED and the optical layer RML under the light emitting element ED. In addition, a part of the first insulating layer PAS1 may be disposed on the bank layer BNL and in the sub-areas SA.

The connection electrodes CNE (CNE1 and CNE2) may be disposed on the electrodes RME and the bank patterns BP1 and BP2. The connection electrodes CNE may extend in a direction (e.g., the first direction DR1) and may be spaced from each other in the second direction DR2. Each of the connection electrodes CNE may contact the light emitting elements ED and may be electrically connected to the third conductive layer.

The connection electrodes CNE may include the first connection electrode CNE1 and a second connection electrode CNE2 disposed in each subpixel SPXn. The first connection electrode CNE1 may extend in the first direction DR1 and may be disposed on the first electrode RME1 or the first bank pattern BP1. The first connection electrode CNE1 may partially overlap the first electrode RME1 and may extend from the emission area EMA to the sub-area SA beyond the bank layer BNL. The second connection electrode CNE2 may extend in the first direction DR1 and may be disposed on the second electrode RME2 or the second bank pattern BP2. The second connection electrode CNE2 may partially overlap the second electrode RME2 and may extend from the emission area EMA to the sub-area SA beyond the bank layer BNL. The first connection electrode CNE1 and the second connection electrode CNE2 may contact the light emitting elements ED and may be electrically connected to the electrodes RME or a conductive layer under the electrodes RME.

For example, each of the first connection electrode CNE1 and the second connection electrode CNE2 may be disposed on side surfaces of the first insulating layer PAS1 and may contact the light emitting elements ED. The first connection electrode CNE1 may partially overlap the first electrode RME1 and may contact ends of the light emitting elements ED. The second connection electrode CNE2 may partially overlap the second electrode RME2 and may contact the other ends of the light emitting elements ED. The connection electrodes CNE are disposed over the emission area EMA and the sub-area SA. Each of the connection electrodes CNE may contact the light emitting elements ED in a part disposed in the emission area EMA and may be electrically connected to the third conductive layer in a part disposed in the sub-area SA.

According to one or more embodiments, in the display device 10, each of the connection electrodes CNE may contact an electrode RME through a contact part CT1 or CT2 disposed in the sub-area SA. The first connection electrode CNE1 may contact the first electrode RME1 through a first contact part CT1 penetrating the optical layer RML, the first insulating layer PAS1 and a second insulating layer PAS2 in the sub-area SA. The second connection electrode CNE2 may contact the second electrode RME2 through a second contact part CT2 penetrating the optical layer RML and the first insulating layer PAS1 in the sub-area SA. The connection electrodes CNE may be electrically connected to the third conductive layer through the electrodes RME, respectively. The first connection electrode CNE1 may be electrically connected to the first transistor T1 to receive the first power supply voltage, and the second connection electrode CNE2 may be electrically connected to the second voltage line VL2 to receive the second power supply voltage. Each of the connection electrodes CNE may contact the light emitting elements ED in the emission area EMA to transmit a power supply voltage to the light emitting elements ED.

However, the present disclosure is not limited thereto. In one or more embodiments, the connection electrodes CNE may directly contact the third conductive layer or may be electrically connected to the third conductive layer through patterns other than the electrodes RME.

The connection electrodes CNE may include a conductive material such as ITO, IZO, ITZO, or aluminum (Al). For example, the connection electrodes CNE may include a transparent conductive material, and light emitted from the light emitting elements ED may be output through the connection electrodes CNE.

The second insulating layer PAS2 is disposed on the second connection electrode CNE2 and the first insulating layer PAS1. The second insulating layer PAS2 may be entirely disposed on the first insulating layer PAS1 to cover the second connection electrode CNE2, and the first connection electrode CNE1 may be disposed on the second insulating layer PAS2. The second insulating layer PAS2 may be entirely disposed on the via layer VIA except for an area in which the first connection electrode CNE1 is disposed. The second insulating layer PAS2 may insulate the first connection electrode CNE1 and the second connection electrode CNE2 from each other so that they do not directly contact each other.

In one or more embodiments, another insulating layer may be further disposed on the second insulating layer PAS2 and the first connection electrode CNE1. The insulating layer may protect members disposed on the first substrate SUB from an external environment.

Each of the first insulating layer PAS1 and the second insulating layer PAS2 described above may include an inorganic insulating material or an organic insulating material. For example, each of the first insulating layer PAS1 and the second insulating layer PAS2 may include an inorganic insulating material, or the second insulating layer PAS2 may include an inorganic insulating material, but the first insulating layer PAS1 may include an organic insulating material. Each or at least any one of the first insulating layer PAS1 and the second insulating layer PAS2 may be formed in a structure in which a plurality of insulating layers are alternately or repeatedly stacked. In one or more embodiments, each of the first insulating layer PAS1 and the second insulating layer PAS2 may be any one of silicon oxide ($SiO_x$), silicon nitride ($SiN_x$), and silicon oxynitride ($SiO_xN_y$). The first insulating layer PAS1 and the second insulating layer PAS2 may be made of the same material, or some may be made of the same material while the others are made of different materials, or all of them may be made of different materials.

Figure 7:
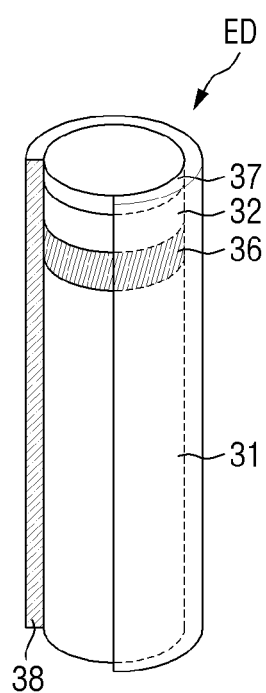
FIG. 7 is a schematic cutaway view of a light emitting element according to one or more embodiments.

FIG. 7 is a schematic cutaway view of a light emitting element ED according to one or more embodiments.

Referring to FIG. 7, the light emitting element ED may be a light emitting diode. For example, the light emitting element ED may be an inorganic light emitting diode having a size of nanometers to micrometers and made of an inorganic material. When an electric field is formed in a specific direction between two electrodes facing (or opposite) each other, the light emitting element ED may be aligned between the two electrodes in which polarities are formed.

The light emitting element ED according to the described embodiment may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped and a hexagonal prism, and a shape extending in a direction and having a partially inclined outer surface.

The light emitting element ED may include a semiconductor layer doped with impurities of any conductivity type (e.g., a p type or an n type). The semiconductor layer may receive an electrical signal from an external power source and emit light in a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN, and InN doped with a p-type dopant. The p-type dopant used to dope the second semiconductor layer 32 may be Mg, Zn, Ca, Ba, or the like.

Although each of the first semiconductor layer 31 and the second semiconductor layer 32 is composed of one layer in the drawing, the present disclosure is not limited thereto. Each of the first semiconductor layer 31 and the second semiconductor layer 32 may also include a greater number of layers, for example, may further include a clad layer or a tensile strain barrier reducing (TSBR) layer depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN, and SLs doped with an n-type dopant. The semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN, AlGaInN, or InGaN. For example, when the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different Group III to V semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be disposed at one end of the light emitting element ED. For example, the electrode layer 37 may be disposed on the second semiconductor layer 32 at one end of the light emitting element ED. However, in one or more embodiments, the electrode layer 37 may be disposed on the first semiconductor layer 31 at the other end of the light emitting element ED. The electrode layer 37 may be an ohmic connection electrode. However, the present disclosure is not limited thereto, and the electrode layer 37 may also be a Schottky connection electrode. The light emitting element ED may include at least one electrode layer 37. The light emitting element ED may include one or more electrode layers 37. However, the present disclosure is not limited thereto, and the electrode layer 37 may also be omitted.

When the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 may be around (e.g., may surround) outer surfaces (e.g., outer peripheral or circumferential surfaces) of the semiconductor layers and the electrode layer described above. For example, the insulating film 38 may be around (e.g., may surround) an outer surface (e.g., an outer peripheral or circumferential surface) of at least the light emitting layer 36 but may expose both ends of the light emitting element ED in a longitudinal direction. In addition, an upper surface of the insulating film 38 may be rounded in cross section in an area adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although the insulating film 38 is illustrated as a single layer in the drawing, the present disclosure is not limited thereto. In one or more embodiments, the insulating film 38 may be formed in a multilayer structure in which a plurality of layers are stacked.

The insulating film 38 may protect the semiconductor layers and the electrode layer of the light emitting element ED. The insulating film 38 may prevent an electrical short circuit that may occur in the light emitting layer 36 when the light emitting layer 36 directly contacts an electrode through which an electrical signal is transmitted to the light emitting element ED. In addition, the insulating film 38 may prevent a reduction in luminous efficiency of the light emitting element ED.

In addition, an outer surface (e.g., an outer peripheral or circumferential surface) of the insulating film 38 may be treated. The light emitting element ED may be sprayed onto electrodes in a state where it is dispersed in ink (e.g., a predetermined ink) and then may be aligned. Here, the surface of the insulating film 38 may be hydrophobic or hydrophilic-treated so that the light emitting element ED remains separate from other adjacent light emitting elements ED in the ink without agglomerating with them.

Figure 8:
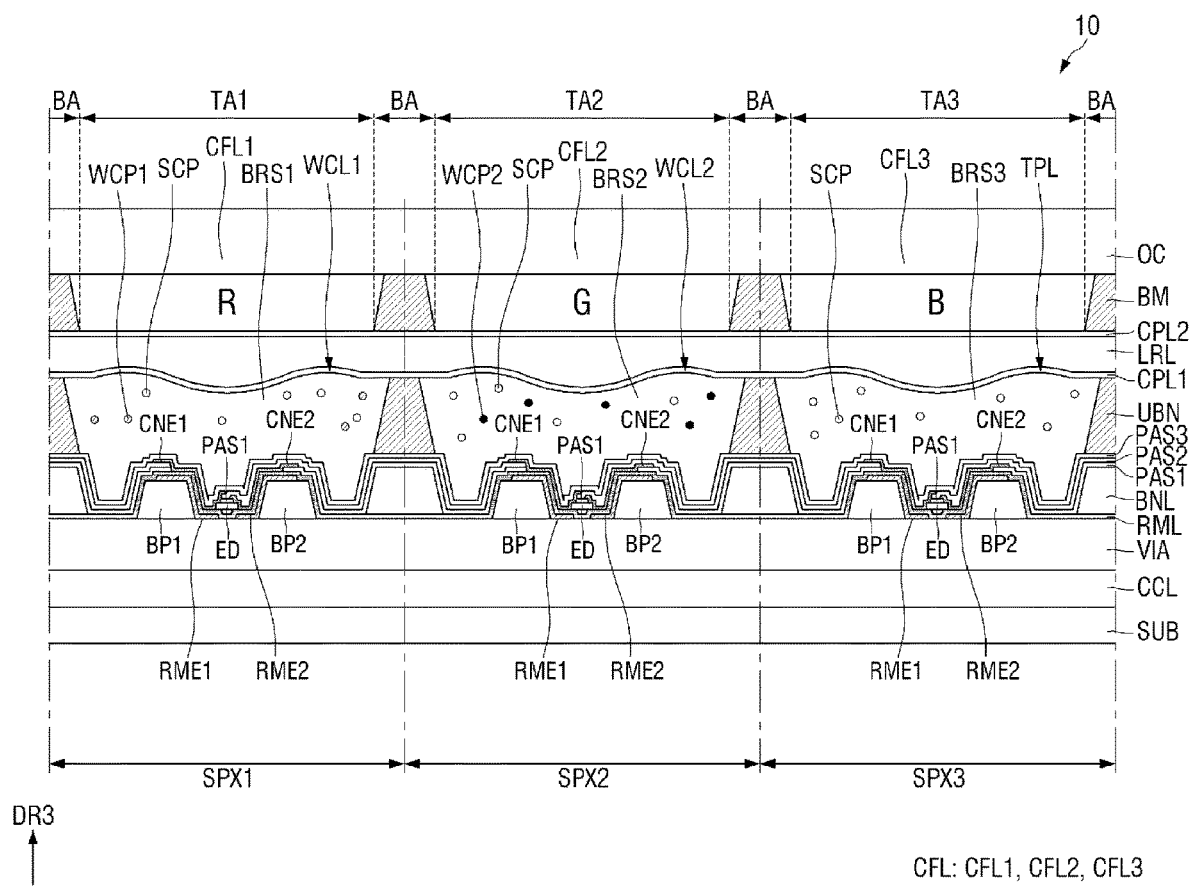
FIG. 8 is a cross-sectional view of a part of the display device according to one or more embodiments.

According to one or more embodiments, the display device 10 may further include wavelength conversion layers WCL1 and WCL2 (e.g., see FIG. 8) and a light transmitting layer TPL (e.g., see FIG. 8) disposed on the light emitting elements ED and color filter layers CFL1, CFL2, and CFL3 (e.g., see FIG. 8). Light emitted from the light emitting elements ED may be output through the wavelength conversion layers WCL1 and WCL2 and the light transmitting layer TPL and the color filter layers CFL1 through CFL3. The color of the output light may be different for each subpixel SPXn even if the light emitting elements ED of the same type are disposed in the subpixels SPXn.

FIG. 8 is a cross-sectional view of a part of the display device 10 according to one or more embodiments.

Referring to FIG. 8, the display device 10 may include the light emitting elements ED disposed on the first substrate SUB and the wavelength conversion layers WCL1 and WCL2, the light transmitting layer TPL and the color filter layers CFL1 through CFL3 disposed on the light emitting elements ED. In addition, the display device 10 may further include a plurality of layers disposed between the wavelength conversion layers WCL1 and WCL2 and the light transmitting layer TPL and the color filter layers CFL1 through CFL3. The layers disposed on the light emitting elements ED of the display device 10 will now be described.

A third insulating layer PAS3 may be disposed on the second insulating layer PAS2, the connection electrodes CNE1 and CNE2, and the bank layer BNL. The third insulating layer PAS3 may protect the layers disposed on the first substrate SUB. However, the third insulating layer PAS3 may also be omitted.

An upper bank layer UBN, the wavelength conversion layers WCL1 and WCL2 and the light transmitting layer TPL, a light blocking member BM, and the color filter layers CFL1 through CFL3 may be disposed on the third insulating layer PAS3. In addition, a plurality of capping layers CPL1 and CPL2 and a low refractive index layer LRL may be disposed between the wavelength conversion layers WCL1 and WCL2 and the light transmitting layer TPL and the color filter layers CFL1 through CFL3, and an overcoat layer OC may be disposed on the color filter layers CFL1 through CFL3.

The display device 10 may include a plurality of light transmitting areas TA1, TA2, and TA3 in which the color filter layers CFL1 through CFL3 are disposed to emit light and a light blocking area BA which is disposed between the light transmitting areas TA1 through TA3 and does not emit light. Each of the light transmitting areas TA1 through TA3 may be located to correspond to a part of the emission area EMA of a subpixel SPXn, and the light blocking area BA may be an area other than the light transmitting areas TA1 through TA3. As will be described later, the light transmitting areas TA1 through TA3 and the light blocking area BA may be separated by the light blocking member BM.

The upper bank layer UBN may be disposed on the third insulating layer PAS3 to overlap the bank layer BNL. The upper bank layer UBN may include parts extending in the first direction DR1 and the second direction DR2 to form a grid pattern. The upper bank layer UBN may be around (e.g., may surround) the emission area EMA or a part in which the light emitting elements ED are disposed. The upper bank layer UBN may form areas in which the wavelength conversion layers WCL1 and WCL2 and the light transmitting layer TPL are disposed.

The wavelength conversion layers WCL1 and WCL2 and the light transmitting layer TPL may be disposed on the third insulating layer PAS3 in the areas surrounded by the upper bank layer UBN. The wavelength conversion layers WCL1 and WCL2 and the light transmitting layer TPL may be disposed in the light transmitting areas TA1 through TA3 to form island-shaped patterns in the display area DPA. However, the present disclosure is not limited thereto, and each of the wavelength conversion layers WCL1 and WCL2 and the light transmitting layer TPL may also extend in a direction across a plurality of subpixels SPXn to form a linear pattern.

In one or more embodiments in which the light emitting elements ED of each subpixel SPXn emit blue light of the third color, the display device 10 may include a first wavelength conversion layer WCL1 disposed in the first subpixel SPX1 to correspond to a first light transmitting area TA1, a second wavelength conversion layer WCL2 disposed in the second subpixel SPX2 to correspond to a second light transmitting area TA2, and the light transmitting layer TPL disposed in the third subpixel SPX3 to correspond to a third light transmitting area TA3.

The first wavelength conversion layer WCL1 may include a first base resin BRS1 and first wavelength conversion materials WCP1 disposed in the first base resin BRS1. The second wavelength conversion layer WCL2 may include a second base resin BRS2 and second wavelength conversion materials WCP2 disposed in the second base resin BRS2. The first wavelength conversion layer WCL1 and the second wavelength conversion layer WCL2 convert and transmit the wavelength of the blue light of the third color incident from the light emitting elements ED. Each of the first wavelength conversion layer WCL1 and the second wavelength conversion layer WCL2 may further include scatterers SCP included in the base resin BRS1 or BRS2, and the scatterers SCP may increase wavelength conversion efficiency.

The light transmitting layer TPL may include a third base resin BRS3 and scatterers SCP disposed in the third base resin BRS3. The light transmitting layer TPL transmits the blue light of the third color incident from the light emitting element ED while maintaining the wavelength of the blue light. The scatterers SCP of the light transmitting layer TPL may adjust an emission path of light emitted through the light transmitting layer TPL. The light transmitting layer TPL may not include wavelength conversion materials.

The scatterers SCP may be metal oxide particles or organic particles. The metal oxide may be, for example, titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The material of the organic particles may be, for example, acrylic resin or urethane resin.

The first through third base resins BRS1 through BRS3 may include a light transmitting organic material. For example, the first through third base resins BRS1 through BRS3 may include epoxy resin, acrylic resin, cardo resin, or imide resin. The first through third base resins BRS1 through BRS3 may all be made of the same material, but the present disclosure is not limited thereto.

The first wavelength conversion materials WCP1 may convert the blue light of the third color into red light of the first color, and the second wavelength conversion materials WCP2 may convert the blue light of the third color into green light of the second color. The first wavelength conversion materials WCP1 and the second wavelength conversion materials WCP2 may be quantum dots, quantum rods, or phosphors. The quantum dots may include Group IV nanocrystals, Group II-VI compound nanocrystals, Group III-V compound nanocrystals, Group IV-VI nanocrystals, or a combination of the same. In one or more embodiments, the red light of the first color may have a central wavelength band of 610 to 650 nm, the green light of the second color may have a central wavelength band of 500 to 630 nm, and the blue light of the third color may have a central wavelength band of 440 to 480 nm. However, the present disclosure is not limited thereto.

In one or more embodiments, the wavelength conversion layers WCL1 and WCL2 and the light transmitting layer TPL may be formed through an inkjet printing process or a photoresist process. The wavelength conversion layers WCL1 and WCL2 and the light transmitting layer TPL may be formed by spraying or applying materials that form the wavelength conversion layers WCL1 and WCL2 and the light transmitting layer TPL into the areas surrounded by the upper bank layer UBN and then drying or exposing and developing the materials. For example, in one or more embodiments in which the wavelength conversion layers WCL1 and WCL2 and the light transmitting layer TPL are formed through an inkjet printing process, an upper surface of each layer of the color control structures TPL, WCL1, and WCL2 may be formed to be uneven so that edge parts adjacent to the upper bank layer UBN are higher than a central part. However, the present disclosure is not limited thereto. In one or more embodiments in which the wavelength conversion layers WCL1 and WCL2 and the light transmitting layer TPL are formed through a photoresist process, the upper surface of each layer of the wavelength conversion layers WCL1 and WCL2 and the light transmitting layer TPL may be formed to be even so that the edge parts adjacent to the upper bank layer UBN are parallel to an upper surface of the upper bank layer UBN, or the central part of each of the wavelength conversion layers WCL1 and WCL2 and the light transmitting layer TPL may be formed to be higher unlike in the drawing.

The light emitting elements ED of the subpixels SPXn may emit the same blue light of the third color, and light output from the subpixels SPXn may be light of different colors. For example, light emitted from the light emitting elements ED disposed in the first subpixel SPX1 is incident on the first wavelength conversion layer WCL1, light emitted from the light emitting elements ED disposed in the second subpixel SPX2 is incident on the second wavelength conversion layer WCL2, and light emitted from the light emitting elements ED disposed in the third subpixel SPX3 is incident on the light transmitting layer TPL. The light incident on the first wavelength conversion layer WCL1 may be converted into red light, the light incident on the second wavelength conversion layer WCL2 may be converted into green light, and the light incident on the light transmitting layer TPL may be transmitted as the same blue light without wavelength conversion. Even if the subpixels SPXn include the light emitting elements ED emitting light of the same color, light of different colors may be output according to the arrangement of the wavelength conversion layers WCL1 and WCL2 and the light transmitting layer TPL disposed on the light emitting elements ED.

A first capping layer CPL1 may be disposed on the color control structures TPL, WCL1, and WCL2 and the upper bank layer UBN. The first capping layer CPL1 may prevent impurities such as moisture or air from being introduced from the outside and damaging or contaminating the color control structures TPL, WCL1, and WCL2. The first capping layer CPL1 may include an inorganic insulating material.

The low refractive index layer LRL may be disposed on the first capping layer CPL1. The low refractive index layer LRL may be an optical layer that recycles light passing through the wavelength conversion layers WCL1 and WCL2 and the light transmitting layer TPL and may improve the light output efficiency and color purity of the display device 10. The low refractive index layer LRL may be made of an organic material having a low refractive index and may compensate for a step formed by the wavelength conversion layers WCL1 and WCL2, the light transmitting layer TPL, and the upper bank layer UBN.

A second capping layer CPL2 may be disposed on the low refractive index layer LRL and may prevent impurities such as moisture or air from being introduced from the outside and damaging or contaminating the low refractive index layer LRL. Like the first capping layer CPL1, the second capping layer CPL2 may include an inorganic insulating material.

The light blocking member BM may be disposed on the second capping layer CPL2. The light blocking member BM may be formed in a grid pattern to partially expose a surface of the second capping layer CPL2. In the display device 10, the light blocking member BM may cover the sub-area SA of each subpixel SPXn in addition to the bank layer BNL and the upper bank layer UBN in a plan view. Areas in which the light blocking member BM is not disposed may be the light transmitting areas TA1 through TA3 in which the color filter layers CFL1 through CFL3 are disposed to emit light, and an area in which the light blocking member BM is disposed may be the light blocking area BA in which light emission is blocked.

The light blocking member BM may include an organic material that can absorb light. The light blocking member BM may reduce color distortion due to reflection of external light by absorbing the external light. For example, the light blocking member BM may be made of a material used as a black matrix of the display device 10 and may absorb all wavelengths of visible light.

In one or more embodiments, the light blocking member BM may be omitted from the display device 10 and may be replaced with a material that absorbs light of a specific wavelength among the visible light wavelengths and transmits light of another specific wavelength. The light blocking member BM may be replaced with a color pattern including the same material as at least any one of the color filter layers CFL1 through CFL3. For example, in the area in which the light blocking member BM is disposed, a color pattern including the material of any one color filter layer may be disposed, or a structure in which a plurality of color patterns are stacked may be disposed.

The color filter layers CFL1 through CFL3 may be disposed on the surface of the second capping layer CPL2. Each of the color filter layers CFL1 through CFL3 may be disposed on the second capping layer CPL2 to correspond to an area exposed by the light blocking member BM. The different color filter layers CFL1 through CFL3 may be spaced from each other with the light blocking member BM interposed between them. However, the present disclosure is not limited thereto. In one or more embodiments, parts of the color filter layers CFL1 through CFL3 may be disposed on the light blocking member BM such that they are spaced from each other on the light blocking member BM. In one or more embodiments, the color filter layers CFL1 through CFL3 may partially overlap each other.

The color filter layers CFL1 through CFL3 may include a first color filter layer CFL1 disposed in the first subpixel SPX1, a second color filter layer CFL2 disposed in the second subpixel SPX2, and a third color filter layer CFL3 disposed in the third subpixel SPX3. The color filter layers CFL1 through CFL3 may be formed as linear patterns disposed in the light transmitting areas TA1 through TA3 or the emission areas EMA. However, the present disclosure is not limited thereto, and the color filter layers CFL1 through CFL3 may also be disposed to respectively correspond to the light transmitting areas TA1 through TA3 and may form island-shaped patterns.

Each of the color filter layers CFL1 through CFL3 may include a colorant such as a dye or pigment that absorbs light in wavelength bands other than light in a specific wavelength band. Each of the color filter layers CFL1 through CFL3 may be disposed in a corresponding subpixel SPXn to transmit only a part of light incident on the color filter layer CFL1, CFL2, or CFL3 in the subpixel SPXn. In the subpixels SPXn of the display device 10, only light transmitted through the color filter layers CFL1 through CFL3 may be selectively displayed. In one or more embodiments, the first color filter layer CFL1 may be a red color filter layer, the second color filter layer CFL2 may be a green color filter layer, and the third color filter layer CFL3 may be a blue color filter layer. Light emitted from the light emitting elements ED may pass through the color control structures TPL, WCL1, and WCL2 and exit through the color filter layers CFL1 through CFL3.

The overcoat layer OC may be disposed on the color filter layers CFL1 through CFL3 and the light blocking member BM. The overcoat layer OC may be disposed over the entire display area DPA, and a part of the overcoat layer OC may also be disposed in the non-display area NDA. The overcoat layer OC may include an organic insulating material to protect the members disposed in the display area DPA from the outside.

Because the display device 10 according to the described embodiment includes the color control structures TPL, WCL1, and WCL2 and the color filter layers CFL1 through CFL3 disposed on the light emitting elements ED, the subpixels SPXn may display light of different colors even if the light emitting elements ED of the same type are disposed in the subpixels SPXn.

For example, the light emitting elements ED disposed in the first subpixel SPX1 may emit blue light of the third color, and the light may pass through the third insulating layer PAS3 and enter the first wavelength conversion layer WCL1. The first base resin BRS1 of the first wavelength conversion layer WCL1 may be made of a transparent material. Thus, a part of the light may transmit through the first base resin BRS1 and enter the first capping layer CPL1 disposed on the first base resin BRS1. However, at least a part of the light may enter the scatterers SCP and the first wavelength conversion materials WCP1 disposed in the first base resin BRS1 and may enter the first capping layer CPL1 as red light after being scattered and wavelength-converted. The light incident on the first capping layer CPL1 may pass through the low refractive index layer LRL and the second capping layer CPL2 and enter the first color filter layer CFL1. The first color filter layer CFL1 may block transmission of light other than red light. Accordingly, red light may be output from the first subpixel SPX1.

Similarly, light emitted from the light emitting elements ED disposed in the second subpixel SPX2 may be output as green light after passing through the third insulating layer PAS3, the second wavelength conversion layer WCL2, the first capping layer CPL1, the low refractive index layer LRL, the second capping layer CPL2, and the second color filter layer CFL2.

The light emitting elements ED disposed in the third subpixel SPX3 may emit blue light of the third color, and the light may pass through the third insulating layer PAS3 and enter the light transmitting layer TPL. The third base resin BRS3 of the light transmitting layer TPL may be made of a transparent material. Thus, a part of the light may transmit through the third base resin BRS3 and enter the first capping layer CPL1 disposed on the third base resin BRS3. The light incident on the first capping layer CPL1 may pass through the low refractive index layer LRL and the second capping layer CPL2 and enter the third color filter layer CFL3. The third color filter layer CFL3 may block transmission of light other than blue light. Accordingly, blue light may be output from the third subpixel SPX3.

Figure 9:
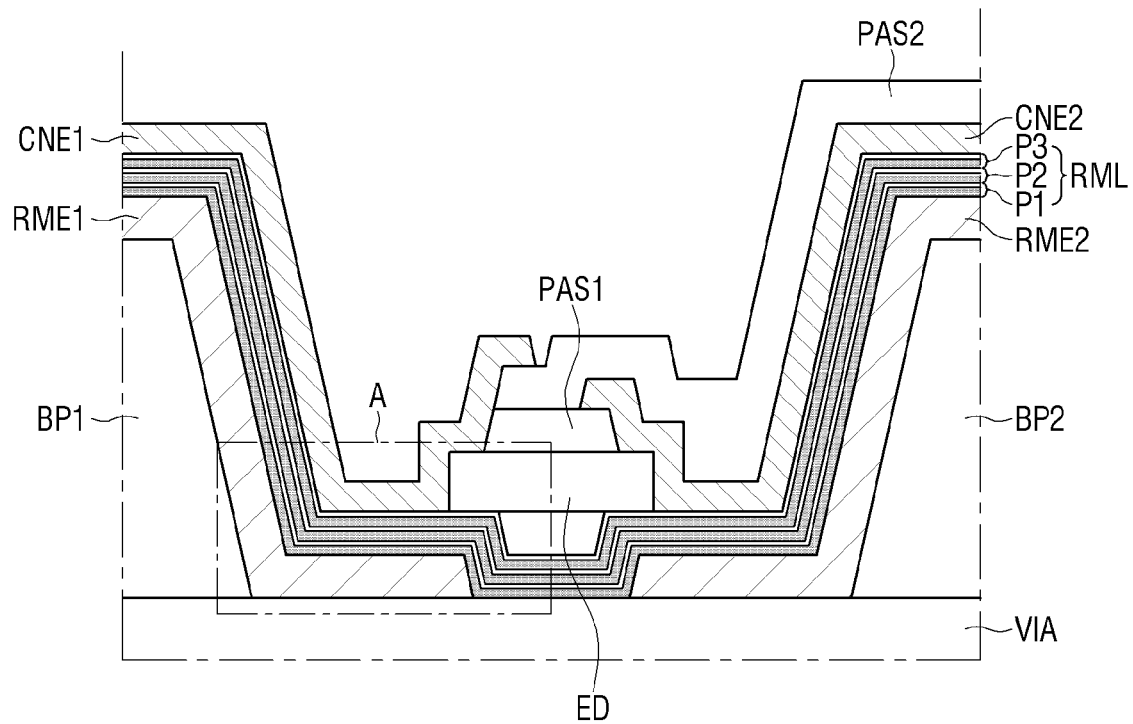
FIGS. 9 and 10 are enlarged views of a light emitting element and an optical layer of the display device according to one or more embodiments.
Figure 10:
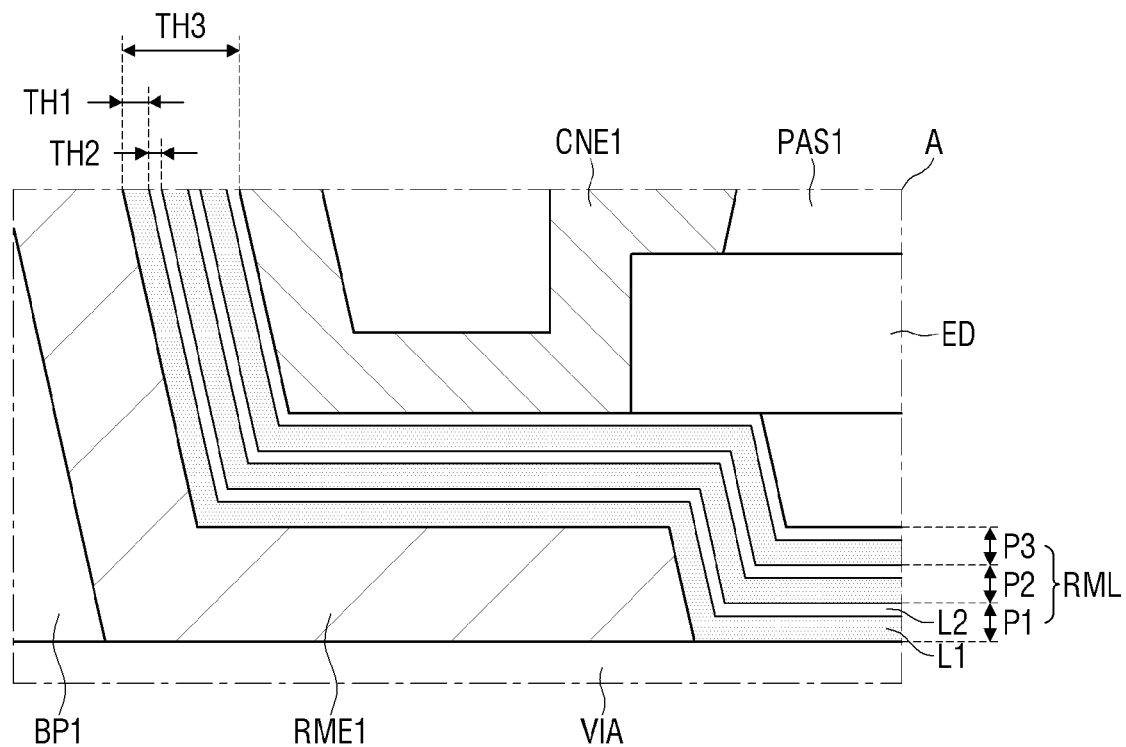

FIGS. 9 and 10 are enlarged views of a light emitting element ED and the optical layer RML of the display device 10 according to one or more embodiments.

FIG. 9 is a partial enlarged view of the optical layer RML, the electrodes RME1 and RME2, and the bank patterns BP1 and BP2 between which the light emitting elements ED are disposed in FIG. 6. FIG. 10 is an enlarged view illustrating the arrangement of a plurality of pair layers P1 through P3 of the optical layer RML and different layers L1 and L2 of the pair layers P1 through P3 in an area A as shown in FIG. 9.

Referring to FIGS. 9 and 10, in the display device 10 according to the described embodiment, the optical layer RML may include a plurality of pair layers P1 through P3, each including a first layer L1 and a second layer L2 made of different materials. One first layer L1 and one second layer L2 may form one pair layer P1, P2 or P3. In the optical layer RML, the pair layers P1 through P3 may be stacked so that the first layer L1 and the second layer L2 are alternately stacked. For example, the optical layer RML may include a first pair layer P1 directly disposed on the first electrode RME1 and the second electrode RME2, a second pair layer P2 disposed on the first pair layer P1, and a third pair layer P3 disposed on the second pair layer P2. In the optical layer RML, three first layers L1 and three second layers L2 may be alternately disposed. The optical layer RML may include at least three pair layers P1 through P3 to have a sufficient thickness. When the optical layer RML includes less than three pair layers P1 through P3, it may be too thin to insulate the electrodes RME1 and RME2 and to reflect light. The optical layer RML may function as an insulating layer by covering the electrodes RME1 and RME2 and may also function to reflect incident light upward as will be described later.

In the embodiment of FIGS. 9 and 10, each of the pair layers P1 through P3 includes the first layer L1 as a lower layer and the second layer L2 as an upper layer disposed on the first layer L1. The first layer L1 of the first pair layer P1 may directly contact the first electrode RME1 and the second electrode RME2, and the first layers L1 of the second pair layer P2 and the third pair layer P3 may directly contact the second layer L2 of the first pair layer P1 and the second layer L2 of the second pair layer P2, respectively. The light emitting element ED may be directly disposed on the third pair layer P3 of the optical layer RML or the second layer L2 of the third pair layer P3. However, the present disclosure is not limited thereto. In the optical layer RML of the display device 10, the first layer L1 of each of the pair layers P1 through P3 may also be an upper layer, and the second layer L2 may also be a lower layer.

In one or more embodiments, the first layer L1 and the second layer L2 may include different insulating materials. For example, the first layer L1 and the second layer L2 may each include any one of silicon oxide ($SiO_x$), silicon nitride ($SiN_x$) and titanium oxide ($TiO_x$) but may be made of different materials. Because the first layer L1 and the second layer L2 include different materials, they may have different refractive indices. The optical layer RML in which the first layer L1 and the second layer L2 having different refractive indices are alternately stacked may reflect incident light. Light travelling toward the optical layer RML under the light emitting element ED among the light emitted from the light emitting element ED and light travelling toward the optical layer RML among the light incident on the wavelength conversion layer WCL1 or WCL2 or the light transmitting layer TPL may be reflected by the optical layer RML to travel upward.

Figure 11:
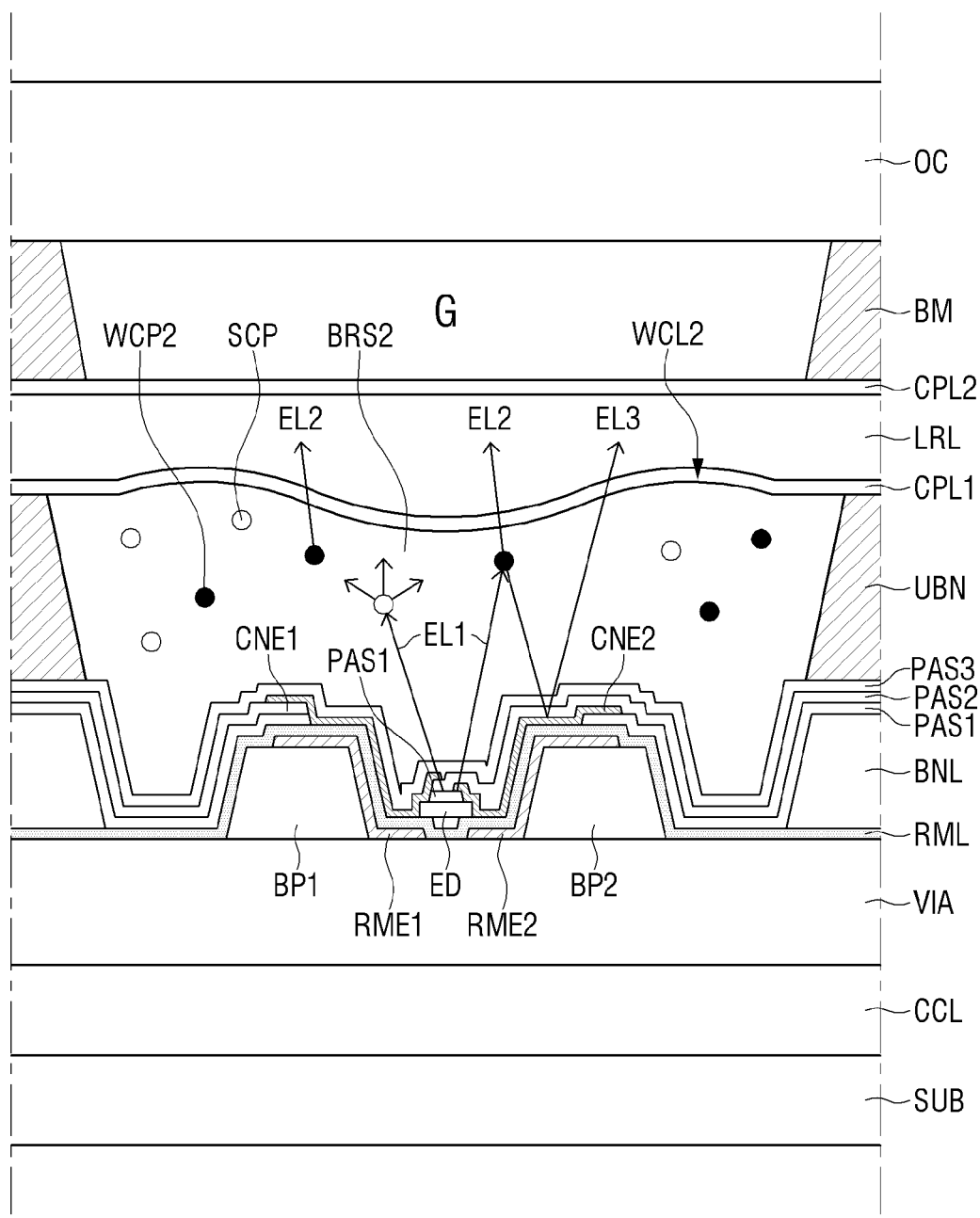
FIG. 11 is a schematic view illustrating emission of light emitted from a light emitting element of the display device according to one or more embodiments.

FIG. 11 is a schematic view illustrating emission of light emitted from a light emitting element ED of the display device 10 according to one or more embodiments. FIG. 11 is a schematic view illustrating emission of light from a light emitting element ED and the second wavelength conversion layer WCL2 disposed in the second subpixel SPX2 of the display device 10.

Referring to FIG. 11, first emitted light EL1 emitted from the light emitting element ED may be generated in the light emitting layer 36 of the light emitting element ED and emitted in random directions. A part of the first emitted light EL1 generated in the light emitting layer 36 may pass through the insulating film 38, the first insulating layer PAS1 and the second insulating layer PAS2 to travel upward. Another part of the first emitted light EL1 may be emitted toward both ends of the light emitting element ED to travel toward the electrodes RME1 and RME2 disposed on the bank patterns BP1 and BP2. Another part of the first emitted light EU may be emitted downward from the light emitting element ED to travel toward the optical layer RML.

The light emitted toward both ends of the light emitting element ED and the light emitted upward are incident on the wavelength conversion layer WCL1 or WCL2 or the light transmitting layer TPL disposed on the light emitting element ED. The first emitted light EL1 may be incident on the scatterers SCP or the wavelength conversion materials WCP1 or WCP2 and may be scattered or converted into light of another wavelength band. For example, a part of the first emitted light EL1 may be incident on the second wavelength conversion materials WCP2 of the second wavelength conversion layer WCL2 and may be output as second emitted light EL2. At least a part of the second emitted light EL2 may be output upward, but another part may be output downward.

Some of the light emitted from the light emitting element ED and the second wavelength conversion materials WCP2 may be incident on the optical layer RML disposed under the light emitting element ED. The optical layer RML may include the layers L1 and L2 including different materials to reflect incident light. The second emitted light EL2 incident on the optical layer RML may turn into third emitted light EL3 emitted from the optical layer RML to travel upward. In the display device 10, because the optical layer RML is disposed under the light emitting element ED and the wavelength conversion layer WCL1 or WCL2 or the light transmitting layer TPL, the amount of light emitted downward from the first substrate SUB can be reduced, and the upward light output efficiency can be improved. In addition, because the optical layer RML functions as a reflective layer, it can have the effect of recycling light incident on the wavelength conversion layer WCL1 or WCL2 or the light transmitting layer TPL.

Thicknesses of the first layer L1 and the second layer L2 of the optical layer RML may be set according to the wavelength band of incident light. In the optical layer RML in which the first layer L1 and the second layer L2 are stacked, each of the first layer L1 and the second layer L2 may have a thickness that ensures highest reflection efficiency according to the wavelength of incident light. According to one or more embodiments, each of the first layer L1 and the second layer L2 of the optical layer RML may have a thickness that satisfies Equation 1 below:

$$TH=\lambda/(4*n) \quad (1).$$

In Equation 1, 'TH' is the thickness of each layer L1 or L2, '$\lambda$' is the wavelength of light, and 'n' is the refractive index of each layer L1 or L2. In the optical layer RML, the materials and thicknesses of the first layer L1 and the second layer L2 may be set such that the optical layer RML can effectively reflect light in a specific wavelength band selected.

In one or more embodiments, the optical layer RML may include the layers L1 and L2 having materials and thicknesses that ensure high reflection efficiency for second light of the second color or green light having a central wavelength band of 500 to 630 nm. For example, in the optical layer RML, the first layer L1 of each of the pair layers P1 through P3 may include silicon oxide ($SiO_x$), and the second layer L2 may include silicon nitride ($SiN_x$). The first layer L1 and the second layer L2 may include different materials, and their thicknesses TH1 and TH2 may be different from each other according to Equation 1 above. Under the condition that the optical layer RML has high reflection efficiency for the green light of the second color, a first thickness TH1 of the first layer L1 may be in the range of 830 to 1050 Å (or 83 to 105 nm), and a second thickness TH2 of the second layer L2 may be in the range of 700 to 880 Å (or 70 to 88 nm). In one or more embodiments in which the optical layer RML includes three pair layers P1 through P3, a third thickness TH3 of the optical layer RML may be 4500 Å (or 450 nm) or more.

The optical layer RML may be disposed over the entire display area DPA regardless of types of the subpixels SPXn. For example, the light emitting elements ED emitting blue light, which is light of the third color, may be disposed in each subpixel SPXn, and the wavelength conversion layer WCL1 or WCL2 or the light transmitting layer TPL may be disposed on the light emitting elements ED. Therefore, light of different wavelengths may be output from the subpixels SPXn. The third thickness TH3 of the optical layer RML may vary according to the thicknesses TH1 and TH2 of the first layer L1 and the second layer L2, and the thicknesses TH1 and TH2 of the first layer L1 and the second layer L2 may vary according to the wavelength of light output from each subpixel SPXn, that is, the wavelength of light to be reflected or recycled. If there is light required in relatively high amounts among the light output from the subpixels SPXn, the thickness of the optical layer RML may be set according to the wavelength band of the light, thereby further improving the output efficiency of the light.

In one or more embodiments, the display device 10 may include the light emitting elements ED emitting blue light of the third color, but the thicknesses TH1 and TH2 of the first layer L1 and the second layer L2 of the optical layer RML may be set according to the wavelength band of green light of the second color. When the subpixels SPXn (e.g., first through third subpixels SPX1, SPX2, SPX3) respectively emitting light of the first color, light of the second color, and light of the third color constitute one pixel PX, if the subpixels SPXn have the same area and the same number of the light emitting elements ED, the amount of green light of the second color may be relatively insufficient. However, because the optical layer RML has a thickness that ensures the highest reflection efficiency for the green light of the second color, it can compensate for the output efficiency of the green light that is relatively insufficient. In addition, the green light of the second color has a wavelength band corresponding to an intermediate value of the wavelength bands of the red light of the first color and the blue light of the third color. Therefore, the optical layer RML disposed in the first subpixel SPX1 and the third subpixel SPX3 may also have a certain level of reflectance.

However, the present disclosure is not limited thereto. When the optical layer RML is formed as a pattern in each subpixel SPXn instead of being disposed over the entire display area DPA, the thicknesses of the first layer L1 and the second layer L2 may be set differently according to the wavelength of light emitted from each subpixel SPXn. This will be described with reference to another embodiment.

The display device 10 according to the described embodiment includes the optical layer RML in which the layers L1 and L2 including different materials and thus having different refractive indices and thicknesses are alternately stacked. Therefore, it is possible to improve the upward light output efficiency and reduce the amount of light emitted downward and lost Other embodiments of the display device 10 will now be described with reference to other drawings.

Figure 12:
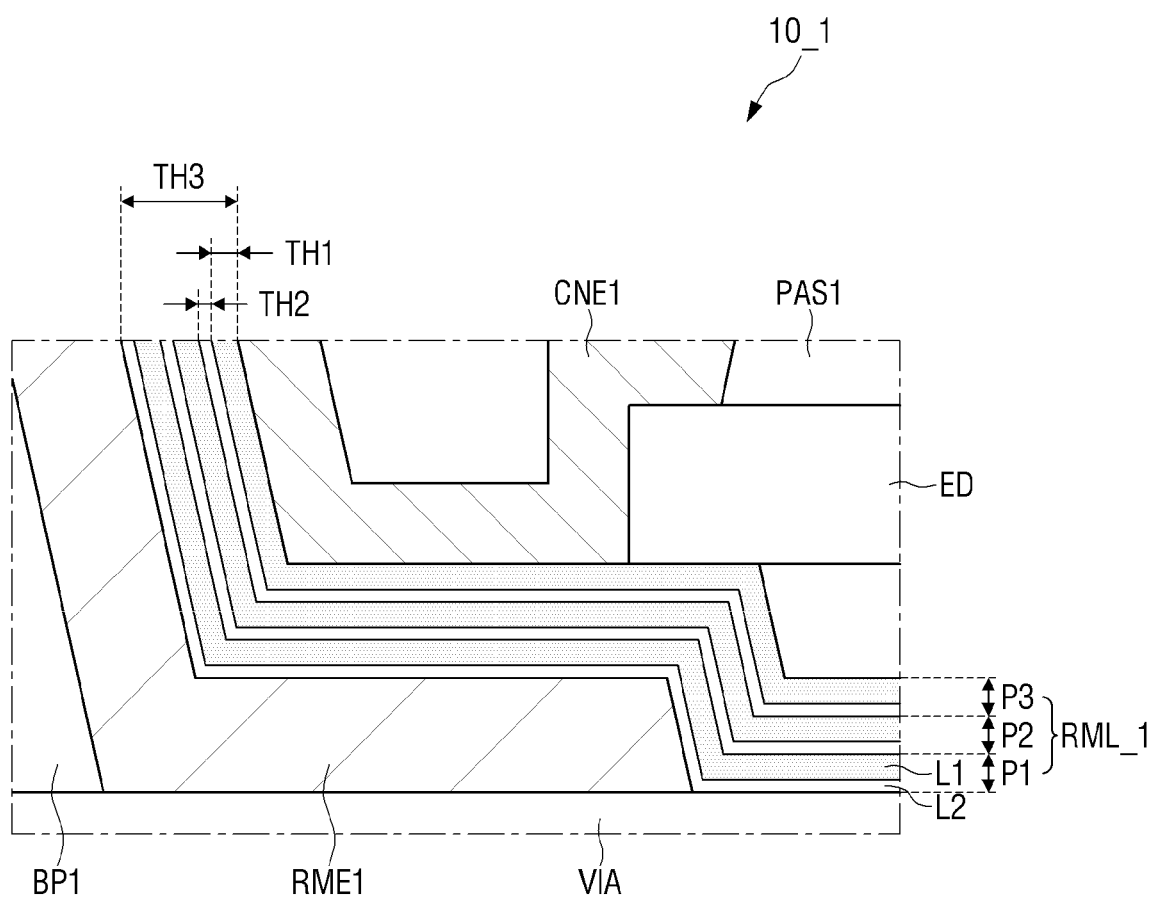
FIG. 12 is a cross-sectional view of an optical layer of a display device according to one or more embodiments.

FIG. 12 is a cross-sectional view of an optical layer RML_1 of a display device 10_1 according to one or more embodiments.

Referring to FIG. 12, in the display device 10_1 according to the described embodiment, each of pair layers P1 through P3 of the optical layer RML_1 may include a second layer L2 as a lower layer and a first layer L1 as an upper layer. In each of the pair layers P1 through P3, the second layer L2 including silicon nitride ($SiN_x$) and having a relatively small second thickness TH2 may be disposed, and the first layer L1 having a first thickness TH1 greater than the second thickness TH2 may be disposed on the second layer L2. In one or more embodiments, the second layer L2 of a first pair layer P1 may be directly disposed on a first electrode RME1 and a second electrode RME2, and the second layers L2 of a second pair layer P2 and a third pair layer P3 may be directly disposed on the first layer L1 of the first pair layer P1 and the first layer L1 of the second pair layer P2, respectively. A light emitting element ED may be directly disposed on the third pair layer P3 of the optical layer RML_1 or the first layer L1 of the third pair layer P3. The current embodiment is different from the embodiment of FIG. 10 in the stacking order of the first layer L1 and the second layer L2 of the optical layer RML_1.

The optical layer RML_1 includes the first layer L1 and the second layer L2 including different materials and thus having different refractive indices and thicknesses. The stacking order of the first layer L1 and the second layer L2 is not significantly limited as long as the first layer L1 and the second layer L2 are alternately stacked. Even if the second layer L2 having a small thickness TH2 is disposed under the first layer L1 unlike in the embodiment of FIG. 10, a third thickness TH3 of the optical layer RML_1 may be the same as that of the embodiment of FIG. 10. In the optical layer RML_1, the stacking order can be changed as long as the first thickness TH1 of the first layer L1 and the second thickness TH2 of the second layer L2 are set within a specific range according to the wavelength of light based on Equation 1.

Figure 13:
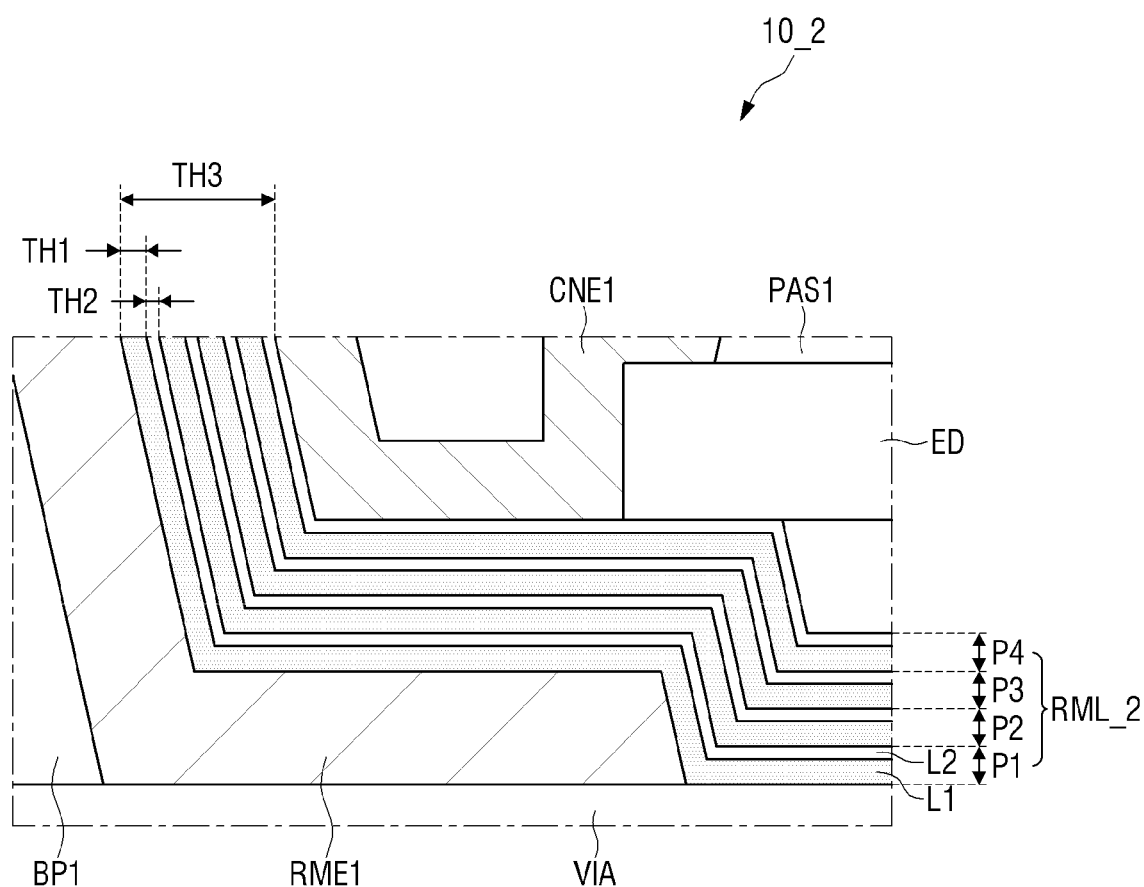
FIGS. 13 through 15 are cross-sectional views of optical layers of display devices according one or more embodiments.
Figure 14:
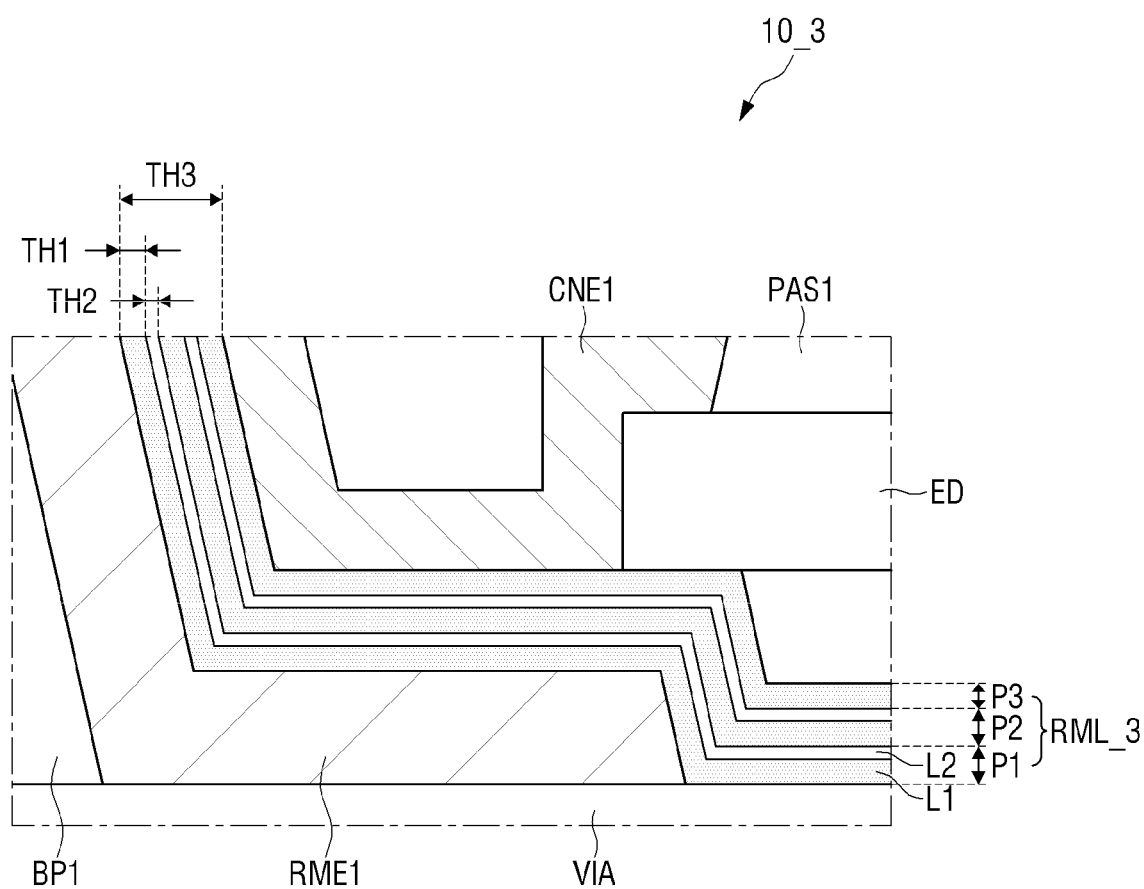
Figure 15:
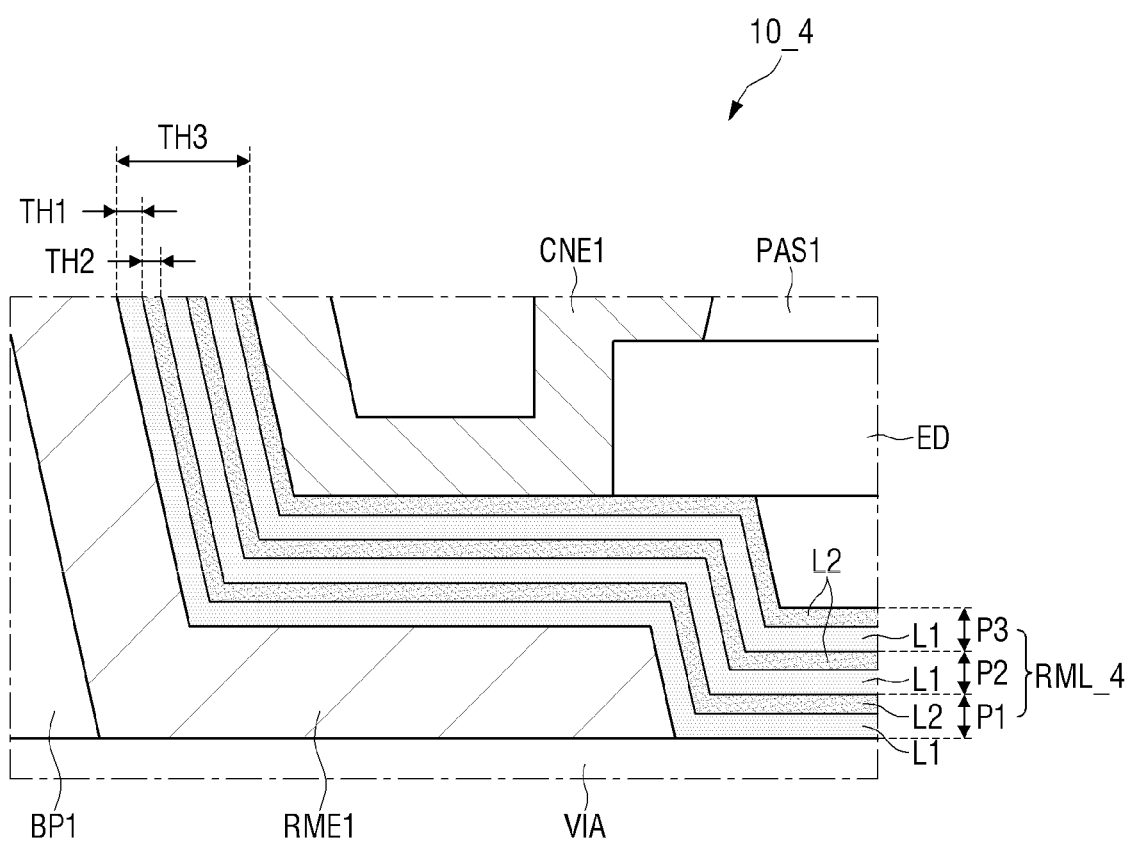

FIGS. 13 through 15 are cross-sectional views of optical layers RML_2 through RML_4 of display devices 10_2 through 10_4 according to one or more embodiments.

Referring to FIG. 13, in a display device 10_2 according to one or more embodiments, an optical layer RML_2 may include three or more pair layers P1 through P4. The optical layer RML_2 may further include a fourth pair layer P4 disposed on a third pair layer P3 and including a first layer L1 and a second layer L2. The fourth pair layer P4 may include the first layer L1 including silicon oxide ($SiO_x$) and the second layer L2 disposed on the first layer L1 and including silicon nitride ($SiN_x$). The first layer L1 of the fourth pair layer P4 may be directly disposed on the second layer L2 of the third pair layer P3, and a light emitting element ED may be directly disposed on the fourth pair layer P4 of the optical layer RML_2 or the second layer L2 of the fourth pair layer P4. In the optical layer RML_2, four first layers L1 and four second layers L2 may be alternately stacked.

The optical layer RML_2 including four pair layers P1 through P4 may have an increased third thickness TH3. For example, the third thickness TH3 of the optical layer RML_2 may be 6000 Å (or 600 nm) or more. As the optical layer RML_2 becomes thicker by including a greater number of the pair layers P1 through P4, light reflection efficiency may be further improved.

Referring to FIG. 14, in a display device 10_3 according to one or more embodiments, some of a plurality of pair layers P1 through P3 of an optical layer RML_3 may include only one of a first layer L1 and a second layer L2. The optical layer RML_3 may not necessarily include an equal number of the first layers L1 and the second layers L2 and can be variously changed as long as it has a structure in which layers including different materials and thus having different refractive indices and thicknesses are alternately stacked. The optical layer RML_3 may include a plurality of first layers L1 and a plurality of second layers L2, but the numbers of the first layers L1 and the second layers L2 may be different from each other.

For example, each of a first pair layer P1 and a second pair layer P2 may include the first layer L1 as a lower layer and the second layer L2 as an upper layer, but a third pair layer P3 may include only the first layer L1. A lowermost layer of the optical layer RML_3 may be the first layer L1 of the first pair layer P1, and an uppermost layer may be the first layer L1 of the third pair layer P3. The optical layer RML_3 may have a structure in which three first layers L1 and two second layers L2 are alternately stacked. A light emitting element ED may be directly disposed on the third pair layer P3 or the first layer L1 of the third pair layer P3. The current embodiment is different from the embodiment of FIG. 10 in the stacked structure of the first layer L1 and the second layer L2 of the optical layer RML_3.

Referring to FIG. 15, in a display device 10_4 according to one or more embodiments, a first layer L1 of an optical layer RML_4 may include silicon oxide ($SiO_x$), and a second layer L2 may include titanium oxide ($TiO_x$). The current embodiment is different from the embodiment of FIG. 10 in the material of the second layer L2 of the optical layer RML_4 and accordingly in a second thickness TH2 of the second layer L2 and a third thickness TH3 of the optical layer RML_4.

As described above, the first layer L1 and the second layer L2 of the optical layer RML_4 may each include any one of silicon oxide ($SiO_x$), silicon nitride ($SiN_x$) and titanium oxide ($TiO_x$) but may be made of different materials. Each of pair layers P1 through P3 may include the first layer L1 and the second layer L2 made of two different materials selected from silicon oxide ($SiO_x$), silicon nitride ($SiN_x$) and titanium oxide ($TiO_x$). In one or more embodiments, the first layers L1 or the second layers L2 of some of the pair layers P1 through P3 may include different materials. For example, the first layer L1 of a first pair layer P1 may include silicon oxide ($SiO_x$), and the second layer L2 of the first pair layer P1 may include silicon nitride ($SiN_x$). However, the first layer L1 of a second pair layer P2 may include silicon oxide ($SiO_x$), and the second layer L2 of the second pair layer P2 may include titanium oxide ($TiO_x$). Because the layers L1 and L2 of the optical layer RML_4 include different materials, the thicknesses TH1 through TH3 may vary based on Equation 1.

Figure 16:
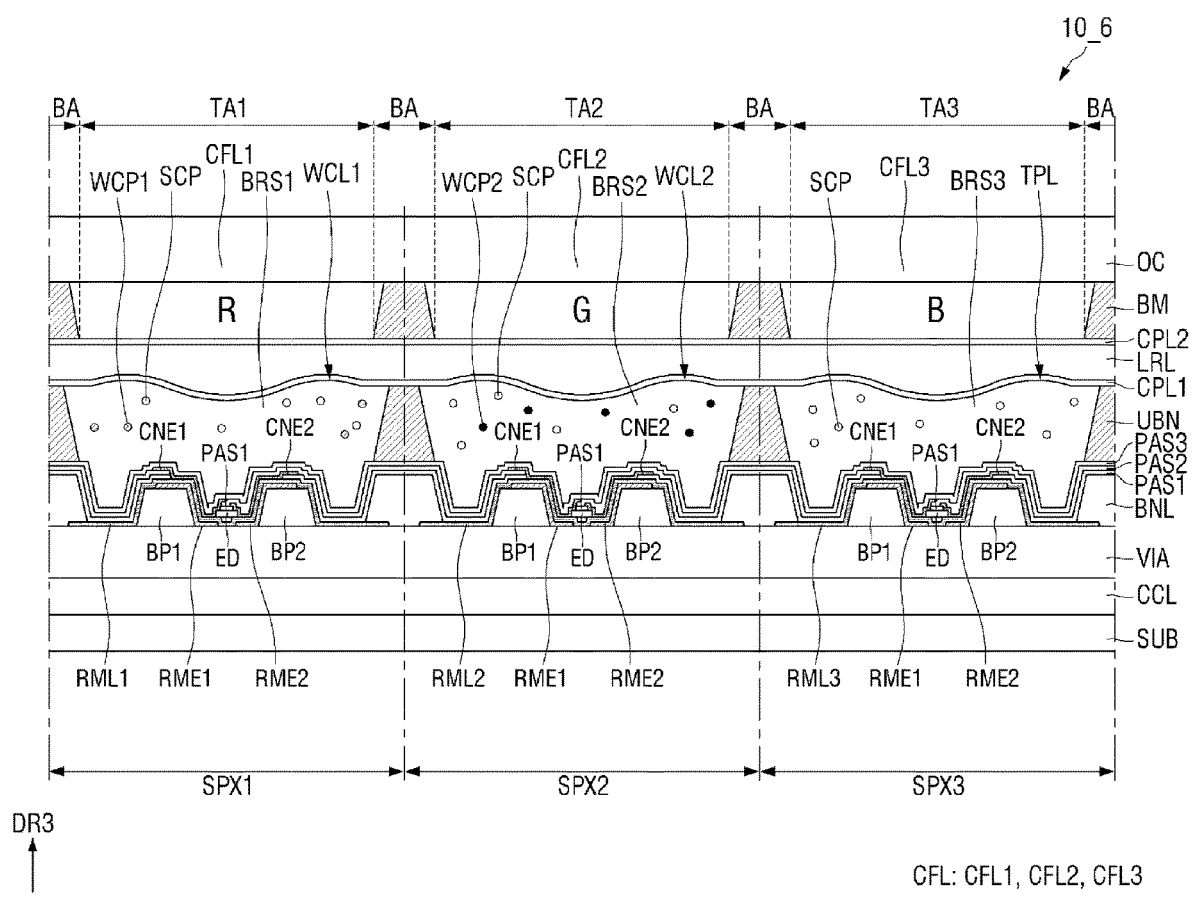
FIG. 16 is a cross-sectional view of a part of a display device according to one or more embodiments.
Figure 17:
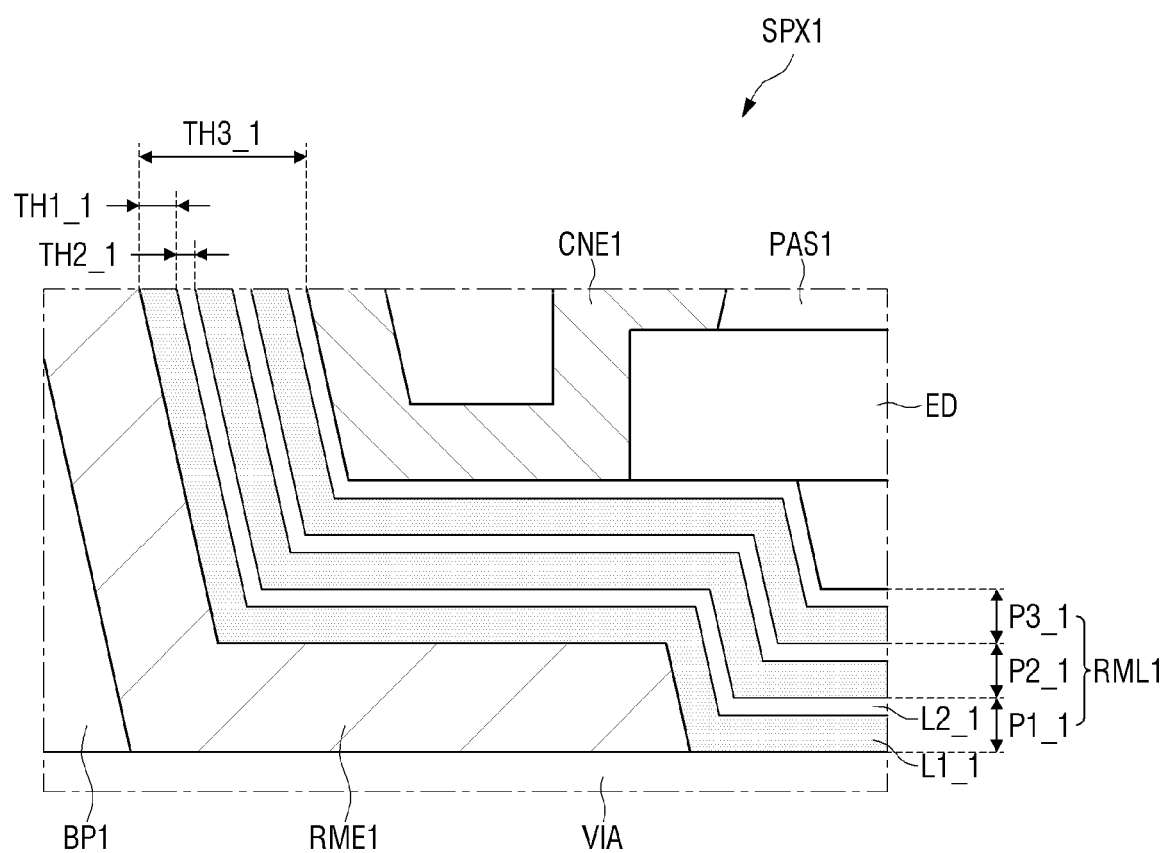
FIG. 17 is a cross-sectional view of a first optical layer disposed in a first subpixel of FIG. 16.
Figure 18:
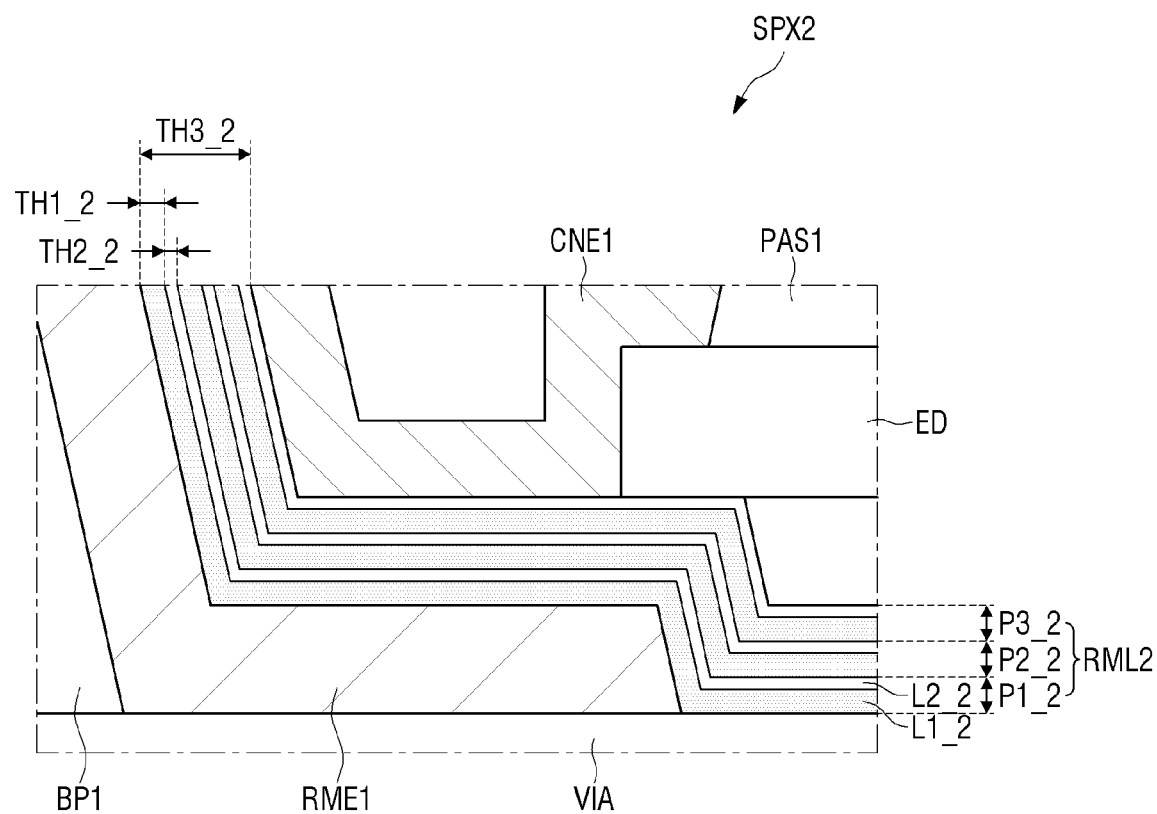
FIG. 18 is a cross-sectional view of a second optical layer disposed in a second subpixel of FIG. 16.
Figure 19:
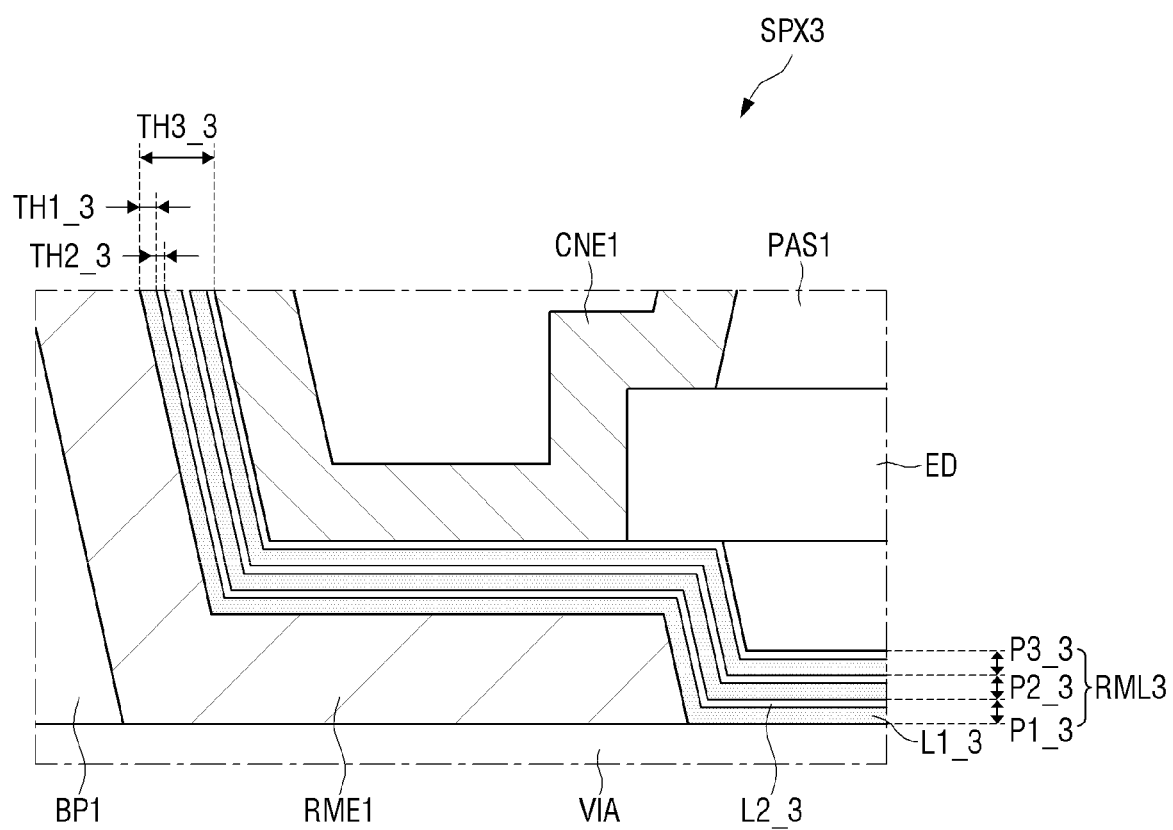
FIG. 19 is a cross-sectional view of a third optical layer disposed in a third subpixel of FIG. 16.
Figure 20:
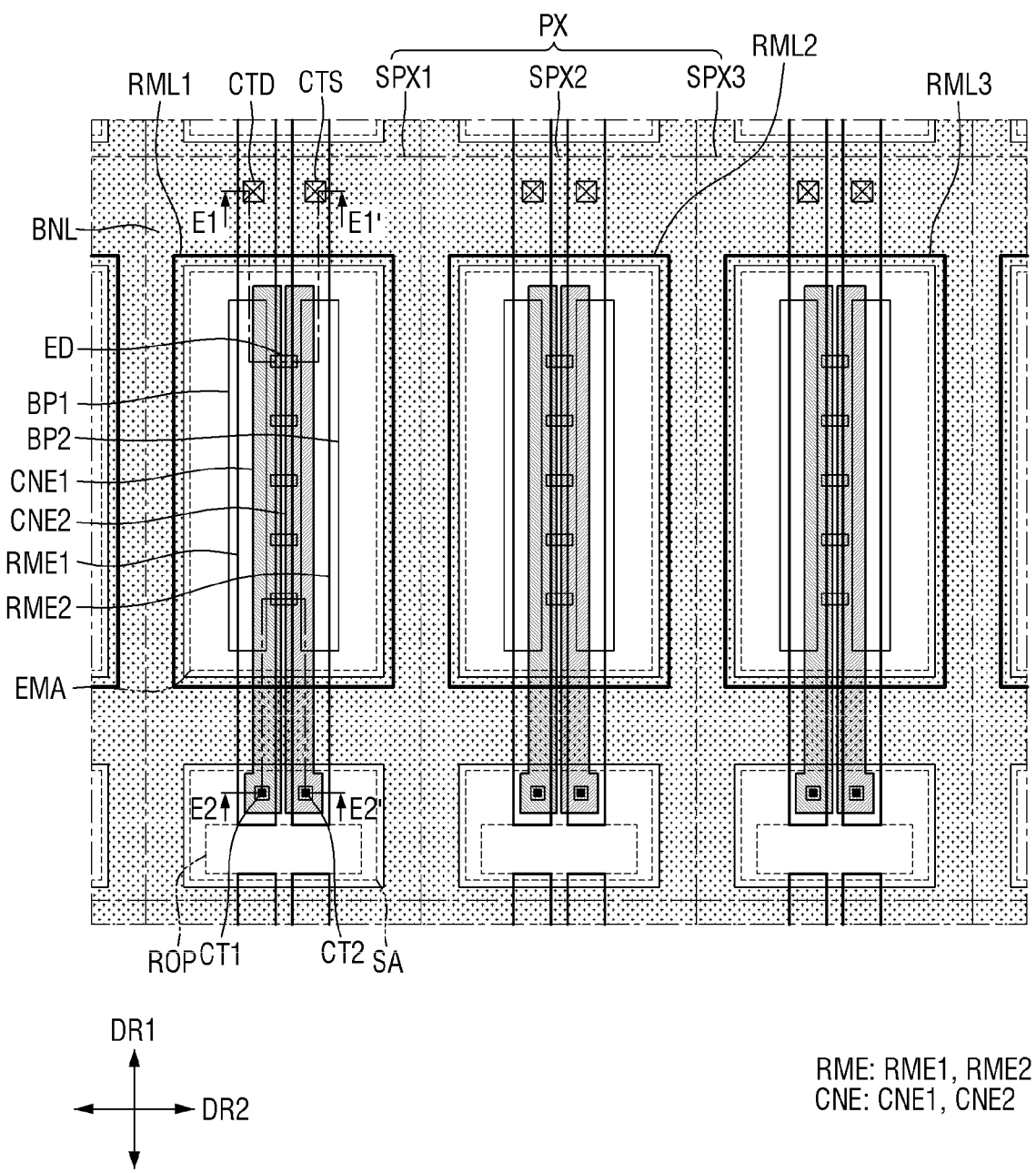
FIG. 20 is a plan view illustrating the arrangement of the optical layers in one pixel of FIG. 16.

FIG. 16 is a cross-sectional view of a part of a display device 10_6 according to one or more embodiments. FIG. 17 is a cross-sectional view of a first optical layer RML1 disposed in a first subpixel SPX1 of FIG. 16. FIG. 18 is a cross-sectional view of a second optical layer RML2 disposed in a second subpixel SPX2 of FIG. 16. FIG. 19 is a cross-sectional view of a third optical layer RML3 disposed in a third subpixel SPX3 of FIG. 16. FIG. 20 is a plan view illustrating the arrangement of the optical layers RML1 through RML3 in one pixel PX of FIG. 16.

FIG. 16 illustrates the arrangement of wavelength conversion layers WCL1 and WCL2, a light transmitting layer TPL, light emitting elements ED, and the optical layers RML (RML1 through RML3) in one pixel PX. FIGS. 17 through 19 are enlarged cross-sectional views of different optical layers RML1 through RML3 respectively disposed in subpixels SPXn (SPX1 through SPX3). FIG. 20 illustrates the planar arrangement of the optical layers RML1 through RML3 disposed in one pixel PX.

Referring to FIGS. 16 through 20, in the display device 10_6 according to the one or more embodiments, different optical layers RML1 through RML3 may be disposed in the subpixels SPXn, respectively. A thickness of each of the optical layers RML1 through RML3 may vary according to the wavelength of light emitted from a corresponding subpixel SPXn. In one or more embodiments in which the first subpixel SPX1, the second subpixel SPX2 and the third subpixel SPX3 emit light in different wavelength bands, the optical layers RML1 through RML3 having different thicknesses according to the wavelengths of the light may be disposed in the subpixels SPXn (SPX1 through SPX3), respectively.

For example, the optical layers RML1 through RML3 may include the first optical layer RML1 disposed in the first subpixel SPX1 emitting red light of a first color, the second optical layer RML2 disposed in the second subpixel SPX2 emitting green light of a second color, and the third optical layer RML3 disposed in the third subpixel SPX3 emitting blue light of a third color. Each of the first through third optical layers RML1 through RML3 may include a plurality of pair layers P1 through P3, each including a first layer L1 and a second layer L2. In the drawings, each of the first through third optical layers RML1 through RML3 includes three pair layers P1 through P3, and the first layer L1 is a lower layer, and the second layer L2 is an upper layer. However, the present disclosure is not limited thereto.

In the second optical layer RML2, thicknesses of a first layer L1_2 and a second layer L2_2 may vary according to the wavelength band of the green light of the second color. The second optical layer RML2 may have the same structure as that of the embodiment of FIG. 10. The first layer L1_2 of the second optical layer RML2 may have a first thickness TH1_2 of 830 to 1050 Å (or 83 to 105 nm), and the second layer L2_2 may have a second thickness TH2_2 of 700 to 880 Å (or 70 to 88 nm). In one or more embodiments in which the second optical layer RML2 includes three pair layers P1_2 through P3_2, a third thickness TH3_2 of the second optical layer RML2 may be 4500 Å (or 450 nm) or more.

In the first optical layer RML1, thicknesses of a first layer L1_1 and a second layer L2_1 may vary according to the wavelength band of the red light of the first color. The red light of the first color may have a longer central wavelength band than the green light of the second color, and the first optical layer RML1 may be thicker than the second optical layer RML2. For example, the first layer L1_1 of the first optical layer RML1 may have a first thickness TH1_1 of 1010 to 1100 Å (or 101 to 110 nm), and the second layer L2_1 may have a second thickness TH2_1 of 850 to 920 Å (or 85 to 92 nm). In one or more embodiments in which the first optical layer RML1 includes three pair layers P1_1 through P3_1, a third thickness TH3_1 of the first optical layer RML1 may be 5500 Å (or 550 nm) or more.

In the third optical layer RML3, thicknesses of a first layer L1_3 and a second layer L2_3 may vary according to the wavelength band of the blue light of the third color. The blue light of the third color may have a shorter central wavelength band than the green light of the second color, and the third optical layer RML3 may be thinner than the second optical layer RML2. For example, the first layer L1_3 of the third optical layer RML3 may have a first thickness TH1_3 of 730 to 770 Å (or 73 to 77 nm), and the second layer L2_3 may have a second thickness TH2_3 of 610 to 640 Å (or 61 to 64 nm). In one or more embodiments in which the third optical layer RML3 includes three pair layers P1_3 through P3_3, a third thickness TH3_3 of the third optical layer RML3 may be 4000 Å (or 400 nm) or more. However, the present disclosure is not limited thereto. The thicknesses of the first layer L1 and the second layer L2 of each of the optical layers RML1 through RML3 may vary according to the wavelength band of light emitted from a corresponding subpixel SPXn.

Unlike in the embodiment of FIGS. 4 through 11, the optical layers RML1 through RML3 may be patterned to correspond to the subpixels SPXn. The first optical layer RML1 may be disposed in the first subpixel SPX1 and may overlap an emission area EMA of the first subpixel SPX1. The second optical layer RML2 may be disposed in the second subpixel SPX2 and may overlap the emission area EMA of the second subpixel SPX2. The third optical layer RML3 may be disposed in the third subpixel SPX3 and may overlap the emission area EMA of the third subpixel SPX3. The different optical layers RML1 through RML3 may partially overlap a bank layer BNL and may be spaced from each other at a boundary between the subpixels SPXn. The first optical layer RML1, the second optical layer RML2, and the third optical layer RML3 may be spaced and alternately disposed along the second direction DR2 in a display area DPA. A plurality of first optical layers RML1, a plurality of second optical layers RML2, and a plurality of third optical layers RML3 may be spaced from each other in the first direction DR1.

The display device 10_6 may include the optical layers RML1 through RML3 that have different thicknesses and are disposed to respectively correspond to the subpixels SPXn emitting different light. Accordingly, the upward light output efficiency of the display device 10_6 can be further improved.

Figure 21:
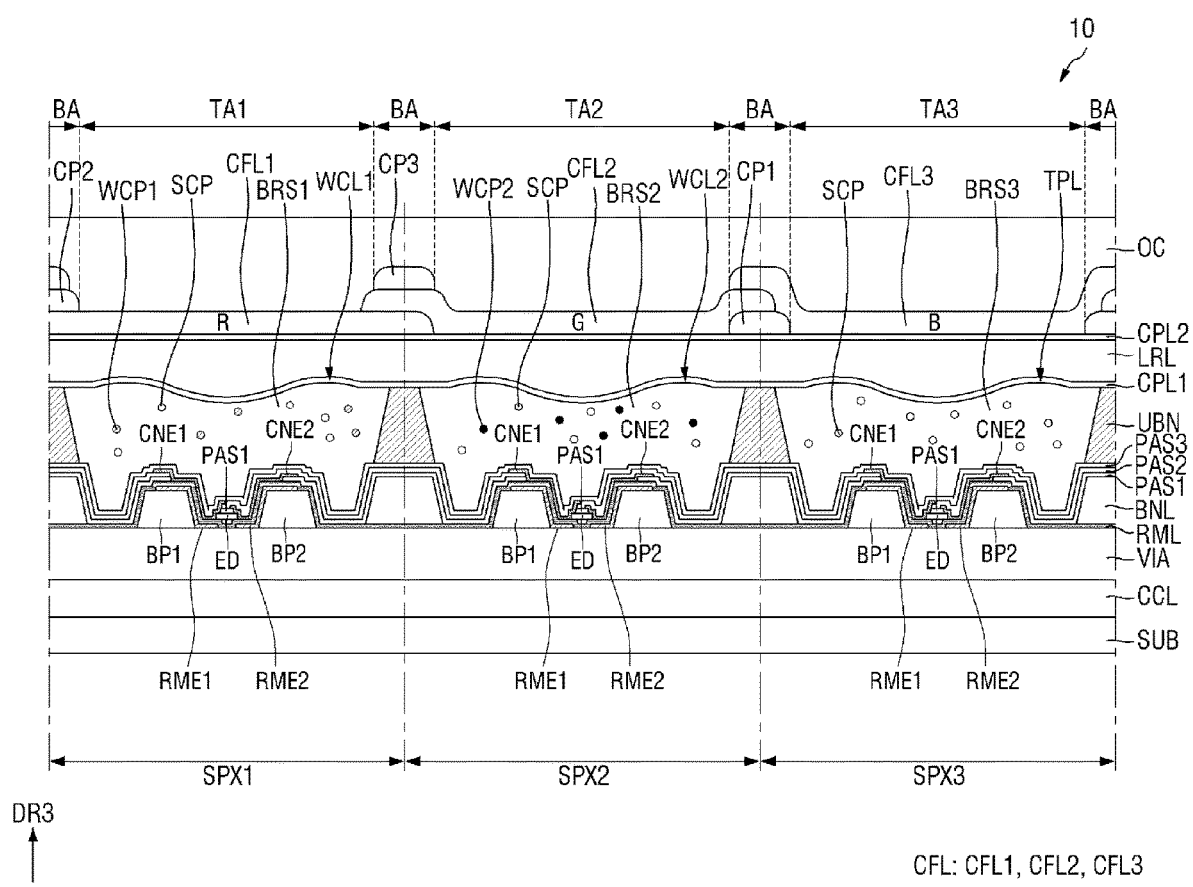
FIG. 21 is a cross-sectional view of a part of a display device according to one or more embodiments.

FIG. 21 is a cross-sectional view of a part of a display device 10 according to one or more embodiments.

Referring to FIG. 21, in the display device 10 according to one or more embodiments, a light blocking member BM may be omitted, and a plurality of color patterns CP1 through CP3 may be disposed. The current embodiment is different from the embodiment of FIG. 8 in that the light blocking member BM is replaced with the color patterns CP1 through CP3.

The color patterns CP1 through CP3 may be formed in substantially the same grid pattern as the light blocking member BM of FIG. 8. However, the color patterns CP1 through CP3 may include the same material as color filter layers CFL1 through CFL3 and may be integrally formed with the color filter layers CFL1 through CFL3. The different color patterns CP1 through CP3 may be stacked on each other in a light blocking area BA, and transmission of light may be blocked in the area where they are stacked.

A first color pattern CP1 may include the same material as a first color filter layer CFL1 and may be disposed in the light blocking area BA. The first color pattern CP1 may be directly disposed on a second capping layer CPL2 in the light blocking area BA and may be integrated with the first color filter layer CFL1 in the light blocking area BA adjacent to a first light transmitting area TA1 of a first subpixel SPX1.

A second color pattern CP2 may include the same material as a second color filter layer CFL2 and may be disposed in the light blocking area BA. The second color pattern CP2 may be directly disposed on the first color pattern CP1 in the light blocking area BA and may be integrated with the second color filter layer CFL2 in the light blocking area BA adjacent to a second light transmitting area TA2 of a second subpixel SPX2. Similarly, a third color pattern CP3 may include the same material as a third color filter layer CFL3 and may be disposed in the light blocking area BA. The third color pattern CP3 may be directly disposed on the second color pattern CP2 in the light blocking area BA and may be integrated with the third color filter layer CFL3 in the light blocking area BA adjacent to a third light transmitting area TA3 of a third subpixel SPX3.

In the display device 10 according to the current embodiment, the color patterns CP1 through CP3 are stacked and perform the same role as the light blocking member BM. Therefore, it is possible to prevent color mixing between neighboring areas due to materials including different colorants. In addition, because the color patterns CP1 through CP3 include the same material as the color filter layers CFL1 through CFL3, external light or reflected light passing through the light blocking area BA may have a wavelength band of a specific color. The eye color sensibility that a user's eyes perceive varies depending on the color of light. In particular, light in a blue wavelength band may be perceived less sensitively by a user than light in a green wavelength band and light in a red wavelength band. The color patterns CP1 through CP3 replacing the light blocking member BM in the light blocking area BA may block transmission of light, cause a user to perceive reflected light relatively less sensitively, and reduce reflected light due to external light by absorbing some of the light introduced from the outside of the display device 10.

Figure 22:
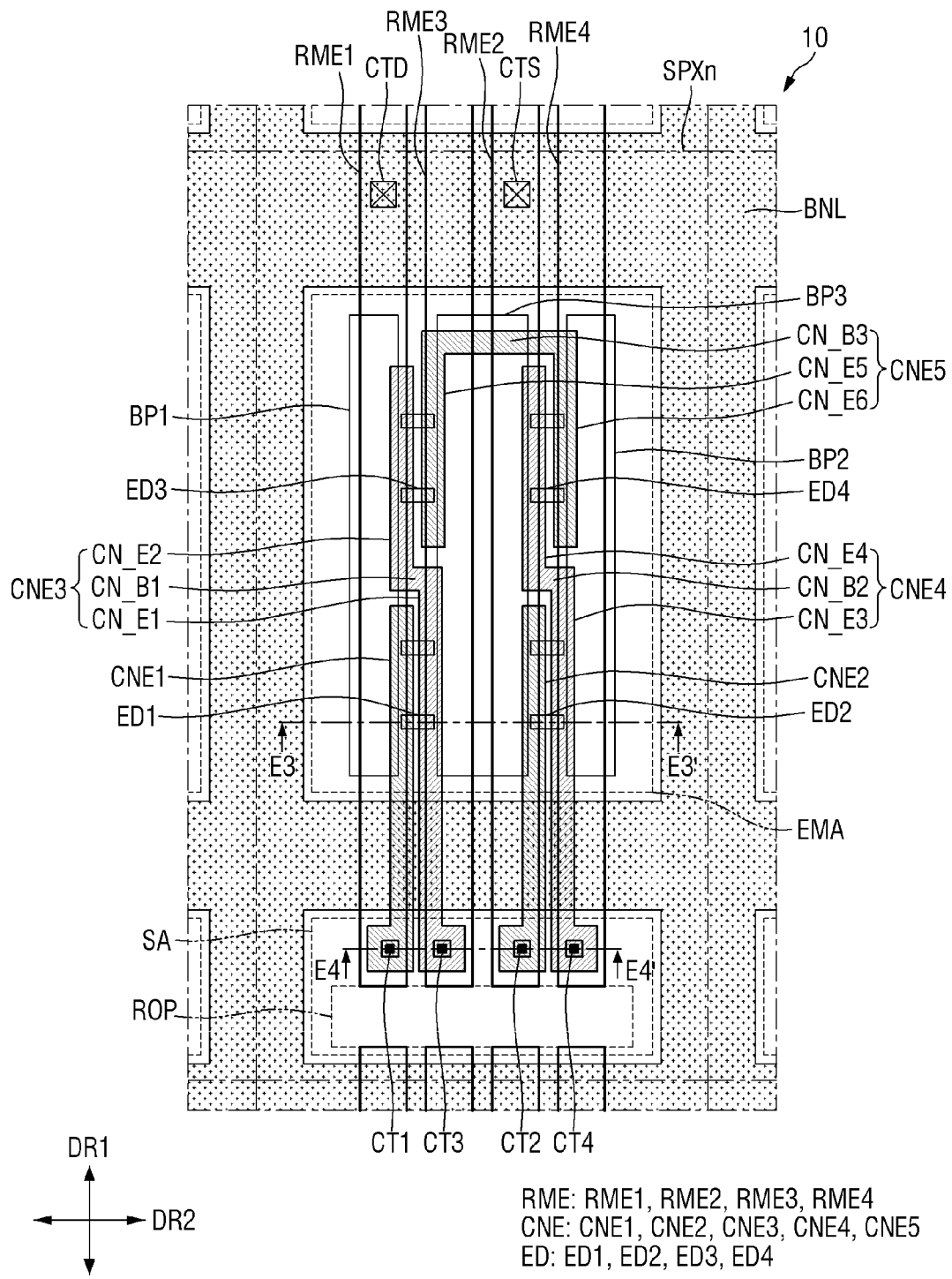
FIG. 22 is a plan view of a subpixel of a display device according to one or more embodiments.
Figure 23:
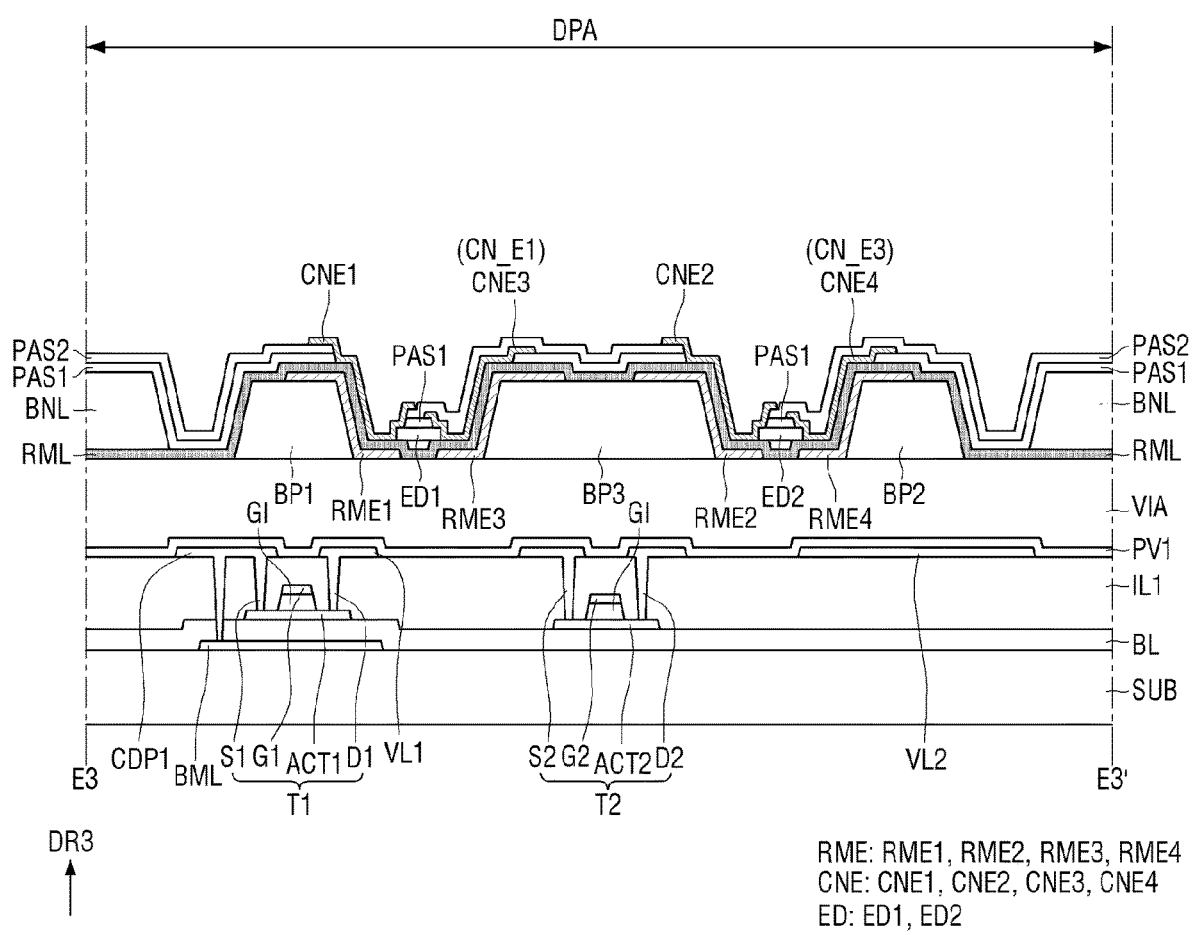
FIG. 23 is a cross-sectional view taken along the line E3-E3' of FIG. 22.
Figure 24:
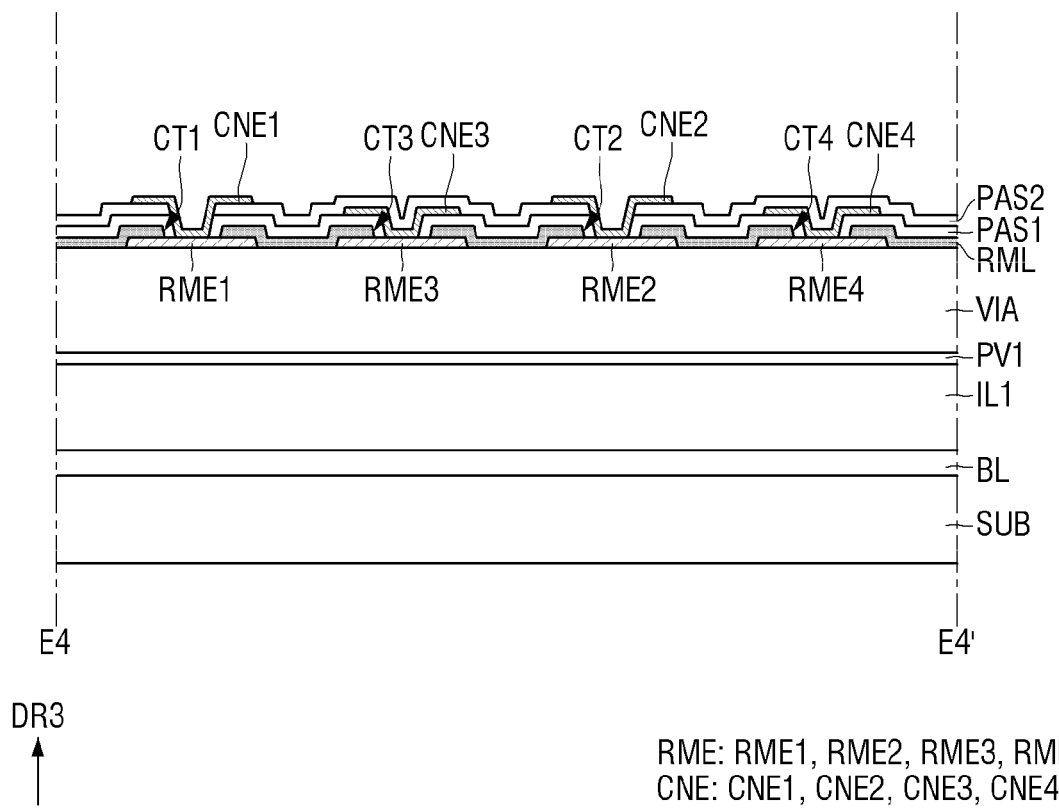
FIG. 24 is a cross-sectional view taken along the line E4-E4' of FIG. 22.

FIG. 22 is a plan view of a subpixel SPXn of a display device 10 according to one or more embodiments. FIG. 23 is a cross-sectional view taken along the line E3-E3' of FIG. 22. FIG. 24 is a cross-sectional view taken along line E4-E4' of FIG. 22. FIG. 22 illustrates the planar arrangement of electrodes RME (RME1 through RME4), bank patterns BP1 through BP3, a bank layer BNL, a plurality of light emitting elements ED, and connection electrodes CNE (CNE1 through CNE5) disposed in a pixel PX of the display device 10. FIG. 23 illustrates a cross section across both ends of the light emitting elements ED (ED1 through ED4) disposed on different electrodes RME, and FIG. 24 illustrates a cross section across a plurality of contact parts CT1 through CT4.

Referring to FIGS. 22 through 24, the display device 10 according to one or more embodiments may include a greater number of the electrodes RME (RME1 through RME4), the bank patterns BP1 through BP3, the light emitting elements ED (ED1 through ED4), and the connection electrodes CNE (CNE1 through CNE5). The display device 10 according to the current embodiment is different from that of the embodiment of FIG. 4 in that it includes a greater number of electrodes and light emitting elements in each subpixel SPXn. Therefore, any redundant description will be omitted, and differences will be mainly described below.

The bank patterns BP1 through BP3 may further include a third bank pattern BP3 disposed between a first bank pattern BP1 and a second bank pattern BP2. The first bank pattern BP1 may be disposed on a left side of the center of an emission area EMA, the second bank pattern BP2 may be disposed on a right side of the center of the emission area EMA, and the third bank pattern BP3 may be disposed in the center of the emission area EMA. A width of the third bank pattern BP3 measured in the second direction DR2 may be greater than those of the first bank pattern BP1 and the second bank pattern BP2. A distance between the bank patterns BP1 through BP3 in the second direction DR2 may be greater than a distance between the electrodes RME. The first bank pattern BP1 may partially overlap a first electrode RME1, and the second bank pattern BP2 may partially overlap a fourth electrode RME4. The third bank pattern BP3 may partially overlap a second electrode RME2 and a third electrode RME3. At least a part of each electrode RME may not overlap the bank patterns BP1 through BP3.

A plurality of electrodes RME disposed in each subpixel SPXn may include the third electrode RME3 and the fourth electrode RME4 in addition to the first electrode RME1 and the second electrode RME2.

The third electrode RME3 may be disposed between the first electrode RME1 and the second electrode RME2, and the fourth electrode RME4 may be spaced from the third electrode RME3 in the second direction DR2 with the second electrode RME2 interposed between them. The electrodes RME may be sequentially disposed in the order of the first electrode RME1, the third electrode RME3, the second electrode RME2, and the fourth electrode RME4 from the left to the right of each subpixel SPXn. The electrodes RME may be spaced to face (or oppose) each other in the second direction DR2. The electrodes RME may be spaced from the electrodes RME of another adjacent subpixel SPXn in the first direction DR1 in a separation part ROP of a sub-area SA.

The first electrode RME1 and the second electrode RME2 among the electrodes RME may respectively contact a first conductive pattern CDP1 and a second voltage line VL2 thereunder through electrode contact holes CTD and CTS disposed under the bank layer BNL, but the third electrode RME3 and the fourth electrode RME4 may not.

An optical layer RML may be disposed in a structure similar to those of the above-described embodiments. The optical layer RML may be entirely disposed in a display area DPA and may cover the electrodes RME and the bank patterns BP1 through BP3.

A plurality of light emitting elements ED may be disposed between the bank patterns BP1 through BP3 or may be disposed on different electrodes RME. Some of the light emitting elements ED may be disposed between the first bank pattern BP1 and the third bank pattern BP3, and the others may be disposed between the third bank pattern BP3 and the second bank pattern BP2. According to one or more embodiments, the light emitting elements ED may include first light emitting elements ED1 and third light emitting elements ED3 disposed between the first bank pattern BP1 and the third bank pattern BP3 and second light emitting elements ED2 and fourth light emitting elements ED4 disposed between the third bank pattern BP3 and the second bank pattern BP2. Each of the first light emitting elements ED1 and the third light emitting elements ED3 may be disposed on the first electrode RME1 and the third electrode RME3, and each of the second light emitting elements ED2 and the fourth light emitting elements ED4 may be disposed on the second electrode RME2 and the fourth electrode RME4. The first light emitting elements ED1 and the second light emitting elements ED2 may be disposed in the emission area EMA of a corresponding subpixel SPXn to be adjacent to a lower side or the sub-area SA, and the third light emitting elements ED3 and the fourth light emitting elements ED4 may be disposed in the emission area EMA of the corresponding subpixel SPXn to be adjacent to an upper side.

However, the light emitting elements ED are not classified according to their position in the emission area EMA but may be classified according to their connection relationship with the connection electrodes CNE which will be described later. Both ends of each light emitting element ED may contact different connection electrodes CNE according to the arrangement structure of the connection electrodes CNE, and the light emitting elements ED may be classified into different light emitting elements ED according to types of the connection electrodes CNE that they contact.

A plurality of connection electrodes CNE may include a third connection electrode CNE3, a fourth connection electrode CNE4, and a fifth connection electrode CNE5 disposed across a plurality of electrodes RME in addition to a first connection electrode CNE1 disposed on the first electrode RME1 and a second connection electrode CNE2 disposed on the second electrode RME2.

Unlike in the embodiment of FIGS. 4 through 6, each of the first connection electrode CNE1 and the second connection electrode CNE2 may have a relatively short length in the first direction DR1. The first connection electrode CNE1 and the second connection electrode CNE2 may be disposed below the center of the emission area EMA in the first direction DR1. The first connection electrode CNE1 and the second connection electrode CNE2 may be disposed over the emission area EMA and the sub-area SA of a corresponding subpixel SPXn and may directly contact the electrodes RME through the contact parts CT1 and CT2 formed in the sub-area SA, respectively. The first connection electrode CNE1 may directly contact the first electrode RME1 through a first contact part CT1 penetrating the optical layer RML, a first insulating layer PAS1 and a second insulating layer PAS2 in the sub-area SA, and the second connection electrode CNE2 may contact the second electrode RME2 through a second contact part CT2 penetrating the optical layer RML, the first insulating layer PAS1 and the second insulating layer PAS2 in the sub-area SA.

The third connection electrode CNE3 may include a first extension part CN_E1 disposed on the third electrode RME3, a second extension part CN_E2 disposed on the first electrode RME1, and a first connection part CN_B1 connecting the first extension part CN_E1 and the second extension part CN_E2. The first extension part CN_E1 may be spaced from the first connection electrode CNE1 in the second direction DR2 to face (or oppose) the first connection electrode CNE1, and the second extension part CN_E2 may be spaced from the first connection electrode CNE1 in the first direction DR1. The first extension part CN_E1 may be disposed on the lower side of the emission area EMA of a corresponding subpixel SPXn, and the second extension part CN_E2 may be disposed on the upper side of the emission area EMA. The first extension part CN_E1 and the second extension part CN_E2 may be disposed in the emission area EMA. The first connection part CN_B1 may be disposed across the first electrode RME1 and the third electrode RME3 in the center (or the central region) of the emission area EMA. The third connection electrode CNE3 may generally extend in the first direction DR1 but may be bent in the second direction DR2 and then may extend again in the first direction DR1.

The fourth connection electrode CNE4 may include a third extension part CN_E3 disposed on the fourth electrode RME4, a fourth extension part CN_E4 disposed on the second electrode RME2, and a second connection part CN_B2 connecting the third extension part CN_E3 and the fourth extension part CN_E4. The third extension part CN_E3 may be spaced from the second connection electrode CNE2 in the second direction DR2 to face (or oppose) the second connection electrode CNE2, and the fourth extension part CN_E4 may be spaced from the second connection electrode CNE2 in the first direction DR1. The third extension part CN_E3 may be disposed on the lower side of the emission area EMA of a corresponding subpixel SPXn, and the fourth extension part CN_E4 may be disposed on the upper side of the emission area EMA. The third extension part CN_E3 and the fourth extension part CN_E4 may be disposed in the emission area EMA. The second connection part CN_B2 may be disposed across the second electrode RME2 and the fourth electrode RME4 in an area adjacent to the center (or the central region) of the emission area EMA. The fourth connection electrode CNE4 may generally extend in the first direction DR1 but may be bent in the second direction DR2 and then may extend again in the first direction DR1.

The fifth connection electrode CNE5 may include a fifth extension part CN_E5 disposed on the third electrode RME3, a sixth extension part CN_E6 disposed on the fourth electrode RME4, and a third connection part CN_B3 connecting the fifth extension part CN_E5 and the sixth extension part CN_E6. The fifth extension part CN_E5 may be spaced from the second extension part CN_E2 of the third connection electrode CNE3 in the second direction DR2 to face the second extension part CN_E2, and the sixth extension part CN_E6 may be spaced from the fourth extension part CN_E4 of the fourth connection electrode CNE4 in the second direction DR2 to face (or oppose) the fourth extension part CN_E4. Each of the fifth extension part CN_E5 and the sixth extension part CN_E6 may be disposed on the upper side of the emission area EMA, and the third connection part CN_B3 may be disposed across the third electrode RME3, the second electrode RME2, and the fourth electrode RME4. The fifth connection electrode CNE5 may be around (e.g., may surround) the fourth extension part CN_E4 of the fourth connection electrode CNE4 in a plan view.

The third connection electrode CNE3 may directly contact the third electrode RME3 through a third contact part CT3 penetrating the optical layer RML and the first insulating layer PAS1 in the sub-area SA, and the fourth connection electrode CNE4 may contact the fourth electrode RME4 through a fourth contact part CT4 penetrating the optical layer RML and the first insulating layer PAS1 in the sub-area SA.

However, the present disclosure is not limited thereto. In one or more embodiments, in the display device 10, some of the connection electrodes CNE may be directly connected to a third conductive layer. For example, each of the first connection electrode CNE1 and the second connection electrode CNE2 that are first type connection electrodes may be directly connected to the third conductive layer and may not be electrically connected to the electrodes RME. A second type connection electrode and a third type connection electrode may also not be electrically connected to the electrodes RME and may be connected only to the light emitting elements ED.

The first connection electrode CNE1 and the second connection electrode CNE2 may be first type connection electrodes connected to the electrodes RME1 and RME2 directly connected to the third conductive layer. The third connection electrode CNE3 and the fourth connection electrode CNE4 may be second type connection electrodes connected to the electrodes RME3 and RME4 that are not connected to the third conductive layer. The fifth connection electrode CNE5 may be a third type connection electrode not connected to the electrodes RME. The fifth connection electrode CNE5 may not be connected to the electrodes RME but may contact the light emitting elements ED and may form an electrical connection circuit of the light emitting elements ED together with other connection electrodes CNE.

The third connection electrode CNE3 and the fourth connection electrode CNE4 that are second type connection electrodes may be connection electrodes in which electrode extension parts extending in the first direction DR1 are not side by side with each other in the second direction DR2, and the fifth connection electrode CNE5 that is a third type connection electrode may be a connection electrode in which electrode extension parts extending in the first direction DR1 are side by side with each other in the second direction DR2. The third connection electrode CNE3 and the fourth connection electrode CNE4 may extend in the first direction DR1 but may be bent, and the fifth connection electrode CNE5 may be around (e.g., may surround) a part of another connection electrode.

In the above arrangement structure of the connection electrodes CNE, the light emitting elements ED may be classified into different light emitting elements ED according to the connection electrodes CNE that both ends thereof contact. Each of the first light emitting elements ED1 and the second light emitting elements ED2 may have a first end contacting a first type connection electrode and a second end contacting a second type connection electrode. The first light emitting elements ED1 may contact the first connection electrode CNE1 and the third connection electrode CNE3, and the second light emitting elements ED2 may contact the second connection electrode CNE2 and the fourth connection electrode CNE4. Each of the third light emitting elements ED3 and the fourth light emitting elements ED4 may have a first end contacting a second type connection electrode and a second end contacting a third type connection electrode. The third light emitting elements ED3 may contact the third connection electrode CNE3 and the fifth connection electrode CNE5, and the fourth light emitting elements ED4 may contact the fourth connection electrode CNE4 and the fifth connection electrode CNE5.

The light emitting elements ED may be connected to each other in series through the connection electrodes CNE. Because the display device 10 according to the current embodiment includes a greater number of the light emitting elements ED in each subpixel SPXn and forms a series connection of the light emitting elements ED, the amount of light emitted per unit area can be further increased.

Figure 25:
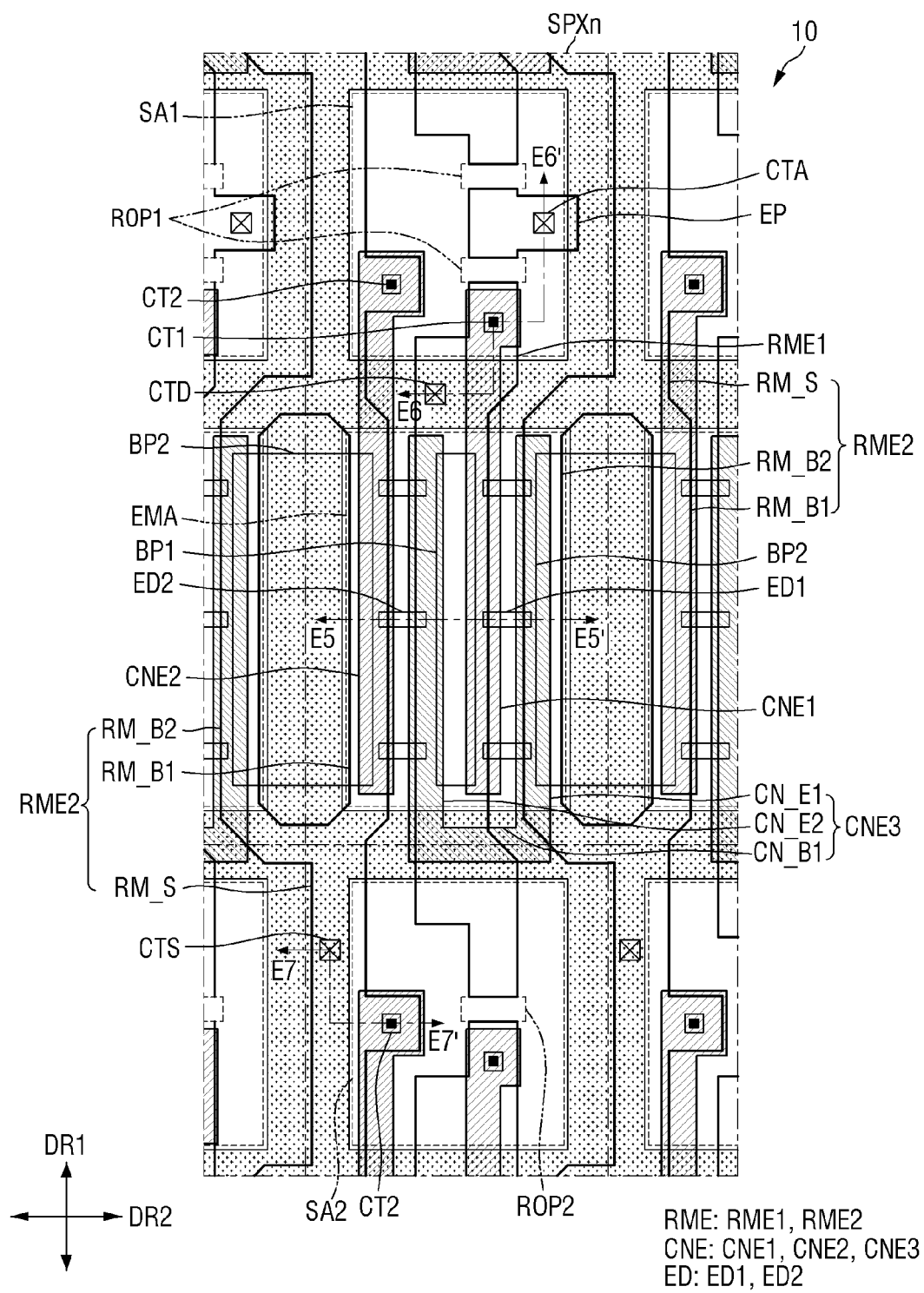
FIG. 25 is a plan view of a subpixel of a display device according to one or more embodiments.
Figure 26:
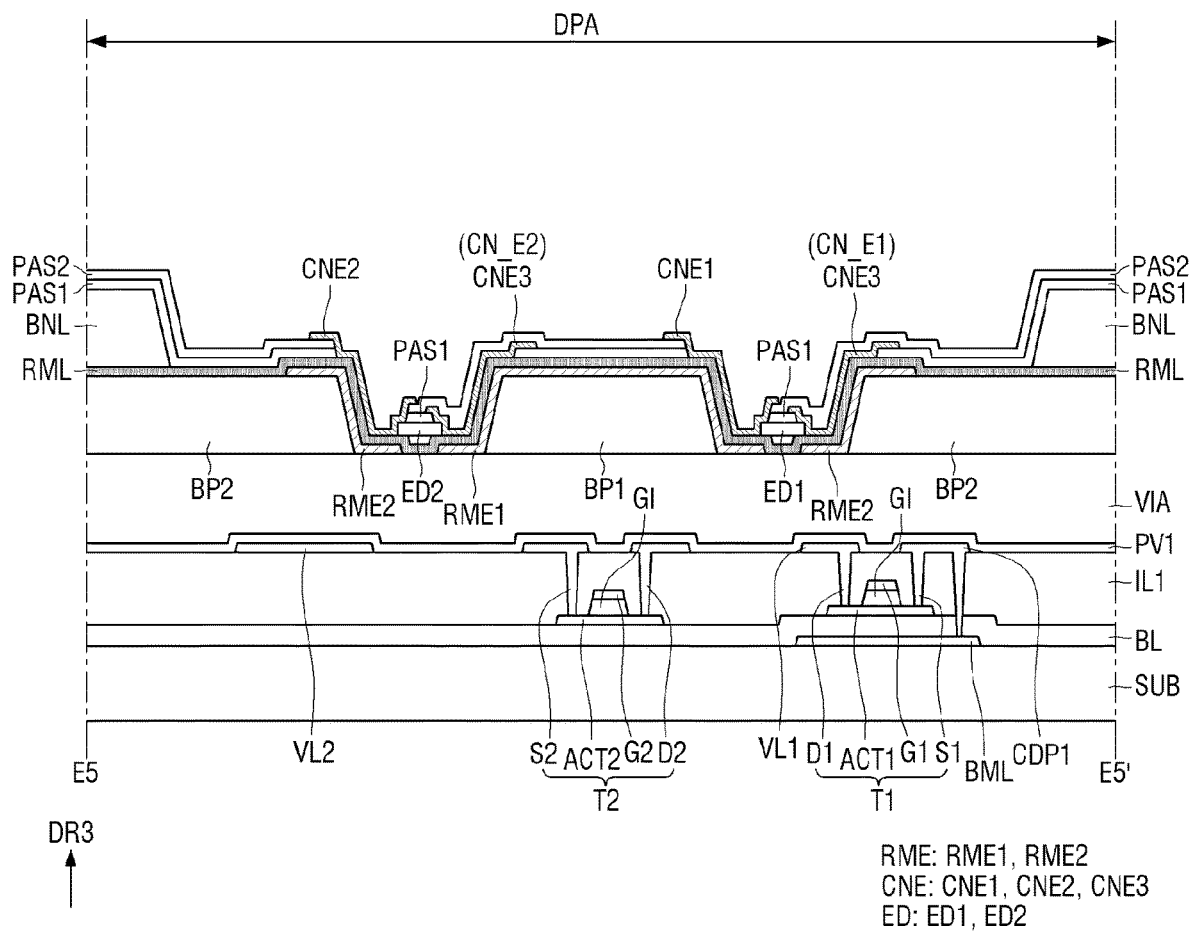
FIG. 26 is a cross-sectional view taken along the line E5-E5' of FIG. 25.
Figure 27:
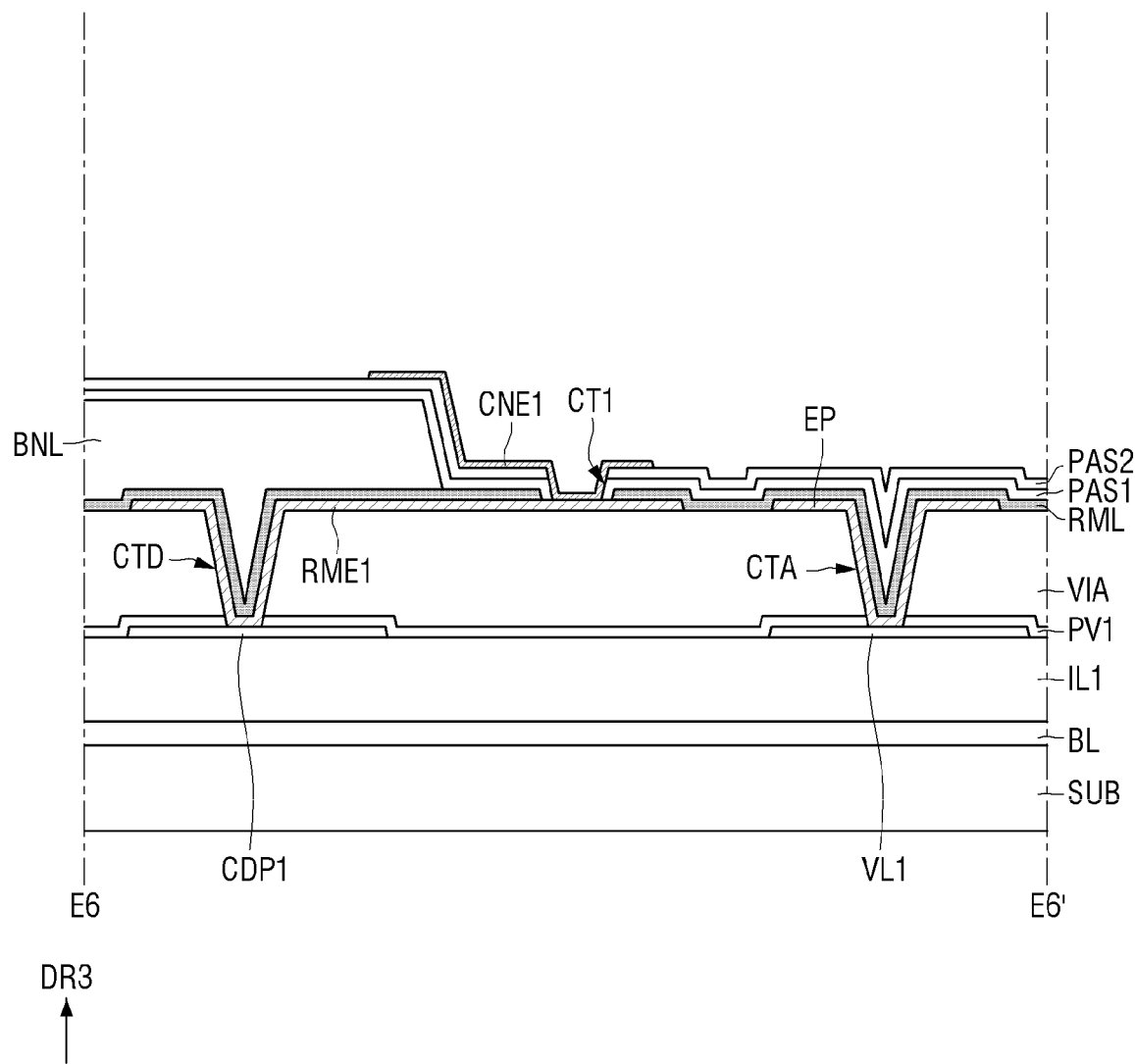
FIG. 27 is a cross-sectional view taken along the line E6-E6' of FIG. 25.
Figure 28:
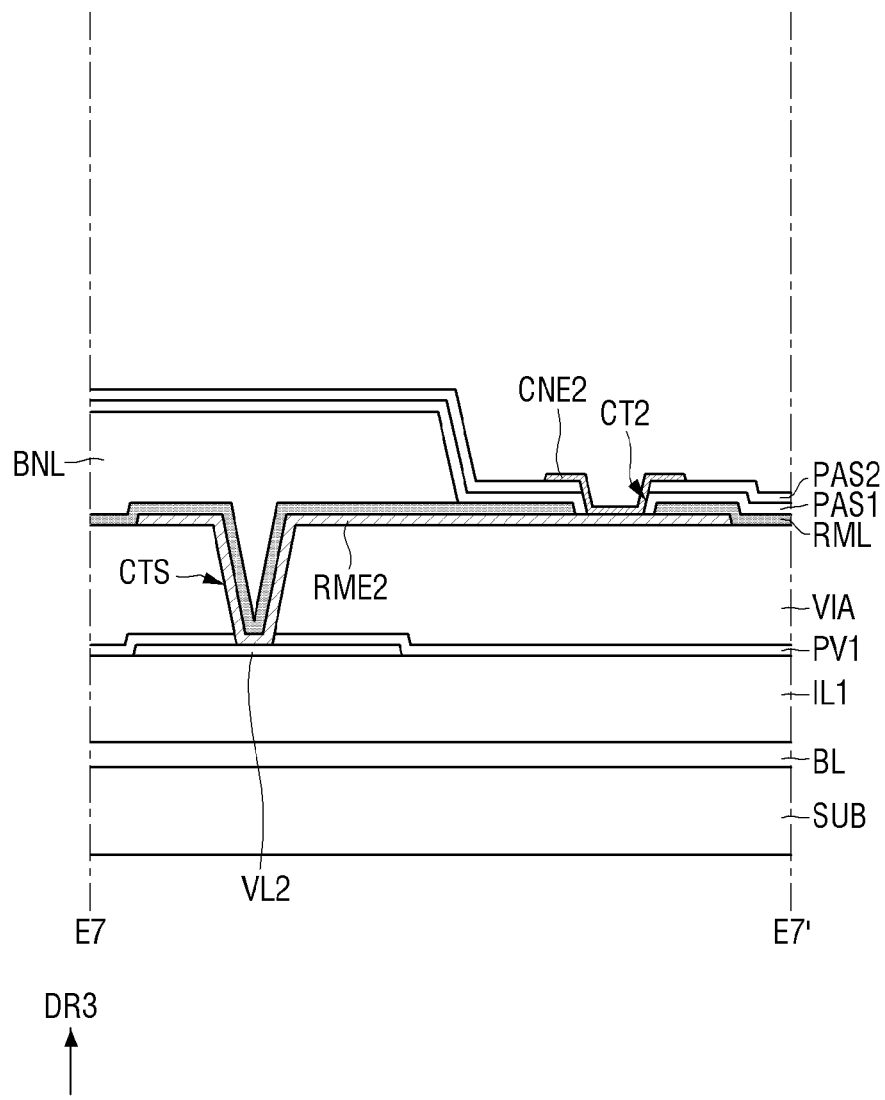
FIG. 28 is a cross-sectional view taken along the line E7-E7' of FIG. 25.

FIG. 25 is a plan view of a subpixel SPXn of a display device 10 according to one or more embodiments. FIG. 26 is a cross-sectional view taken along the line E5-E5' of FIG. 25. FIG. 27 is a cross-sectional view taken along the line E6-E6' of FIG. 25. FIG. 28 is a cross-sectional view taken along the line E7-E7' of FIG. 25.

FIG. 25 illustrates the planar arrangement of electrodes RME (RME1 and RME2), bank patterns BP1 and BP2, a bank layer BNL, a plurality of light emitting elements ED, and connection electrodes CNE (CNE1 through CNE3) disposed in a pixel PX of the display device 10. FIG. 26 illustrates a cross section across both ends of the light emitting elements ED (ED1 and ED2) disposed on different electrodes RME, and FIGS. 27 and 28 illustrate cross sections across a plurality of electrode contact holes CTD, CTS and CTA and a plurality of contact parts CT1 and CT2.

Referring to FIGS. 25 through 28, the display device 10 according to one or more embodiments may be different from those of the above-described embodiments in the structure of the electrodes RME, the connection electrodes CNE, and the bank patterns BP1 and BP2. Therefore, any redundant description already provided in the above embodiments will be omitted, and differences will be mainly described below.

A plurality of bank patterns BP1 and BP2 may extend in the first direction DR1 but may have different widths measured in the second direction DR2. Any one of the bank patterns BP1 and BP2 may be disposed over subpixels SPXn neighboring each other in the second direction DR2. For example, the bank patterns BP1 and BP2 may include a first bank pattern BP1 disposed in an emission area EMA of each subpixel SPXn and a second bank pattern BP2 disposed over the emission areas EMA of different subpixels SPXn in the second direction DR2.

The first bank pattern BP1 is disposed in the center of the emission area EMA, and the second banks BP2 are spaced from each other with the first bank pattern BP1 interposed between them. The first bank pattern BP1 and the second bank pattern BP2 may be alternately disposed along the second direction DR2. The light emitting elements ED may be disposed between the first bank pattern BP1 and the second bank pattern BP2 that are spaced from each other.

The first bank pattern BP1 and the second bank pattern BP2 may have the same length in the first direction DR1 but may have different widths measured in the second direction DR2. A part of the bank layer BNL that extends in the first direction DR1 may overlap the second bank pattern BP2 in the thickness direction (e.g., the third direction DR3). The first bank pattern BP1 may overlap a first electrode RME1, and the second bank pattern BP2 may overlap electrode branch parts RM_B1 and RM_B2 of a second electrode RME2 and the bank layer BNL. The bank patterns BP1 and BP2 may be disposed as island-shaped patterns in the entire display area DPA.

A plurality of electrodes RME include the first electrode RME1 disposed in the center of each subpixel SPXn and the second electrode RME2 disposed over different subpixels SPXn in the second direction DR2. The first electrode RME1 and the second electrode RME2 may generally extend in the first direction DR1, but parts of the first electrode RME1 and the second electrode RME2 that are disposed in the emission area EMA may have different shapes.

The first electrode RME1 may be disposed in the center of each subpixel SPXn, and a part disposed in the emission area EMA may be disposed on the first bank pattern BP1. The first electrode RME1 may extend in the first direction DR1 from a sub-area SA to the sub-area SA of another sub-pixel SPXn. A width of the first electrode RME1 measured in the second direction DR2 may vary according to position, and a part overlapping the first bank pattern BP1 at least in the emission area EMA may have a greater width than the first bank pattern BP1.

The second electrode RME2 may include a part extending in the first direction DR1 and parts branching in the vicinity of the emission area EMA. In one or more embodiments, the second electrode RME2 may include an electrode stem part RM_S extending in the first direction DR1 and a plurality of electrode branch parts RM_B1 and RM_B2 branching from the electrode stem part RM_S, bending in the second direction DR2, and then extending again in the first direction DR1. The electrode stem part RM_S may overlap a part of the bank layer BNL that extends in the first direction DR1 and may be disposed on a side of the sub-area SA in the second direction DR2. The electrode branch parts RM_B1 and RM_B2 may branch from the electrode stem part RM_S disposed in a part of the bank layer BNL that extends in the first direction DR1 and a part of the bank layer BNL that extends in the second direction DR2 and may be bent to both sides in the second direction DR2. The electrode branch parts RM_B1 and RM_B2 may extend across the emission area EMA in the first direction DR1 and then may be bent again to be integrally connected to the electrode stem part RM_S. That is, the electrode branch parts RM_B1 and RM_B2 of the second electrode RME2 may branch off on an upper side of the emission area EMA of any one subpixel SPXn and then may be connected to each other again on a lower side of the emission area EMA.

The second electrode RME2 may include a first electrode branch part RM_B1 disposed on a left side of the first electrode RME1 and a second electrode branch part RM_B2 disposed on a right side of the first electrode RME1. The electrode branch parts RM_B1 and RM_B2 included in one second electrode RME2 may be respectively disposed in the emission areas EMA of subpixels SPXn neighboring each other in the second direction DR2, and the electrode branch parts RM_B1 and RM_B2 of different second electrodes RME2 may be disposed in one subpixel SPXn. The first electrode branch part RM_B1 of the second electrode RME2 may be disposed on the left side of the first electrode RME1, and the second electrode branch part RM_B2 of another second electrode RME2 may be disposed on the right side of the first electrode RME1.

Each of the electrode branch parts RM_B1 and RM_B2 of the second electrode RME2 may overlap a side of the second bank pattern BP2. The first electrode branch part RM_B1 may partially overlap the second bank pattern BP2 disposed on a left side of the first bank pattern BP1, and the second electrode branch part RM_B2 may partially overlap the second bank pattern BP2 disposed on a right side of the first bank pattern BP1. Both sides of the first electrode RME1 may be spaced from different electrode branch parts RM_B1 and RM_B2 of different second electrodes RME2 to face (or oppose) them, and a distance between the first electrode RME1 and each of the electrode branch parts RM_B1 and RM_B2 may be smaller than a distance between different bank patterns BP1 and BP2.

A width of the first electrode RME1 measured in the second direction DR2 may be greater than widths of the electrode stem part RM_S and the electrode branch parts RM_B1 and RM_B2 of the second electrode RME2. The first electrode RME1 may have a greater width than the first bank pattern BP1 to overlap both sides of the first bank pattern BP1, but the second electrode RME2 may have a relatively small width so that each of the electrode branch parts RM_B1 and RM_B2 overlaps only one side of the second bank pattern BP2.

The first electrode RME1 may contact a first conductive pattern CDP of a third conductive layer through a first electrode contact hole CTD in a part overlapping a part of the bank layer BNL that extends in the second direction DR2. The second electrode RME2 may contact a second voltage line VL2 of the third conductive layer through a second electrode contact hole CTS in the electrode stem part RM_S. A part of the first electrode RME1 that is disposed in the sub-area SA may overlap a first contact part CT1. The second electrode RME2 may include a part protruding from the electrode stem part RM_S in the second direction DR2 to lie in the sub-area SA and may overlap a second contact part CT2 in the protruding part.

The first electrode RME1 among the first electrode RME1 and the second electrode RME2 may be disposed up to separation parts ROP1 and ROP2 of the sub-areas SA, but the second electrode RME2 may not be separated in the sub-areas SA. One second electrode RME2 may include a plurality of electrode stem parts RM_S and a plurality of electrode branch parts RM_B1 and RM_B2 to extend in the first direction DR1 and may branch in the vicinity of the emission area EMA of each subpixel SPXn. The first electrode RME1 may be disposed between the separation parts ROP1 and ROP2 disposed in different sub-areas SA1 and SA2 of each subpixel SPXn and may be disposed across the emission area EMA.

According to one or more embodiments, the display device 10 may include a wiring connection electrode EP disposed in a first sub-area SA1 among a plurality of sub-areas SA1 and SA2 of each subpixel SPXn and disposed between the first electrodes RME1 of different subpixels SPXn. The wiring connection electrode EP may not be disposed in a second sub-area SA2 of each subpixel SPXn, and the first electrodes RME1 of different subpixels SPXn adjacent to each other in the first direction DR1 may be spaced from each other in the second sub-area SA2. In the subpixel SPXn illustrated in FIG. 25 among a plurality of subpixels SPXn, the first sub-area SA1 in which the wiring connection electrode EP is disposed may be disposed above the emission area EMA, and the second sub-area SA2 may be disposed below the emission area EMA. On the other hand, in a subpixel SPXn adjacent to the subpixel SPXn of FIG. 25 in the first direction DR1, the first sub-area SA1 in which the wiring connection electrode EP is disposed may be disposed below the emission area EMA, and the second sub-area SA2 may be disposed above the emission area EMA.

The first electrode RME1 may be spaced from the wiring connection electrode EP with a first separation part ROP1 interposed between them in the first sub-area SA1. Two first separation parts ROP1 may be disposed in one first sub-area SA1. The wiring connection electrode EP may be spaced from the first electrode RME1 disposed in a corresponding subpixel SPXn with a lower first separation part ROP1 interposed between them and may be spaced from the first electrode RME1 disposed in another subpixel SPXn with an upper first separation part ROP interposed between them. In the second sub-area SA2, one second separation part ROP2 may be disposed, and different first electrodes RME1 may be spaced from each other in the first direction DR1.

In one or more embodiments, the wiring connection electrode EP may be connected to a first voltage line VL1 of the third conductive layer through a third electrode contact hole CTA penetrating a via layer VIA. The first electrode RME1 may be formed to be connected to the wiring connection electrode EP, and an electrical signal transmitted to place the light emitting elements ED may be transmitted from the first voltage line VL1 to the first electrode RME1 through the wiring connection electrode EP. In the process of placing the light emitting elements ED, signals may be transmitted to the first voltage line VL1 and the second voltage line VL2 and then may be delivered to the first electrode RME1 and the second electrode RME2, respectively.

The relative position of the second electrode contact hole CTS may be different from that of the third electrode contact hole CTA to be described later. The second electrode contact hole CTS may be disposed in a part of the bank layer BNL that is around (e.g. surrounds) the second sub-area SA2, and the third electrode contact hole CTA may be disposed in the first sub-area SA1. That is, because the second electrode contact hole CTS and the third electrode contact hole CTA expose upper surfaces of different voltage lines VL1 and VL2, respectively, the position of each of the second electrode contact hole CTS and the third electrode contact hole CTA may be determined accordingly.

The bank layer BNL may be around (e.g., may surround) the emission area EMA and the sub-areas SA1 and SA2 as in the above-described embodiments. However, in one or more embodiments in which the display device 10 includes the sub-areas SA1 and SA2 separated from each other, the areas surrounded by the bank layer BNL may be separated from each other. The bank layer BNL is the same as those of the above-described embodiments except that it surrounds different sub-areas SA1 and SA2.

A plurality of light emitting elements ED may be disposed on different electrodes RME between different bank patterns BP1 and BP2. The light emitting elements ED may include first light emitting elements ED1 having both ends disposed on the first electrode RME1 and the second electrode branch part RM_B2 of the second electrode RME2 and second light emitting elements ED2 having both ends disposed on the first electrode RME1 and the first electrode branch part RM_B1 of another second electrode RME2. The first light emitting elements ED1 may be disposed on the right side of the first electrode RME1, and the second light emitting elements ED2 may be disposed on the left side of the first electrode RME1. The first light emitting elements ED1 may be disposed on the first electrode RME1 and the second electrode RME2, and the second light emitting elements ED2 may be disposed on the first electrode RME1 and the second electrode RME2.

A plurality of connection electrodes CNE (CNE1 through CNE3) may include a first connection electrode CNE1, a second connection electrode CNE2, and a third connection electrode CNE3.

The first connection electrode CNE1 may extend in the first direction DR1 and may be disposed on the first electrode RME1. A part of the first connection electrode CNE1 that is disposed on the first bank pattern BP1 may overlap the first electrode RME1 and may extend in the first direction DR1 to the first sub-area SA1 located above the emission area EMA beyond the bank layer BNL. The first connection electrode CNE1 may contact the first electrode RME1 through the first contact part CT1 in the first sub-area SA1.

The second connection electrode CNE2 may extend in the first direction DR1 and may be disposed on the second electrode RME2. A part of the second connection electrode CNE2 that is disposed on the second bank pattern BP2 may overlap the second electrode RME2 and may extend in the first direction DR1 to the first sub-area SA1 located above the emission area EMA beyond the bank layer BNL. The second connection electrode CNE2 may contact the second electrode RME2 through the second contact part CT2 in the first sub-area SA1.

In a subpixel SPXn adjacent to the subpixel SPXn of FIG. 25 in the first direction DR1, the first connection electrode CNE1 and the second connection electrode CNE2 may respectively contact the first electrode RME1 and the second electrode RME2 through the contact parts CT1 and CT2 disposed in the first and second sub-areas SA1 and SA2.

The third connection electrode CNE3 may include extension parts CN_E1 and CN_E2 extending in the first direction DR1 and a first connection part CN_B1 connecting the extension parts CN_E1 and CN_E2. A first extension part CN_E1 faces (or opposes) the first connection electrode CNE1 in the emission area EMA and is disposed on the second electrode branch part RM_B2 of the second electrode RME2. A second extension part CN_E2 faces (or opposes) the second connection electrode CNE2 in the emission area EMA and is disposed on the first electrode RME1. The first connection part CN_B1 may extend in the second direction DR2 on the bank layer BNL disposed below the emission area EMA and may connect the first extension part CN_E1 and the second extension part CN_E2. The third connection electrode CNE3 may be disposed in the emission area EMA and on the bank layer BNL and may not be directly connected to the electrodes RME. The second electrode branch part RM_B2 disposed under the first extension part CN_E1 may be electrically connected to the second voltage line VL2, but a second power supply voltage applied to the second electrode branch part RM_B2 may not be transmitted to the third connection electrode CNE3.

A display device according to one or more embodiments includes an optical layer disposed under a light emitting element and a wavelength conversion layer. The optical layer may have a structure in which layers including different materials and thus having different refractive indices and thicknesses are alternately stacked and may reflect incident light. The display device including the optical layer may have improved upward light output efficiency and may reduce loss of light emitted downward.

In concluding the detailed description, those skilled in the art will appreciate that many variations and modifications can be made to the embodiments without substantially departing from the scope and principles of the present disclosure. Therefore, the embodiments of the present disclosure are used in a generic and descriptive sense only and not for purposes of limitation.

What is claimed is:

1. A display device comprising:
a first electrode on a substrate;
a second electrode spaced from the first electrode in a second direction;
an optical layer on the first electrode and the second electrode, the optical layer comprising a first layer and a second layer, the second layer comprising a different material and having a different thickness from the first layer; and
a plurality of light emitting elements on the optical layer, the first electrode, and the second electrode,
wherein the optical layer comprises a plurality of pair layers, each of the plurality of pair layers comprising the first layer and the second layer, and
wherein the first layer and the second layer are alternately stacked, and
wherein the optical layer extends continuously from the first electrode to the second electrode and overlaps a light emitting element of the plurality of light emitting elements located between the first electrode and the second electrode.

2. The display device of claim 1, wherein the first layer comprises silicon oxide, the second layer comprises silicon nitride, and a thickness of the first layer is greater than a thickness of the second layer.

3. The display device of claim 2, wherein the plurality of light emitting elements is configured to emit first light having a central wavelength band of 400 to 460 nm,
wherein the thickness of the first layer is in a range of 83 to 105 nm, and
wherein the thickness of the second layer is in a range of 70 to 88 nm.

4. The display device of claim 1, wherein the optical layer comprises a first pair layer, a second pair layer on the first pair layer, and a third pair layer on the second pair layer, and
wherein a thickness of the optical layer is 450 nm or more.

5. The display device of claim 4, wherein the first layer of the first pair layer is directly located on the first electrode and the second electrode, and
wherein the first layer of the second pair layer and the first layer of the third pair layer are located on the second layer of the first pair layer and the second layer of the second pair layer, respectively.

6. The display device of claim 4, wherein the second layer of the first pair layer is directly located on the first electrode and the second electrode, and
wherein the second layer of the second pair layer and the second layer of the third pair layer are located on the first layer of the first pair layer and the first layer of the second pair layer, respectively.

7. The display device of claim 4, wherein the optical layer further comprises a fourth pair layer on the third pair layer, and
wherein the thickness of the optical layer is 600 nm or more.

8. The display device of claim 1, wherein each of the first layer and the second layer comprises one of silicon oxide, silicon nitride, or titanium oxide.

9. The display device of claim 1, further comprising:
a first bank pattern located between the substrate and the first electrode;
a second bank pattern located between the substrate and the second electrode; and
a bank layer on the optical layer and surrounding an area in which the plurality of light emitting elements is disposed.

10. The display device of claim 9, comprising:
an upper bank layer on the bank layer; and
a wavelength conversion layer on the plurality of light emitting elements in an area surrounded by the upper bank layer and configured to convert a first light emitted from the plurality of light emitting elements into a second light.

11. The display device of claim 10, wherein the first light has a central wavelength band of 400 to 460 nm, and
wherein the second light has a central wavelength band of 500 to 630 nm.

12. The display device of claim 1, comprising:
a first connection electrode on the first electrode and contacting first ends of the plurality of light emitting elements; and
a second connection electrode on the second electrode and contacting second ends of the plurality of light emitting elements.

13. The display device of claim 12, comprising:
a first insulating layer on the plurality of light emitting elements; and
a second insulating layer on the first insulating layer,
wherein the second connection electrode is located between the first insulating layer and the second insulating layer, and
wherein the first connection electrode is on the second insulating layer.

14. A display device comprising:
a first substrate comprising a display area and a non-display area around the display area;
a plurality of subpixels in the display area and comprising a plurality of light emitting elements;
a bank layer surrounding the subpixels in the display area;

an upper bank layer on the bank layer;
a plurality of wavelength conversion layers and a light transmitting layer on the plurality of light emitting elements of the subpixels and located in areas surrounded by the upper bank layer; and
a plurality of color filter layers on the plurality of wavelength conversion layers and the light transmitting layer,
wherein each of the plurality of subpixels further comprises:
a first electrode on the first substrate;
a second electrode spaced from the first electrode in a second direction;
an optical layer on the first electrode and the second electrode, the optical layer comprising a first layer and a second layer having a different refractive index from the first layer,
wherein the plurality of light emitting elements is located on the optical layer, the first electrode, and the second electrode,
wherein the optical layer comprises a plurality of pair layers, each of the plurality of pair layers comprising the first layer and the second layer,
wherein the first layer and the second layer are alternately stacked, and
wherein the optical layer extends continuously from the first electrode to the second electrode and overlaps a light emitting element of the plurality of light emitting elements located between the first electrode and the second electrode.

15. The display device of claim 14, wherein the plurality of subpixels comprises a first subpixel to emit a first color light and a second subpixel to emit a second color light that is different from the first color light,
wherein the plurality of light emitting elements is configured to emit a third color light that is different from the first color light and the second color light, and
wherein the optical layer of each of the first subpixel and the second subpixel has a thickness of the first layer in a range of 83 to 105 nm and a thickness of the second layer in a range of 70 to 88 nm.

16. The display device of claim 15, wherein the plurality of subpixels further comprises a third subpixel to emit the third color light, and
the optical layer of the third subpixel has the thickness of the first layer in a range of 83 to 105 nm and the thickness of the second layer in a range of 70 to 88 nm.

17. The display device of claim 14, wherein the plurality of subpixels comprises a first subpixel to emit a first color light and a second subpixel to emit a second color light that is different from the first color light, and
wherein the plurality of light emitting elements is configured to emit a third color light that is different from the first color light and the second color light,
wherein the first subpixel comprises a first optical layer having a thickness of the first layer in a range of 101 to 110 nm and a thickness of the second layer in a range of 85 to 92 nm, and
wherein the second subpixel comprises a second optical layer having the thickness of the first layer in a range of 83 to 105 nm and the thickness of the second layer in a range of 70 to 88 nm.

18. The display device of claim 17, wherein the plurality of subpixels further comprises a third subpixel to emit the third color light, and
wherein the third subpixel comprises a third optical layer having the thickness of the first layer in a range of 73 to 77 nm and the thickness of the second layer in a range of 61 to 64 nm.

19. The display device of claim 14, wherein each of the plurality of subpixels comprises:
a first insulating layer on the plurality of light emitting elements;
a second insulating layer on the first insulating layer;
a first connection electrode on the first electrode and contacting first ends of the plurality of light emitting elements; and
a second connection electrode on the second electrode and contacting second ends of the plurality of light emitting elements.

20. A display device comprising:
a first substrate comprising a display area and a non-display area around the display area;
a plurality of subpixels in the display area and comprising a plurality of light emitting elements;
a bank layer surrounding the subpixels in the display area;
an upper bank layer on the bank layer;
a plurality of wavelength conversion layers and a light transmitting layer on the plurality of light emitting elements of the subpixels and located in areas surrounded by the upper bank layer; and
a plurality of color filter layers on the plurality of wavelength conversion layers and the light transmitting layer,
wherein each of the plurality of subpixels further comprises:
a first electrode on the first substrate;
a second electrode spaced from the first electrode in a second direction;
an optical layer on the first electrode and the second electrode, the optical layer comprising a first layer and a second layer having a different refractive index from the first layer,
wherein the plurality of light emitting elements is located on the optical layer, the first electrode, and the second electrode,
wherein the optical layer comprises a plurality of pair layers, each of the plurality of pair layers comprising the first layer and the second layer,
wherein the first layer and the second layer are alternately stacked,
wherein the first layer and the second layer each comprises one of silicon oxide, silicon nitride, or titanium oxide, the first layer and the second layer comprising different materials, and
wherein the first layer and the second layer have different thicknesses from each other.

* * * * *